United States Patent
Marino et al.

(10) Patent No.: US 9,214,512 B2
(45) Date of Patent: *Dec. 15, 2015

(54) THREE-TERMINAL VARIABLE CAPACITOR

(71) Applicants: Fabio Alessio Marino, Arizona, AZ (US); Paolo Menegoli, San Jose, CA (US)

(72) Inventors: Fabio Alessio Marino, Arizona, AZ (US); Paolo Menegoli, San Jose, CA (US)

(73) Assignee: ETA Semiconductor Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/456,184

(22) Filed: Aug. 11, 2014

(65) Prior Publication Data

US 2014/0367832 A1 Dec. 18, 2014

Related U.S. Application Data

(63) Continuation-in-part of application No. 13/888,368, filed on May 7, 2013, now Pat. No. 8,803,288.

(51) Int. Cl.
| | |
|---|---|
| *H01L 29/06* | (2006.01) |
| *H01L 29/93* | (2006.01) |
| *H01L 29/94* | (2006.01) |
| *H01G 7/00* | (2006.01) |
| *H01L 29/739* | (2006.01) |

(52) U.S. Cl.
CPC ............ *H01L 29/0615* (2013.01); *H01L 29/93* (2013.01); *H01L 29/94* (2013.01); *H01G 7/00* (2013.01); *H01L 29/7391* (2013.01)

(58) Field of Classification Search
USPC ........................................................ 257/602
See application file for complete search history.

(56) References Cited

U.S. PATENT DOCUMENTS

| | | | |
|---|---|---|---|
| 3,829,743 A | 8/1974 | Kohashi | |
| 7,403,140 B2 | 7/2008 | Miyagi et al. | |
| 7,622,760 B2 | 11/2009 | Ogawa et al. | |
| 8,498,094 B2 * | 7/2013 | Marino et al. | 361/277 |
| 2003/0067026 A1 * | 4/2003 | Bulucea | 257/303 |
| 2012/0281336 A1 * | 11/2012 | Marino et al. | 361/281 |
| 2014/0332928 A1 * | 11/2014 | Marino et al. | 257/602 |

* cited by examiner

*Primary Examiner* — Thao P Le

(57) ABSTRACT

A novel semiconductor variable capacitor is presented. The semiconductor structure is simple and is based on a semiconductor variable MOS capacitor structure suitable for integrated circuits, which has at least three terminals, one of which is used to modulate the equivalent capacitor area of the MOS structure by increasing or decreasing its DC voltage with respect to another terminal of the device, in order to change the capacitance over a wide ranges of values. Furthermore, the present invention decouples the AC signal and the DC control voltage minimizing the distortion and increasing the performance of the device, such as its control characteristic. The present invention is simple and only slightly dependent on the variations due to the fabrication process. It exhibits a high value of capacitance density and, if opportunely implemented, shows a quasi linear dependence of the capacitance value with respect to the voltage of its control terminal.

31 Claims, 33 Drawing Sheets

THREE-TERMINAL VARIABLE CAPACITOR

RELATED APPLICATION DATA

The present application is a continuation in part of the regular patent application U.S. Ser. No. 13/888,368 entitled "Analog Transcap Device", filed by the same applicants on Jul. 5, 2013.

BACKGROUND OF THE INVENTION

1. Field of the Invention

The present invention is in the field of semiconductor structures. The present invention is further in the field of semiconductor structures of variable capacitance devices. Particularly, it relates to a MOS type variable capacitance device for semiconductor circuits. The implementation is not limited to a specific technology, and applies to either the invention as an individual component or to inclusion of the present invention within larger systems which may be combined into larger integrated circuits.

2. Brief Description of Related Art

Semiconductor capacitors are one of the fundamental components for integrated circuits. A variable capacitor is a capacitor whose capacitance may be intentionally and repeatedly changed under the influence of DC bias voltages. Variable capacitors are often used in L-C circuits to set the resonance frequency, e.g. to tune a radio (therefore they are sometimes called tuning capacitors), or as a variable reactance, e.g. for impedance matching in antenna tuners.

A voltage-controlled capacitor is well known in the art as "varactor", in which the thickness of a depletion region formed in a pn-junction diode is varied by changing a reverse bias voltage to alter the junction transition capacitance. Any junction diode exhibits this effect (including pn-junctions in transistors), but devices used as variable capacitance diodes are designed with a large junction area and a doping profile specifically chosen to maximize capacitance.

Their use is limited to low signal amplitudes to avoid obvious distortions as the capacitance would be affected by the change of signal voltage, precluding their use in the input stages of high-quality RF communications receivers, where they would add unacceptable levels of inter-modulation. At VHF/UHF frequencies, e.g. in FM Radio or TV tuners, dynamic range is limited by noise rather than large signal handling requirements, and varcaps are commonly used in the signal path. Furthermore an extremely high value of capacitance cannot be obtained even with a reverse bias because the reverse-biased saturation current is not exactly equal to zero.

Varcaps are used for frequency modulation of oscillators, and as reported in Miyagi et al. (U.S. Pat. No. 7,403,140) to make high-frequency voltage controlled oscillators (VCOs), the core component in phase-locked loop (PLL) frequency synthesizers that are ubiquitous in modern communications equipment. It is intended for antenna impedance matching in multi-band GSM/WCDMA cellular handsets and mobile TV receivers that must operate over wide frequency ranges such as the European DVB-H and Japanese ISDB-T mobile TV systems.

Several prior art attempts to improve varactors performance, so as to effectively obtain high capacitance density and a linear dependence of the capacitance value over a wide range of control voltages, have been documented. In particular, an interesting solution is reported in Ogawa et al. (U.S. Pat. No. 7,622,760) where the synthesis of two MOS capacitor is used to obtain a good linearity over a wide range relative to the DC control voltage. However, the prior art described above discloses a varactor that is still a two terminal device, and its capacitance is varied imposing a DC voltage between its two terminals. This leads to the disadvantage that the AC voltage is superimposed upon the DC control value, and therefore the capacitance value is distorted by the AC voltage.

There is therefore a need of a novel variable capacitor with at least three terminals, where at least one control terminal separated from the capacitance terminals is added. The novel structure should allow the control of the capacitance without overlapping the DC control voltage with the AC signal avoiding the distortion of the capacitance value during the circuit operation. This device, differently from the prior art described above, should use the voltage of the control terminal to modulate the area of one of the capacitor plates of a MOS capacitance rather than the distance between the two equivalent electrodes of a pn-junction capacitor.

A similar approach, where a three terminal MOS varactor is used, is disclosed in Kohashi (U.S. Pat. No. 3,829,743). In this patent the author describes a variable capacitance device having a thin film of dielectric material and in which the area of an equivalent plate electrode is varied by changing the voltage of the control terminal or under the influence of radiations.

Referring to the drawings in Kohashi and more particularly to FIG. 1 and FIG. 2 of the document, the variable capacitance device comprises a pn-junction diode placed directly above the dielectric film and a source of DC voltage. A lead wire made of gold or aluminum is placed in ohmic contact with an end surface of each of the p and n regions. One lead is connected to the movable contact of a double-throw switch. The double-throw switch has two fixed contacts connected to two batteries, which in turn are connected together to the other lead placed in electrical contact with the n region.

As shown, a thin film of high-insulation, low-dielectric-loss dielectric material is deposited on the side surface of the diode perpendicular to the junction. The described device uses the voltage between the n and the p regions of the pn-junction to modulate the depletion region above the oxide in order to change the overlap surface between the p and n regions with the metal plate under the oxide layer. FIG. 3 of the cited patent shows the structure resulting by the parallel of two structures as presented in FIG. 1.

The described structures can be used only for discrete components. As underlined by the author himself in the patent, they are not suitable for integrated circuits. The integrated version of the structure shown in FIG. 1 is reported in FIG. 4. In this case, as in the previous one, both the depletion regions in the p and n regions are used to modulate the capacitance, which lead to a difficult control of the device performance and capacitance-voltage relation (the process variations of the p-region sum up with the one of the N region and to the variability on the position of the pn-junction).

Furthermore, in all these structures, the DC voltage is applied between one terminal of the capacitance and a region directly in contact with the capacitance dielectric layer overlapping the metal terminal 27 in FIG. 1 (or 45 in FIG. 3), causing a distortion of the capacitance value due to the modulation of the MOS capacitance. Varying the DC voltage between the p and n regions, also the DC voltage drop between one of these two regions and the metal terminal changes, and that causes an enhancement or depletion of the semiconductor surface affecting the capacitance value.

The last structure of interest disclosed in Kohashi is the one illustrated in FIG. 14 of the document. In this case the variable capacitance is the resulting synthesis of the series of the capacitances of the pn-junctions and a MOS structure. The capacitance terminals 190 and 193 are coupled through a p+/n junction and the MOS capacitance. In this case the resulting capacitance and its range of variation are therefore very low. Furthermore, in this configuration the capacitance depends also on the thickness of the depletion regions of the two p+/n junction as in conventional diode based varactors, leading to a high distortion of the capacitance value. Finally, it is important to notice that none of the structures described in Kohashi have a linear relation between the control voltage and the capacitance value.

The present invention is simple and much less sensitive to process variation with respect the structures described above. It is suitable for integrated circuits and presents a high capacitance density value and high linearity. If appropriately designed, the present invention exhibits a quasi-linear dependence of the capacitance over a wide range of control voltage values. All these characteristics are extremely important for the practical implementation of the present invention and clearly distinguish the present invention from the varactors devices used nowadays in the integrated-electronic industry.

It is a purpose of the present invention to describe a novel structure of a semiconductor variable capacitor suitable for integrated circuits with at least three terminals, simple and slightly sensible to process variations, which offers the advantage of much higher capacitance per unit area, wider control ranges, high Q and low distortion of the RF signal applied to the capacitor.

SUMMARY OF THE INVENTION

The present invention describes a MOS based semiconductor variable capacitor structure, named transcap, suitable for integrated circuits, which has at least three terminals, one of which is used to modulate the equivalent capacitor area of the MOS structure by increasing or decreasing its DC voltage with respect to another terminal of the device, in order to change the capacitance over a wide range of values. Furthermore, the present invention decouples the AC signal and the DC control voltage avoiding distortions and increasing the performance of the device, such as control reliability. The present invention is simple and only slightly dependent on the variations related to the fabrication process.

The main concept of the present invention stems from a three terminals semiconductor variable capacitor as described in the regular patent applications U.S. Ser. No. 13/888,368 entitled "Analog Transcap Device", filed by the same applicants on Jul. 5, 2013 and U.S. Ser. No. 13/068,161 entitled "Semiconductor Variable Capacitor", filed on May 5, 2011.

The most important parameters of a variable capacitor are: i) the linearity of the device, ii) the tuning range, defined as the ratio between the maximum and the minimum capacitance between the main two terminal of the device (C1 and C2), and iii) the quality factor defined as $$Q=1/(2\pi f^* ESR^* C)$$

where ESR and C are, respectively, the equivalent series resistance and the capacitance seen between C1 and C2, and f is the frequency of the RF signal applied to the device.

An analog transcap device is a three-terminal semiconductor variable capacitor, where the capacitance between the two main terminals of the device (C1 and C2) can be varied by changing the DC voltage applied between the control terminal CTRL and one of the other two main terminals (C2). This characteristic allows for the decoupling of the AC signal from the DC control voltage preventing distortions and increasing the performance of the device, such as control reliability. A transcap device can be implemented with several semiconductor structures, each one of them has advantages and disadvantages as discussed in the following.

The simplest structure of an analog transcap device is illustrated in FIG. 1, where the basic operation principle of the device is shown as well. In this case a DC voltage is applied between the control terminal CTRL 4 and the C2 terminal 9 in order to modulate the capacitance between C1 and C2.

As it can be seen in FIG. 1, the structure of a transcap device is very simple and is obtained from the one of a MOS capacitor by adding the following modifications: i) a n+ implantation 8 and a p+ implantation 5 are formed on the two sides of the MOS structure in order to create a pn junction to modulate the surface area of the semiconductor capacitance plate underneath the oxide 3, ii) the capacitor oxide 3 is preferably thicker than what is usually employed in MOS capacitors in order to minimize the modulation of the carrier population at the semiconductor-oxide interface by the RF signal applied between C1 and C2, iii) it is preferable to have the highly doped implantations not auto-aligned with the MOS structure (especially the n+ region 8) in order to minimize the parasitic capacitance associated with the control region 5 and improve the isolation of the n+ region 8 for high control voltages, iv) the work function of region 2 above the oxide 3 is chosen to maximize the device performance (e.g. by utilizing a n-doped poly-silicon material instead of a p-doped one, even if the semiconductor region 10 underneath the oxide is doped with n-type impurities, or by utilizing a metallic material (also doped if desired) with an opportune work-function or a multi-layer stack of different metallic materials so as to obtain the desired work-function)—if desired, it is also possible to divide region 2 in two sub-regions, one n-doped and one p-doped, or to use a different metallic material for each sub-region, v) region 7 is properly chosen in order to maximize the device performance (e.g. this can be an insulator, a semi-insulator or an intrinsic/near-intrinsic semiconductor in order to decrease the parasitic capacitances associated with the substrate or it can be made of n-doped or p-doped semiconductor with an appropriate doping profile in order to maximize the control on the depletion region 6 and/or the device quality factor). Region 7 can be also formed by multiple semiconductor layers or regions doped in different ways (n, p or intrinsic), e.g. obtained with subsequent implantations such as p-well and n-well as will be discussed more in the detail later on in the document. Furthermore, this region can include both semiconductors and insulating layers or substrates or can be formed above semiconductors and/or insulating layers or substrates.

In order to better understand the working principle of this device, let's assume that the control terminal 4 is biased with a negative voltage with respect to the C2 terminal 9. Under these bias conditions, the depletion region 6 of the pn-junction widens under the dielectric layer 3 reducing the area of the equivalent electrode formed by the n-well, and with it the effective capacitance area and value. Vice-versa, by increasing the control voltage from −20V to zero, as an example, the depletion region 6 of the pn-junction is reduced, leading to an increase of the capacitance.

Differently from conventional MOS capacitors and prior art varactors described above, where the capacitance between the two main terminals is defined only by the DC bias applied across the capacitance, in the present invention the capacitance value is determined by the bias of the third terminal 4 which modulates the depletion region 6 under the dielectric layer 3 increasing or decreasing the equivalent surface of the capacitance between the n region 10 and the C1 terminal 1.

The capacitance value depends only on the depletion region of the n-doped region 10, which is well controllable.

This characteristic dramatically reduces the device dependence on the process variations. Furthermore, the variation of the DC voltage of the control terminal 4 does not alter the DC voltage between the two terminals 1 and 9 of the capacitance, allowing for a very good control on the device characteristic.

In general, the heavily doped region n+ 8 can be partially overlapped with the oxide 3 of the MOS capacitor or can be formed at a distance $x_{L1}$ from its edge so as to increase the device tuning range and linearity. In the latter case also the voltage withstanding capability of the device is improved due to the fact that a portion of the RF signal drops between the oxide edge and the n+ region instead of being applied entirely on the oxide layer 3. In high voltage applications for example, the distance between the n+ region 8 and the oxide 3 can be also greater than 1 um. The n-doped region 10 can be formed for example by a drift or dext implantation or can be realized with an n-well implantation. The p+ region 5 can be partially overlapped with the oxide 3 or it can be spaced apart from it by a distance $x_{L2}$ so as to minimize the parasitic capacitance between the C1 and CTRL terminals.

A more general structure of a transcap device is shown in FIG. 2, where several optional regions have been added. In the case where the n-doped region 10 is not formed with a drift implantation, a drift implantation 11 can be optionally used to regulate the doping concentration between the oxide and the n+ region. Region 11 can be formed directly in the n-doped region 10 or in a p-doped (or intrinsic or n-doped) region 12. An optional p-doped (or intrinsic, or near-intrinsic or n-doped) region 13 can be also added between the p+ region 5 and the n-doped region 10 in order to improve the breakdown voltage of the pn junction, decreasing at the same time the parasitic capacitance between the C1 and CTRL terminals. Region 13 can be partially overlapped with the oxide 3 or it can be spaced apart from it so as to maximize the capacitance tuning range.

If realized in SOI technology, it is advisable to use a thin (<250 nm) active silicon layer so as to form the p+ implantation directly in contact with the buried oxide and minimize the parasitic capacitance between the C2 and CTRL terminals. However, many configurations are possible including the implementation of the present invention in fully-depleted, partially depleted or high-voltage (where the active silicon layer has a thickness usually exceeding 1 um) SOI process technologies.

In order to increase the isolation of the n+ terminal 9 for high control voltages without degrading the quality factor of the device, the embodiment of FIG. 3 can be used. In this case an isolation region 14 (e.g. a Shallow trench isolation or a LOCOS isolation) has been added to the structure so as to decrease the parasitic coupling between the C1 and C2 terminals when the depletion region achieve its maximum extension.

The structures discussed above require the use of a negative control voltage due to the chosen doping profiles. The dual version can also be obtained (by reversing all the doping types) in order to use a positive control voltage. However, the dual configuration has a lower quality factor with respect to the illustrated ones due to the lower mobility of a p-doped layer with respect to n-doped semiconductors.

In order to reduce the control voltage required to achieve the maximum tuning range of the device, a second control region 17 can be added to the structure as shown in FIG. 4. The presence of the second control region 17 allows for the reduction of the voltage required to deplete the semiconductor area under the oxide 3. In this case the n-doped region 10 can be contacted laterally (by placing a n+ implantation on at least one side of the illustrated structure), or through a C2 implantation placed in the third dimension (i.e. in the direction perpendicular to the cross section shown in FIG. 4), or directly underneath (by removing region 7 and placing a contact directly on the back of the die where the structure is fabricated).

A buried implantation 15 can also be added in order to further minimize the parasitic resistance associated with the C2 terminal. Also in this case, if desired, the C2 sink implantation can be placed laterally (i.e. the n+ sink implantation is formed on at least one side of the illustrated structure) or in the third dimension (i.e. in the direction perpendicular to the cross section shown in FIG. 4). Alternatively, the optional layer 7 can be omitted and the buried n+ layer 15 can be contacted directly at the bottom of the structure. This configuration is very appealing if the transcap device is realized as a discrete component. In this case, the utilized substrate is usually a n-type substrate with a bottom contact placed on the lower side of the wafer.

The embodiments illustrated above are based on a MOS structure. This makes the capacitance value dependent on the $V_{C1C2}$ voltage between the C1 and C2 terminals. In order to decrease the capacitance dependence on the $V_{C1C2}$ voltage and, at the same time, increase the specific capacitance, the embodiment of FIG. 5 can be utilized. As it can be seen this embodiment is similar to the one shown in FIG. 1, with the exception that a multiplicity of small semiconductor pillars 32 has been formed above the semiconductor layer 27. Above these semiconductor pillars, the capacitance dielectric 21 and the C1 region 20 have been formed. The upper portion 31 or the entire semiconductor pillar 32 can be heavily doped in order to maximize the specific capacitance and make the MOS system almost independent from the $V_{C1C2}$ voltage.

The operation principle of this embodiment is similar to the one of the structure illustrated in FIG. 1, with the difference that the capacitance is quantized: by increasing the voltage of the control terminal 23 toward negative values with respect to the C2 terminal 30, one or more of the semiconductor pillars are isolated from the C2 terminal 30, thus decreasing the capacitance of the device. If the device is not optimized, the capacitance characteristic, as a function of the control voltage, assumes therefore a stairs like shape. The more the control voltage increases toward negative values, the more pillars are isolated thus creating a sequence of step transactions for the capacitance value.

By optimizing the height, width and doping profile of the different pillars, the dependence of the device capacitance as a function of the control voltage can be made more linear. For example by lowering the height of the pillars, the step transitions are smoothed out to the point that a linear control range can be identified.

In general, the highly conductive portion 31 of the semiconductor pillars, or even the entire pillars, can also be realized using metallic materials. It is important to notice that the semiconductor (or metallic) pillars, which can be formed with semiconductor trench process steps or deposition techniques, can be shaped differently from each other.

In order to reduce the quantized nature of the structure illustrated in FIG. 5, an extra dielectric layer 33 can be inserted between the semiconductor pillars and the semiconductor layer 27 as shown in FIG. 6. In this case the extra dielectric 33 improves the CV characteristic of the device, smoothing out the capacitance variation as a function of the control voltage.

If the lower dielectric 33 is present, the upper dielectric layer 21 of FIG. 6 can also be omitted (if desired) and the pillars can be directly connected to the C1 terminal in order to increase the capacitance density and simplify the manufacturing process. Also in this case, a portion or the entire pillars can be highly doped to minimize the dependence of the capacitance value from the voltage applied between the two main terminals C1 and C2. Furthermore, also in this case, the pillars can be made both in semiconductor or metallic materials.

If the highly doped regions (or metallic regions) inside the pillars extend down to the oxide layer 33, the pillar structures can be formed as an array of MOSFET gates, one near the other, by utilizing each polysilicon (o metal) gate region as a pillar as shown in FIG. 7. Alternatively, the pillar structures can be formed for example with a deposition or epitaxial process step followed by an etching step.

In order to reduce the control voltage required to achieve the maximum tuning range of the device, a second control region 37 can be added to the structure as shown in FIG. 8. The presence of the second control region 37 allows for the reduction of the voltage required to deplete the semiconductor area under the oxide 33. Also in this case the C2 implantation can be placed laterally to at least one of the control regions 37 and 24, or in the third dimension, i.e. in the direction perpendicular to the cross section shown in FIG. 8.

If desired also a buried implantation 34 can be added to the structure as shown in FIG. 7, in order to minimize the parasitic resistance associated with C2. Also in this case, the C2 sink implantation can be placed laterally to the structure or in the direction perpendicular to the shown cross section. Alternatively, the optional layer 26 can be omitted and the buried n+ layer can be contacted directly on the lower side of the structure. This configuration is very appealing if the transcap device is realized as discrete component. In this case, the utilized substrate is usually an n-type substrate with a bottom contact placed at the lower side of the wafer.

As shown in FIG. 9-21, the present invention can be realized using a vertical configuration. This configuration offers several advantages over the planar structure without requiring major process modifications with respect to a standard CMOS or SOI process.

FIG. 9 illustrates a vertical embodiment of the present invention. As it can be seen, in this structure the semiconductor body of the capacitance 86 is formed in a silicon pillar surrounded by the capacitance oxide 40 and the C1 region 50. The p+ control regions 52 is formed above the semiconductor pillar and it allows for the modulation of the depletion region under it.

The vertical geometry of the device increases drastically the capacitance per unit area without requiring silicon on insulator process technology. However, this embodiment as any other one herein discussed can be easily manufactured also in silicon on insulator process technology as it can be easily deduced from the drawings. Another example of vertical embodiment is shown in FIG. 10, where two extra p+ regions 54 and 59 have been added to the structure so as to increase the control on the capacitance value. In this case the n-doped semiconductor body 56 of the capacitor is contacted through a buried n+ region. As discussed for the embodiments of FIGS. 4 and 8, also in this case many other possible configurations can be chosen to contact the n-doped region 56.

FIG. 11 depicts the cross-section of another embodiment of the invention, where the terminal C2 has been placed above the semiconductor pillar, and the control regions 66 and 64 have been formed in the lower portion of the structure.

FIG. 12 illustrates the semiconductor device resulting from the connection in parallel of multiple structures resembling the one described in FIG. 9. As it can be seen the resulting device is composed by an array of semiconductor pillars in order to maximize the number of modulated capacitors per silicon area. A similar composed structure can be obtained using the embodiment of FIG. 10 or FIG. 11.

FIG. 13 illustrates another vertical embodiment of the present invention, where the C1 terminal has been formed in a semiconductor trench surrounded by the p-doped control regions 98 and 106 and the n-doped regions 100 and 104. The two n+ regions 101 and 103 under the n-regions 100 and 104 can be coupled to the C2 terminal in the direction perpendicular to the illustrated cross-section, or laterally (by forming two n+ regions with sinker on the sides of the control regions) or directly on the other side of the structure (e.g. when the device is manufactured in a MOS process for discrete devices). If desired, the C1 region 93 can also be placed above an isolation trench entirely filled with oxide instead of inside the trench as shown in FIG. 13 (however this configuration can affect the performance of the device).

FIG. 14 shows a variant of the embodiment of FIG. 13, where the two n+ regions 101 and 103 of FIG. 13 have been merged in a single n+ region 108 which can be formed directly in contact with the trench oxide, or can be spaced apart from it by a drift region 107. Also in this case, the n+ region 108 can be connected to the C2 terminal in the direction perpendicular to the illustrated cross-section, or laterally (by forming two n+ regions with sinker on the external sides of the control regions) or directly on the lower side of the structure by omitting the optional layer 109 (e.g. when the device is manufactured in a MOS process for discrete devices). The lateral connection configuration is shown in FIG. 15, where two extra n+ regions 114 and 115 have been formed on the sides of the two control regions 98 and 106.

FIG. 16 shows a variant of the vertical embodiment of FIG. 13-15 where the n+ regions 120 and 126 have been formed on the semiconductor surface while the p+ control region 123 has been placed at the lower side of the device. The p+ region can be formed directly in contact with the trench oxide, or it can be spaced apart from it by a lightly p-doped or intrinsic region 124. Also in this case, the p+ region can be contacted in the third dimension (i.e. in the direction perpendicular to the illustrated cross-section), or laterally (by forming two p+ regions with sinker on the sides of the control regions) or directly at the lower side of the structure by omitting the optional layer 122 (e.g. when the device is manufactured in a MOS process for discrete devices).

In general, the C1 trench can be formed with any shape. In FIG. 17 is reported for example a variation of the embodiment of FIG. 14, where the C1 region has a trapezoidal shape. This could be implemented by leveraging a standard trench MOS process technology.

Multiple embodiments as the one illustrated in FIG. 13-17 can be connected in parallel so as to increase the total capacitance of the device. An example of multiple trench structures connected in parallel is reported in FIG. 18 where, in order to increase as much as possible the capacitance density, each semiconductor region has been shared by two trench structures. However, many other configurations are possible (e.g. the semiconductor trenches or the corresponding semiconductor regions can be isolated one from the other).

The different pillars composing the embodiment of FIG. 9-12 and the trench structures composing the embodiment of FIG. 13-18 can be fabricated with any shape. The dimensions and the shape of the pillars/trenches cross-sections determine the specific capacitance (capacitance per unit area) improvement with respect to the more planar structures of FIG. 1-4. FIG. 19 and FIG. 20 depict two examples of layout for the vertical structures described above.

Aside from the parallel plate configuration of FIG. 19, the present invention can be realized with many different pillar/ trench shapes. Each semiconductor pillar/trench of the device can have three, four, six or more walls (the cross-section of the semiconductor pillars/trenches can have a triangular, trapezoidal, rectangular, square, octagonal, hexagonal, circular, or oval shape). Similar considerations hold true also for the embodiments of FIG. 5-8. As illustrated in FIG. 20, combining for example triangular pillars/trenches, a significant improvement of the specific capacitance can be achieved. The silicon area between the pillars/trenches is fully utilized, and the number of vertical capacitor plates per silicon area is maximized.

In all the vertical embodiments discussed above (including the ones of FIG. 4-8, since also in these embodiments at least a portion of the current flows along the vertical direction), if desired the final layout of the device can be orientated in order to maximize the carrier mobility in the semiconductor body of the device in the vertical direction. For example if the device is realized in a silicon wafer (100) as shown in FIG. 21, since from a crystallographic point of view, the plans (010) and (001) are equivalent to the (100), the device layout 166 can be rotated of 45° degrees with respect to the primary flat of the wafer 165 so as to maximize the electron mobility along the vertical dimension.

All the embodiments herein described can be realized in III-V technology with minimal modifications. If the utilized manufacturing process does not allow for low defect dielectric/semiconductor interfaces, as it can be the case in some III-V technologies, the performance of the transcap device could be affected. In order to overcome this limitation, the insulating layer of the variable capacitor can be replaced with a (doped or intrinsic) wide energy-gap semiconductor layer. In this case, the C1 terminal can be formed directly in contact with the wide energy-gap semiconductor layer (so as to form a Schottky or ohmic contact with it).

A particular example of implementation of the present invention in III-V technology is illustrated in FIG. 22. If desired, a (doped or intrinsic) low energy-gap semiconductor layer 169 can be interposed between the wide energy-gap semiconductor layer 175 (e.g. AlGaAs, or AlGaN, or AlN or multiple layers) and the C1 contact region 168, in order to minimize the leakage between the C1 terminal and the other device terminals. Another possibility is to use a dielectric material to form region 175 (instead of a semiconductor material) or to add a dielectric layer between the high energy gap semiconductor layer 175 and the C1 layer 168, in order to further improve the isolation of the C1 terminal without affecting the device performance.

Another interesting implementation of the proposed invention in III-V technology is shown in FIG. 23, where a Two Dimensional Electron Gas (2DEG) 182 is formed at the interface between the semiconductor layer 181 and the wide bandgap material 176. If desired, the contact region 183 can be also extended down to the 2DEG layer or it can be formed directly in the semiconductor layer 181. Also in this case a dielectric layer can be added between the high energy gap semiconductor layer 176 and the C1 layer 177, in order to further improve the isolation of the C1 terminal without affecting the device performance.

The vertical configurations discussed above (including the ones of FIG. 9-21) are of particular interest also in III-V technology, especially in the case where p+ implantations are not available in the manufacturing process. In order to better understand this concept, let's consider a simple vertical implementation of the present invention as the one shown in FIG. 24. In this case, the p+ region 192 can be formed by growing or depositing directly a p+ doped layer (which does not need implantation process steps to be formed) instead of a p+ implantation process step. Furthermore, the p+ doped layer 192 can also be replaced with a metal layer so as to form a schottky contact with the underlining n-doped region 191, eliminating the need for p-dopants (which are usually more difficult to deal with in a III-V process). The n-doped region 191 can be contacted to the C2 terminal through an ohmic contact with an n+ or metallic region 189. If desired, the contact 190 with respect to the C2 terminal can been placed also in the third dimension (i.e. in the direction perpendicular to the cross section), or directly on the bottom of the structure by omitting the optional layer 180 (e.g. when the device is manufactured in a process for III-V discrete devices). It is important to notice that the n-doped region 188 (with the contact region 189) and the p+ region 192 can be swapped, by forming the n+ region above the device and the p+ region underneath.

The formation of the control or C2 region in the third dimension is a concept that can be utilized for any of the previously described structures in order to increase the control on the device characteristic without degrading the quality factor. Furthermore, also extra control regions and/or C2 regions can be formed in the third direction or under the structure (the latter case is a very appealing configuration in the case where the device is realized in a process for discrete devices.) Furthermore, super junction configurations can be used to increase the control breakdown voltage.

In all the described embodiments, the p+ region can be replaced with a Schottky contact and/or the n+ region can be replaced with a metal ohmic contact. In the case where a Schottky contact is used in combination with a III-V process technology, an extra wide energy-gap layer can be interposed between the metal and the n-doped semiconductor in order to reduce the current leakage associated with the Schottky contact.

All the described embodiments can be built in many different technologies, comprising: Bulk CMOS, BCD, BiCMOS, Bipolar, Silicon On Insulator, Silicon On Sapphire, thin-film, trench MOS, JFET, SiC, Ge, SiGe (any other IV-IV compound semiconductor material), III-V technology (e.g. GaN, AlGaN, AlN, InN, InGaN, GaAs, AlGaAs, AlAs, and any other polar and non-polar III-V compound semiconductor material including ternary and quaternary alloys) with or without hetero-junctions, II-VI technology (polar and non-polar II-VI compound semiconductor material including ternary and quaternary alloys) with or without hetero-junctions, or discrete device technologies (e.g. the ones used for discrete silicon or SiC MOS discrete power devices or for III-V discrete devices). Different doping profiles can be utilized in order to improve the device performance. If desired, high-k dielectric materials can be utilized to form the capacitance dielectric so as to increase as much as possible the capacitance density.

All the embodiments illustrated above can be realized as integrated or discrete components with minimal changes. For each one of them, the dual version can be obtained by simply substituting the n-doped regions with p-type ones and vice-versa. If desired, in the dual version the n+ control regions can be replaced with Schottky contacts and/or the p+ C2 regions can be replaced with metal ohmic contacts. Many other configurations can be obtained by combining the different embodiments and their variants.

Most of the structures described above can be realized with a standard SOI or bulk CMOS process. The distance between the doping implants and the capacitance electrode C1 can be omitted by auto-aligning the implantations with the MOS structure or can be obtained by adding two spacers to the structure during the fabrication process or by misaligning the n+ (or p+) implantation mask with respect to the MOS oxide edge. The latter being the preferred method since it allows the achievement of any desired distance between the highly doped regions and the oxide edge. In some of the embodiments, one or more extra process steps can also be required in order to form the pillars/trenches in the semiconductor substrate (by means of a semiconductor etching or a deposition process steps) and/or to obtain the buried doped regions at the beginning of the manufacturing process.

The parasitic capacitances between the control terminal and the other terminals of the capacitor playa very important role in the overall device performance. In fact, if a DC voltage is applied between the control terminal and the reference terminal C2, the control terminal may be considered AC shorted with the reference terminal. This effect reduces the capacitance seen from C1 to the parallel of the capacitance C1-C2 (between the main two terminals) with the parasitic capacitance C1-CTRL (between the control terminal and the non-reference terminal). The net adverse effect may be a significant reduction of the tuning range.

To reduce this effect it may be convenient to connect an impedance (e.g. a resistor and/or an inductor) of proper value in series to the control terminal to AC de-couple the control terminal from the DC voltage source so that the mentioned parasitic capacitance does not end up being AC-coupled in parallel to the main capacitance. However this control technique may cause the control voltage to vary with the RF signal and, as a consequence, the capacitance value of the capacitor to be modulated with the signal itself.

If the capacitance value varies with the control voltage in analog fashion, the consequence can be a non-negligible distortion of the signal. In this case the distortion can be however minimized by increasing the parasitic capacitance (or adding an external capacitance) between the control terminal and the reference terminal, or by using a pre-distortion signal to control the transcap device.

FIG. 25 illustrates the most conventional control configurations of an analog transcap. As shown in FIG. 25 (a), a high value resistor HR can be placed in series to the Ctrl terminal in order to bias the device control terminal without affecting the RF performance of the device.

FIG. 25 (b) shows a possible variant of this configuration, where two anti-parallel diodes have been inserted in series to the high impedance HR in order to increase the AC de-coupling between the analog bias and the control terminal of the transcap device. A similar approach can be utilized for all the control configurations herein disclosed. Furthermore, the HR resistor can also be replaced with an inductor as shown in FIG. 25 (c).

As it can be seen, the conventional control configurations have several drawbacks: i) it is preferable to have the C2 terminal of the transcap connected to ground to avoid complicated control configurations, ii) the control voltage is negative (when an n-region is used under the capacitance oxide), iii) the RF signal drops entirely across C1 and C2 limiting the linearity of the system, iv) the RF signal can partially propagate through the control terminal leading to distortion.

Some of these problems can be solved by adding a series capacitor $C_{series}$ between the transcap device and one of the RF terminals. In FIG. 26, is shown an example of implementation of this control configuration. In the illustrated case, the control terminal of the transcap device can be coupled through a high impedance to ground (or to a bias DC source), and the middle node (obtained by coupling the C2 terminal to the series capacitance) can be used to modulate the total capacitance seen by the RF signal, by applying a positive DC bias. This configuration is suitable for both shunt and series tuning capacitor configurations.

It is important to notice that, by utilizing the latter described control configuration, the tuning range of the transcap device significantly increases. The DC control voltage not only modulates the depletion region of the pn junction between CTRL and C2, but also the carrier population at the oxide/semiconductor interface under the C1 terminal. A DC voltage is present also across the oxide layer allowing for a higher control on the overall capacitance between C1 and C2. In all the previous configurations the C1 terminal of the transcap device can be biased through a third high impedance (not shown in FIG. 25, and represented by the RF bias Ctrl pad in FIG. 26) in order to guarantee the correct operation of the structure.

An even better performing approach is shown FIG. 27 (a), where two transcap devices TC1 and TC2 are connected back-to-back and the control terminals Ctrl1 and Ctrl2 are biased through two high impedance paths. The middle node obtained by coupling the two C2 terminals becomes therefore a third control terminal, which can also be used to modulate the capacitance seen by the RF signal. Also in this case, the RF terminals of the transcap device can be biased through high impedances in order to guarantee the correct operation of the transcap devices.

As shown in FIG. 27 (b) the differential series resulting from the connection back-to-back of two transcap devices can be seen as a single device with 5 terminals (RF+, RF−, C2, Ctrl1, Ctrl2), where two of them (RF+ and RF−) are dedicated to the RF signal and three (C2, Ctrl1, and Ctrl2) are used to control the capacitance value seen between RF+ and RF−. Hereafter, when possible, the symbol shown in FIG. 27 (b) will be utilized to represent the described 5 terminal differential series transcap device (DS Transcap) in order to simplify the circuit schematic.

All the embodiments discussed above can be connected in differential series configuration so as to form a single device with 5 terminals. For example, FIG. 28 shows an example of implementation of the described series approach obtained by connecting back-to-back in series two transcap structures resembling the one of FIG. 2 so as to form a 5 terminal device.

FIG. 29-31 show three examples of possible implementations of the embodiment of FIG. 28 in SOI technology. In particular, FIG. 29 shows and example of implementation of the proposed invention in standard Fully depleted or Partially Depleted SOI process (where the active silicon layer thickness is usually chosen so as the superficial highly doped regions such as 213, 214, and 215 are formed in direct contact with the buried insulator), whereas FIGS. 30 and 31 show two examples of implementation of the present invention in high voltage SOI process (where the active silicon layer is usually thicker than the maximum depth achievable by the superficial highly doped region). If desired, when the n-doped region 221 is too deep to allow for a good isolation of the C2 terminal for high control voltage values, two isolating regions 225 and 226 extending below the semiconductor surface, can be placed between the capacitance oxides 204 and 208 and the C2 implantation 214 so as to increase the device tuning range. However, in this case careful attention must be paid not to degrade the quality factor of the device.

FIG. 32 illustrates another possible implementation of the series approach by using two building blocks resembling the one of FIG. 6. FIG. 33 illustrates another possible implementation of the series approach by using the building block of FIG. 9. A variant of this configuration is shown in FIG. 34, where the RF+ and RF− terminals have been alternated in order to maximize the capacitance density.

FIG. 35 illustrates a further example of differential-series transcap device obtained by connecting in series two devices according to the embodiment of FIG. 14. A variant of this configuration is shown in FIG. 36, where the RF+ and RF− terminals have been alternated in order to maximize the capacitance density. It is important to notice that the differential-series configuration can be utilized with all the transcap structures herein described and their variants, by connecting two of them back-to-back in series. In general, the ratio of the capacitance values between the two transcap structures composing the differential-series configuration can be made equal or different from the unity.

Another set of interesting implementations of the differential-series approach in CMOS/BiCMOS technology is shown in FIG. 37-50. These embodiments present a set of optional regions that can be added or omitted from the structure based on the characteristics of the utilized process, the characteristics of the application, and if the transcap device is utilized as a discrete device or if multiple components must be integrated in the same die. Each of these layers can be shorted directly or through a high impedance path (e.g. through a high value resistor) to ground, or to the supply, or to the control voltage, or to a voltage greater or equal to the maximum RF signal value, or lower or equal the minimum RF signal value, or any other semiconductor region or terminal of the device depending from the chosen implementation and the type of substrate (n-doped, p-doped or intrinsic and/or epitaxial). In general, if desired, others n-doped or p-doped or intrinsic layers/regions (including heavily doped barrier layers) can be also added to the structures. Any doping profile or concentration can utilized for the different semiconductor regions/layers composing the device.

In the embodiment of FIG. 37 the n-doped region 332 can be obtained with any n-type implantation available in the process such as drift, dext or n-well implantations. While the other n-type and p-type implantations 335 and 336 can be obtained usually through n-well, deep n-well, p-well, deep p-well or buried implantations. For example, if the transcap device is formed in standard CMOS process on a p-type substrate, and the device does not need to be isolated, the p-doped region 335 and/or the n-doped region 336 can be omitted, while region 337 represents the p-doped substrate. The substrate 337 can be connected through a high impedance path (or directly) to another terminal of the device (e.g. CTRL) or it can be connected through a high impedance path (or directly) to ground.

If instead, the device must be isolated, typically because the RF signal swings from positive voltage values to negative ones, and the n-doped region 332 has been formed with a n-drift or n-dext implantation (or a n-well implantation), the p-doped and n-doped regions can be formed with a p-well implantation and a n-well (or a deep n-well) implantation, respectively. In this case, the substrate 337 must be connected directly to ground (unless it is intrinsic), and the p-doped region can be connected through a high impedance path to ground (so as to become a control region), or it can be shorted to one (or more) p+ control regions. The n-doped region can be coupled (directly or through a high impedance path) to a voltage greater or equal to the maximum RF signal value or (through a high impedance path and/or a diode) to the supply voltage as will be discussed more in detail later in the specifications.

If desired, also in this case two isolating regions 323 and 325 can be placed on the sides of the capacitance oxides 320 and 328 so as to increase the isolation of the n+ region 331 for high control voltage values.

If desired, one or more intrinsic regions can be added to the structure, for example between the p-doped and n-doped regions as shown in the embodiment of FIG. 38 so as to decrease the parasitic capacitances of the device, or an intrinsic epitaxial layer can be used as a substrate. Another interesting implementation of the present invention is shown in FIG. 39, where the device has been formed directly into the substrate 344 without isolation wells.

In general, one or both control regions can also be formed directly in contact or within a p-doped region as shown in FIG. 40. Another possible implementation of the present invention can be obtained by forming the two transcap devices in separate n-doped regions as shown in FIG. 41-45. Also in this case one or more intrinsic layers or regions can be included in the structure as shown for example in FIG. 45.

For all the embodiments herein described, the dual version can be obtained by simply substituting the n-doped regions with p-type ones and vice-versa. In FIG. 46 is reported an example of dual version of the transcap device shown in FIG. 37. If a p-type substrate is used, the optional p-doped region can be omitted. In the embodiment of FIG. 46, the C2 terminal can be connected (through a high impedance path) to ground, while a positive control voltage can be applied (preferably through two separate high impedance paths) to the CTRL1 and CTRL2 terminals.

FIGS. 47, 48, and 49 illustrate three examples of implementation in bulk CMOS/BiCMOS technology of a differential-series transcap device obtained from the structures of FIGS. 6, 9 and 17, respectively. Also for these embodiments, all the observations discussed above for the other embodiments build in CMOS/BiCMOS technology hold true. Furthermore, it is important to notice that similar implementations in CMOS/BiCMOS technology can be obtained for many other embodiments of the present invention including the ones of FIG. 1-21.

For all the embodiments herein discussed, each semiconductor layer/region can be biased in many different ways in order to guarantee the correct operation of the device. In particular, if n-well, and/or deep n-well, and/or p-well, and/or deep p-well, and/or buried implants are used to isolate the transcap device from other devices, a possible bias configuration is to connect the p-well (and/or deep p-well and/or p+ buried) through an high impedance path (e.g. a high value resistor) to ground and the n-well (and/or deep n-well and/or n+ buried) to the supply voltage, once again through an high impedance path (e.g. a high value resistor) as shown in FIG. 50. If desired, in order to improve the device isolation, a diode can be placed in parallel to the resistor HRN biasing the n-well (and/or deep n-well and/or n+ buried) or the HRN resistor itself can be replaced with a diode, so as to limit the minimum voltage of the n-well (and/or deep n-well and/or n+ buried) to the supply voltage. Another possibility is to add the diode in parallel to the HRP resistor biasing the p-well (and/or deep p-well and/or p+ buried) instead of adding it in parallel to HRN (or use two diodes, one to bias the n-doped isolation region and one to bias the p-doped isolation region), by connecting the anode of the diode to the p-well (and/or deep p-well and/or p+ buried) and the cathode to ground. An optional capacitor can also be added between the n-well (and/or deep n-well and/or n+ buried) and the p-well (and/or deep p-well and/or p+ buried) if needed, so as to guarantee that the n-well potential follows the potential of the p-well, when the latter moves toward positive values (in the case illustrated in FIG. 50). The above described bias configuration can be extended to any of the embodiments herein described with simple modifications (if any).

All the embodiments discussed above can be quite easily modified to be used in a discrete process technology. An example of implementation of the present invention in discrete process technologies is shown in FIG. 51, where a contact 446 has been added on the back side of the device. Also this embodiment presents a set of optional regions that can be added or omitted from the structure based on the characteristics of the utilized process and the characteristics of the application. Furthermore, other doped or intrinsic regions and/or layers can be added to the structure (for example one or more intrinsic regions can be added between the p-doped and n-doped regions (or layers) so as to decrease the parasitic capacitances of the device, or an intrinsic epitaxial layer can be added to the structure). Each of these regions and the back-contact 446 can be shorted directly or through a high impedance path (e.g. through a high value resistor) and/or through diodes to the ground, or the supply, or the control voltage, or to a voltage greater than (or substantially equal to) the maximum RF signal value or lower than (or substantially equal) the minimum RF signal value, or any other semiconductor region or terminal of the device depending from the chosen implementation and the type of substrate (n-doped, p-doped or intrinsic and/or epitaxial).

A particularly simple example of implementation of the embodiment of FIG. 51 is reported in FIG. 52, where many of the optional layers have been removed so as to simplify the structure. The back terminal 449 has been used in this case as extra C2 terminal. If desired, the central n+ region 434 and the corresponding C2 terminal 435 can be also removed from the structure.

Alternatively, the central n+ region 434 can be replaced with an extra p+ control region 450 as shown in FIG. 53. Another variant can be obtained by replacing the n+ buried layer 448 of FIG. 52 (or FIG. 53) with a p+ buried control region (in this case, in FIG. 53 the C2 n+ implantation can be indeed placed in the dimension perpendicular to the shown cross-section). In FIG. 54 is shown another variant of a discrete implementation of the present invention.

FIG. 55 illustrates an example of implementation of the embodiment of FIG. 32 in discrete process technology. Also in this case many device regions/layers are optional and can be removed if desired.

FIG. 56 illustrates an example of implementation of the embodiment of FIG. 33 in discrete process technology. Also in this case many device regions/layers are optional and can be removed if desired, so as to simplify the structure as shown in FIG. 57. In the embodiments of FIGS. 56 and 57 one or more of the n+ regions and the corresponding C2 terminals can be omitted or replaced with p+ control regions as shown for example in FIG. 58.

FIG. 59 illustrates an example of implementation of the embodiment of FIG. 35 in discrete process technology. Also in this case many device regions/layers are optional and can be removed if desired, so as to simplify the structure as shown for example in FIG. 60.

In FIG. 61 is reported a three-dimensional view of a further example of implementation of a transcap device in differential-series configuration. As it can be seen, the p+ control regions and the n+ regions of the device can be placed in many possible ways so as to increase the device performances. If desired a buried layer and/or a back contact can be added to this embodiment in order to obtain an implementation in discrete process technology.

FIG. 62 shows two possible control configurations that can be used to bias the different terminals of a 5 terminals DS transcap device. As it can be seen, in both configurations, the Ctrl1 and Ctrl2 terminals have been coupled to ground through high impedances, and the central control terminal C2 has been used to modulate the device capacitance between RF+ and RF− terminals. Optionally, also the RF terminals can be connected through high impedance paths to ground or to a control voltage or to a voltage source so as to optimize the device performance. For each device terminal, a FET transistor can also be connected in parallel to the high impedance HR in order to speed up the tuning speed of the transcap device (i.e., for example, the FET device is always off except during the transitions of the control voltage). As discussed above, many others configurations can be used to bias the terminals of the device.

Due to the differential nature of a differential-series configuration, the distortion induced by the presence of the parasitic capacitances between the Ctrl1 and Ctrl2 terminals and the RF terminals, is minimized. The RF signal propagates both in the C2 terminal and in the Ctrl1 and Ctrl2 terminals, such as its net effect on "$V_{CTRL}-V_{C2}$" is minimized for both transcaps composing the differential-series.

In principle, the Ctrl1 and Ctrl2 terminals can also be shorted together before the high impedance, however this approach can significantly degrade the device tuning range, especially in the case where the capacitance between Ctrl1 and C2 (and/or between Ctrl2 and C2) is comparable to the one between C2 and RF+ (and/or between C2 and RF−) as in the case of an SOI process with a thin silicon active layer (in this case, the shortening of the two controls terminals Ctrl1 and Ctrl2 can decrease the tuning range by a factor greater than 2).

As shown in FIG. 63, by using the control configurations of FIG. 62, more structures can be placed in series (by short-circuiting the resistors coupled to the C2 terminals) in order to withstand higher RF voltages. If desired, the RF+ CTRL and RF− CTRL terminals (if present) can be all shorted together after the high impedance paths and connected to ground or to a control voltage or to a fixed voltage source. If required, equalizing resistors can also be used between the different transcap structures in order to equalize the RF voltage drop on the different structures.

As shown in FIG. 64, multiple differential-series devices can also be places in parallel (or anti-parallel). In this case, the dimensions of the 4 transcaps can be optimized in order to optimize the linearity of the system, for example by sizing the $1^{st}$ transcap in order to match the dimensions of the $4^{th}$ one, and by sizing the $2^{nd}$ to match the $3^{rd}$ one so as to obtain an anti-parallel configuration. If desired, the two analog controls can be coupled together in order to simplify the driving circuitry.

FIG. 65 illustrates another interesting control configuration, where a hybrid approach between analog and digital/discrete solution is presented as a switch is placed in series to the described variable capacitor. In this configuration, the size of the transistor M1 must be opportunely chosen in order to maximize the tuning range, maintaining, at the same time, the possibility of choosing, in a continuous fashion, all the possible capacitance values in the selected tuning range.

The modus operandi of this configuration is quite simple. Referring to FIG. 65 (*a*), the minimum capacitance value (seen from the RF signal) is obtained when the transistor M1 is turned off, and the analog control terminal of the transcap device is biased at high negative voltages so as to minimize the capacitance value between C1 and C2. The maximum capacitance value, instead, is obtained when M1 is turned-on and the analog control voltage is set to zero. The intermediate capacitance values can be obtained by turning-on or off M1, and by varying the analog control voltage fed to the analog control terminal. Similar considerations hold true also for the configuration of FIG. 65 (*b*), where a DS transcap has been placed in series to a MOS device.

The transistor M1 can also be replaced with a multiplicity of transistors (connected in series or in parallel to each other). In this case, by properly choosing the ratio between the different components of the network, it is possible to increase the tuning range of the network.

FIG. 66 illustrates another interesting configuration, where two of the previous networks have been connected in parallel. In this configuration, the devices belonging to the second branch of the parallel (DS transcap 2 and M2) must be opportunely sized in order to increase as much as possible the capacitance tuning range, maintaining at the same time the possibility of choosing in analog fashion all the possible capacitance values in the selected tuning range.

The operation of this configuration is similar to the one of the network shown in FIG. 65. The minimum capacitance value (seen from the RF signal) is obtained when both transistors M1 and M2 are turned off, and the analog control terminals of the two DS transcap devices (which are short-circuited through two high impedances in order to simplify the overall control circuitry) are biased at high positive voltages so as to minimize the capacitance values of DS Transcap 1 and DS Transcap 2. The maximum capacitance value, instead, is obtained when both transistor M1 and M2 are turned-on and the analog control voltage is set to zero. The intermediate capacitance values can be obtained tuning-on only M1, only M2, both or none of them, and varying the analog control voltage.

If the dimensions of the two transistors M1 and M2 and the size of DS Transcap 1 and DS Transcap 2 are opportunely chosen, for example such as M2 and DS Transcap 2 are both r times bigger than M1 and DS Transcap 1, respectively, all the intermediate capacitance values can be chosen in an analog fashion way.

It is important to notice that, if desired, the two analog controls of the two transcap devices can be separated and driven independently. Furthermore, more capacitive branches can be coupled in parallel using a similar configuration.

In all the configurations described above, the capacitance between the control terminal of each transcap device and the C2 terminal can be increased in order to improve the linearity of the overall network. Alternatively, external or integrated capacitors can also be added in order to increase the C2-CTRL capacitances. In particular with the differential series approach, external or integrated capacitors can be added between the two control terminals or between each control terminal and the central node of the series, in order to improve the linearity of the system.

In wireless power transfer systems, whether they be by means of electromagnetic waves, ultrasonic waves or others, and in particular for the case of resonant systems, the use of the transcap device, according to the any of the embodiments of the subject invention, allows the tuning of important parameters like the impedance of a network or the resonant frequency. The tuning within the receiver and the transmitter offers great advantages like the centering of the resonant frequency of the antenna, the adaptive impedance matching following the load variations or the power transfer conditions (coupling coefficient varying with respective locations of transmitter and receiver) and so on. These advantages ultimately reflect in higher efficiency of the system, lower cost of the components, lower required range of operating voltages, higher immunity to parasitic effects and others.

Similar advantages can be obtained by the use of the transcap device in any application comprising a resonant network such as tuning impedance matching circuits for cell-phone front-end, wireless circuits and so on.

As it is clear to those skilled in the art, the basic system of the present invention can be implemented in many specific ways, and the above descriptions are not meant to designate a specific implementation.

BRIEF DESCRIPTIONS OF THE DRAWINGS

The features, objects, and advantages of the present invention will become apparent upon consideration of the following detailed description of the invention when read in conjunction with the drawings in which.

DETAILED DESCRIPTION OF SPECIFIC EMBODIMENTS

A FIG. 1

Figure 1:
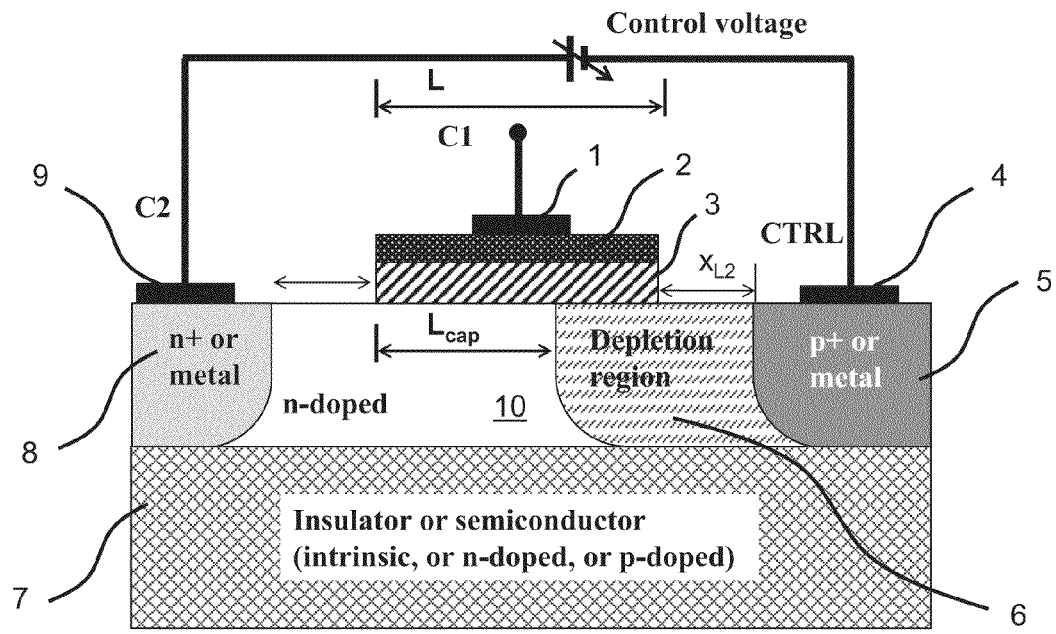
FIG. 1 shows a cross section view of a semiconductor variable capacitor according to a first embodiment of the invention.

FIG. 1 is showing the preferred embodiment of the invention as described in the regular patent application U.S. Ser. No. 13/888,368 entitled "Analog Transcap Device", filed by the same applicants on Jul. 5, 2013. The pt type region 5 defines the control terminal of the device whereas the region 2 and the n+ region 8 are the two terminals of the capacitor. Region 3 corresponds to the capacitor dielectric layer, whereas region 10 is a n-type semiconductor layer. $x_{L1}$ is the distance between the capacitance plate 2 and the n+ region 8, $x_{L2}$ is the distance between the capacitance plate 2 and the p+ control region 5, L is the length of the upper capacitance plate 2, whereas $L_{CAP}$ is the length of the lower equivalent capacitance plate. The lower capacitance plate is constituted by the neutral region of the semiconductor layer 10, and is connected to the C2 terminal 9 through the n+ region 8.

The C1 region 2 may be built in poly-silicon or metal. The work function of region 2 above the oxide 3 is chosen to maximize the device performance (e.g. by utilizing a n-doped poly-silicon material instead of a p-doped one, even if the semiconductor region 10 underneath the oxide is doped with n-type impurities, or by utilizing a metallic material (also doped if desired) with an opportune work-function or a multi-layer stack of different metallic materials so as to obtain the desired work-function). if desired, it is also possible to divide region 2 in two sub-regions, one n-doped and one p-doped, or to use a different metallic material for each sub-region, v) region 7 is properly chosen in order to maximize the device performance (e.g. this can be an insulator, a semi-insulator or an intrinsic/near-intrinsic semiconductor in order to decrease the parasitic capacitances associated with the substrate or it can be made of n-doped or p-doped semiconductor with an appropriate doping profile in order to maximize the control on the depletion region 6 and/or the device quality factor). Region 7 can be also formed by multiple semiconductor layers or regions doped in different ways (n, p or intrinsic), e.g. obtained with subsequent implantations such as p-well and n-well as will be discussed more in the detail later on in the document. Furthermore, this region can include both semiconductors and insulating layers or substrates or can be formed above semiconductors and/or insulating layers or substrates.

In general, the heavily doped region n+ 8 can be partially overlapped with the oxide 3 of the MOS capacitor or can be formed at a distance $x_{L1}$ from its edge so as to increase the device tuning range and linearity. In the latter case also the voltage withstanding capability of the device is improved due to the fact that a portion of the RF signal drops between the oxide edge and the n+ region instead of being applied entirely on the oxide layer 3. In high voltage applications for example, the distance between the n+ region 8 and the oxide 3 can be also greater than 1 um. The n-doped region 10 can be formed for example by a drift or dext implantation or can be realized with an n-well implantation. The p+ region 5 can be partially overlapped with the oxide 3 or it can be spaced apart from it by a distance $x_{L2}$ so as to minimize the parasitic capacitance between the C1 and CTRL terminals.

B FIG. 2

Figure 2:
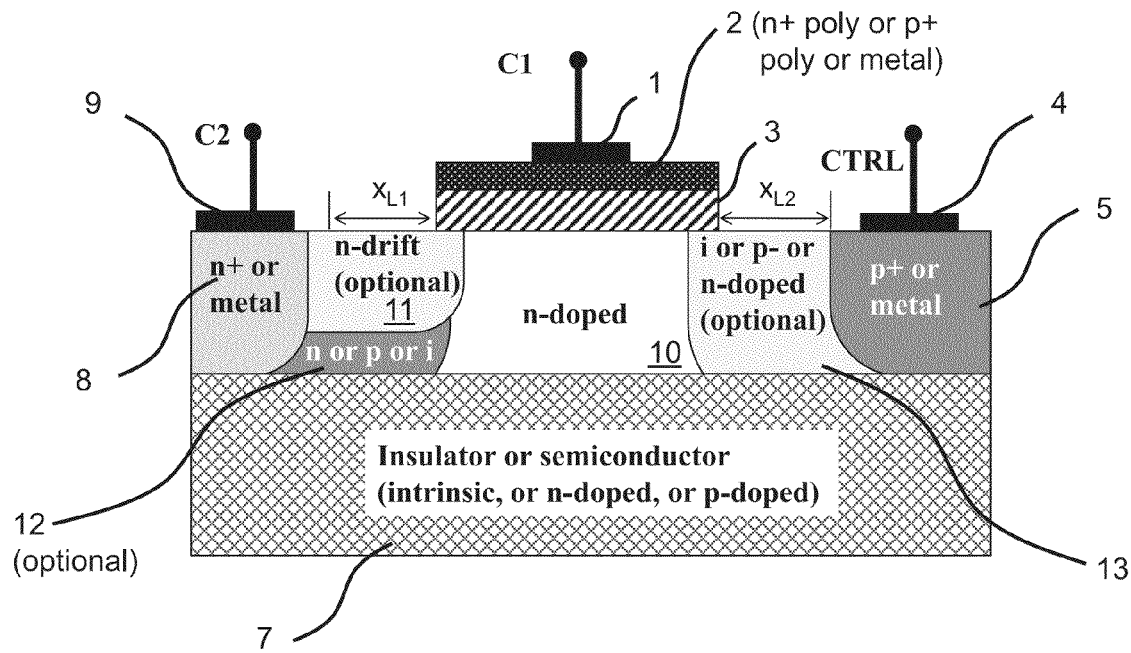
FIG. 2 shows a cross section view of a semiconductor variable capacitor according to the preferred embodiment of the invention.

A more general structure of a transcap device is shown in FIG. 2, where several optional regions have been added. In the case where the n-doped region 10 is not formed with a drift implantation, a drift implantation 11 can be optionally used to regulate the doping concentration between the oxide and the n+ region. Region 11 can be formed directly in the n-doped region 10 or in a p-doped (or intrinsic or n-doped) region 12. An optional p-doped (or intrinsic, or near-intrinsic or n-doped) region 13 can be also added between the p+ region 5 and the n-doped region 10 in order to improve the breakdown voltage of the pn junction, decreasing at the same time the parasitic capacitance between the C1 and CTRL terminals. Region 13 can be partially overlapped with the oxide 3 or it can be spaced apart from it so as to maximize the capacitance tuning range. Another possible implementation is to replace completely the n-region 10 under the oxide 3 with a p doped region so as the rectifying junction is formed substantially on the left side of C1 terminal.

C FIG. 3

Figure 3:
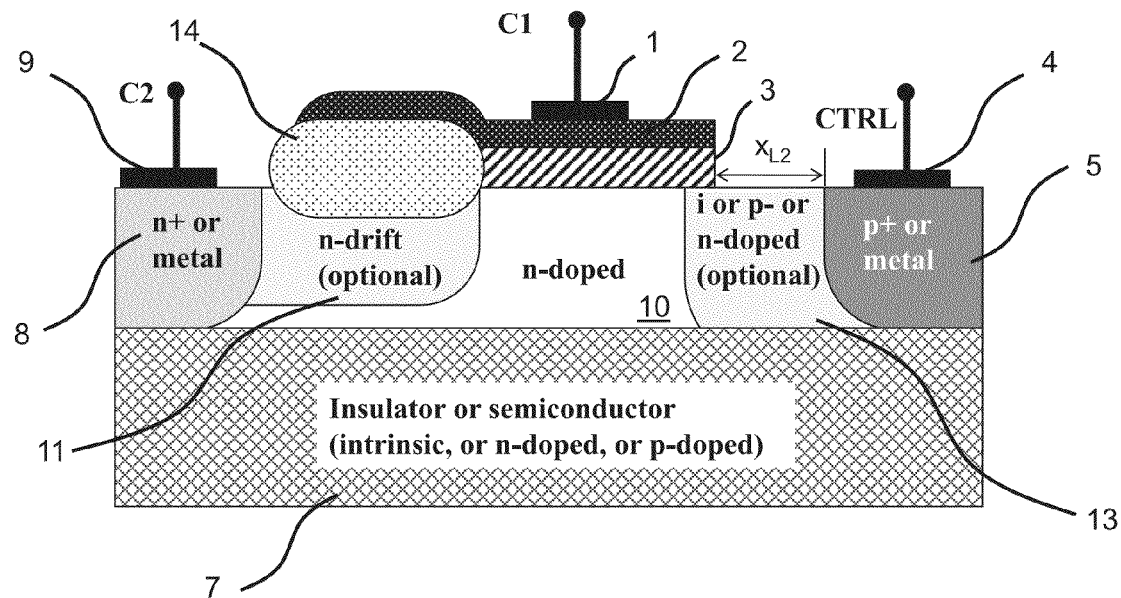
FIG. 3 shows a cross section view of a semiconductor variable capacitor according to a further embodiment of the invention, where an isolation region has been added between the C2 region and the C1 oxide.

FIG. 3 is depicting the cross-section view of a semiconductor variable capacitor according to a further embodiment of the invention, where an isolation region 14 (e.g. a Shallow trench isolation or a LOCOS isolation) has been added to the structure so as to decrease the parasitic coupling between the C1 and C2 terminals when the depletion region achieve its maximum extension. In general, the isolation region 14 can be created also on the CTRL terminal side or on both sides, depending on the process characteristics and performance requested by the application.

D FIG. 4

Figure 4:
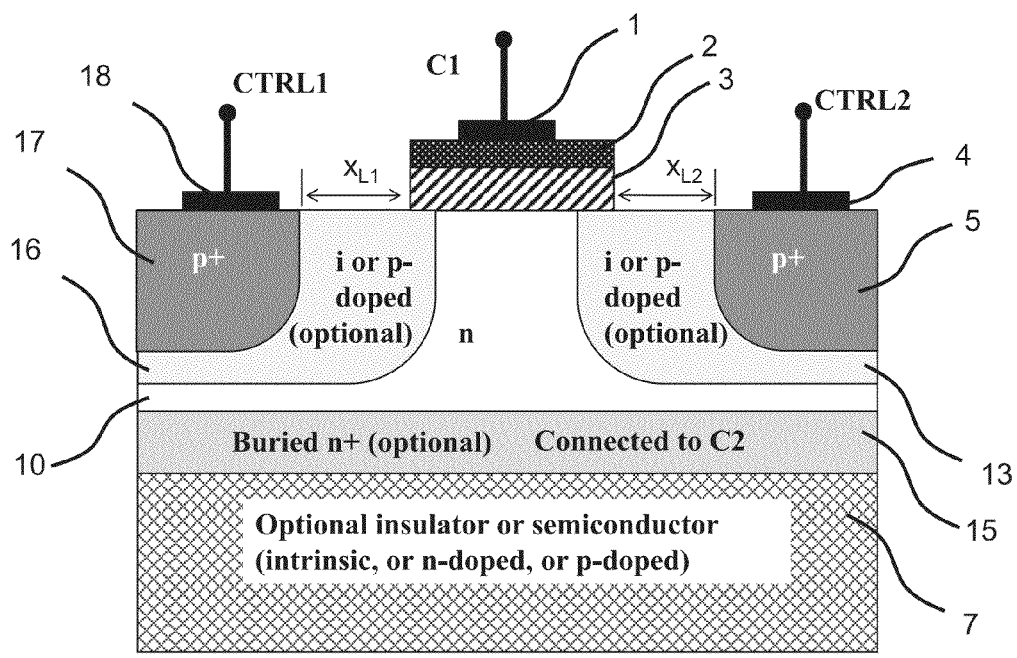
FIG. 4 shows a cross section view of a semiconductor variable capacitor according to a further embodiment of the invention, where a p+ buried implantation has been added to the structure in order to improve the control on the depletion region under the C1 oxide.

FIG. 4 is depicting the cross-section view of a semiconductor variable capacitor according to a further embodiment of the invention. This structure is similar to the one shown in FIG. 2, with the difference that a second control terminal CTRL2 has been added to the structure. The presence of CTRL2 allows for the reduction of the voltage required to deplete the semiconductor area under the oxide 3. The n-doped region 10 can be contacted laterally (by placing a n+ implantation on at least one side of the illustrated structure), or through a C2 implantation placed in the third dimension (i.e. in the direction perpendicular to the cross section shown in FIG. 4), or directly underneath (by removing region 7 and placing a contact directly on the back of the die where the structure is fabricated).

A buried implantation 15 can also be added in order to further minimize the parasitic resistance associated with the C2 terminal. Also in this case, if desired, the C2 sink implantation can be placed laterally (i.e. the n+ sink implantation is formed on at least one side of the illustrated structure) or in the third dimension (i.e. in the direction perpendicular to the cross section shown in FIG. 4). Alternatively, the optional layer 7 can be omitted and the buried n+ layer 15 can be contacted directly at the bottom of the structure. This configuration is very appealing if the transcap device is realized as a discrete component. In this case, the utilized substrate is usually a n-type substrate with a bottom contact placed on the lower side of the wafer.

E FIG. 5

The embodiments illustrated above are based on a MOS structure. This makes the capacitance value dependent on the $V_{C1C2}$ voltage between the C1 and C2 terminals. In order to decrease the capacitance dependence on the $V_{C1C2}$ voltage and, at the same time, increase the specific capacitance, the embodiment of FIG. 5 can be utilized. As it can be seen this embodiment is similar to the one shown in FIG. 1, with the exception that a multiplicity of small semiconductor pillars 32 has been formed above the semiconductor layer 27. Above these semiconductor pillars, the capacitance dielectric 21 and the C1 region 20 have been formed. The upper portion 31 or the entire semiconductor pillar 32 can be heavily doped in order to maximize the specific capacitance and make the MOS system almost independent from the $V_{C1C2}$ voltage.

In general, the highly conductive portion 31 of the semiconductor pillars, or even the entire pillars, can also be realized using metallic materials. It is important to notice that the semiconductor (or metallic) pillars, which can be formed with semiconductor trench process steps or deposition techniques, can be shaped differently from each other.

F FIG. 6

Figure 5:
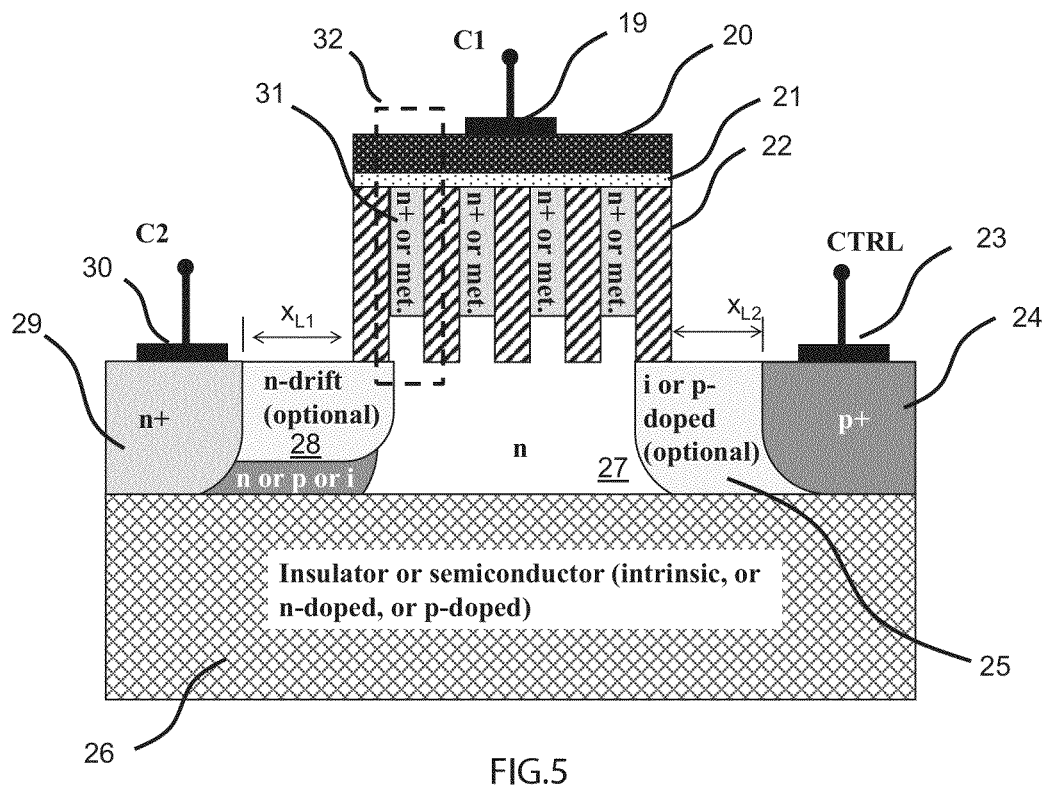
FIG. 5 shows a cross section view of a semiconductor variable capacitor according to a further embodiment of the invention, where a multiplicity of pillars has been used as lower equivalent capacitance plate.
Figure 6:
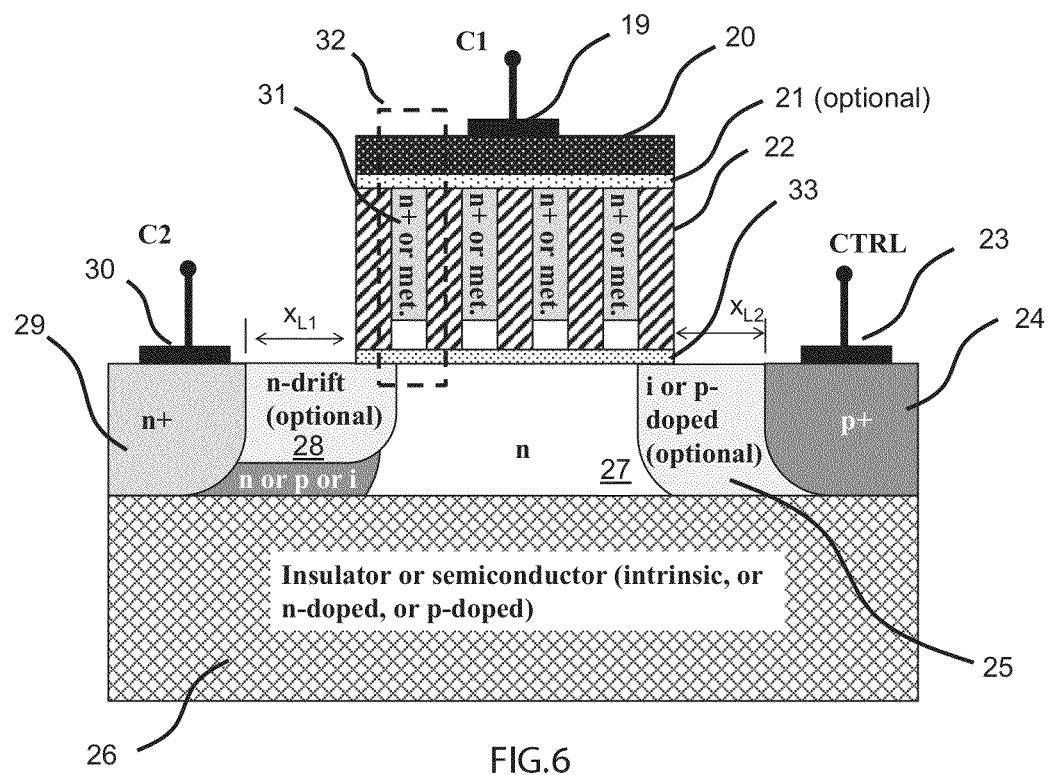
FIG. 6 shows a cross section view of a semiconductor variable capacitor according to a further embodiment of the invention, where an extra dielectric layer has been interposed between the multiplicity of pillars and the n-doped semiconductor layer in order to smooth out the CV characteristic of the device.

In order to reduce the quantized nature of the structure illustrated in FIG. 5, an extra dielectric layer 33 can be inserted between the semiconductor pillars and the semiconductor layer 27 as shown in FIG. 6. In this case the extra dielectric 33 improves the CV characteristic of the device, smoothing out the capacitance variation as a function of the control voltage.

If the lower dielectric 33 is present, the upper dielectric layer 21 of FIG. 6 can also be omitted (if desired) and the pillars can be directly connected to the C1 terminal in order to increase the capacitance density and simplify the manufacturing process. Also in this case, a portion or the entire pillars can be highly doped to minimize the dependence of the capacitance value from the voltage applied between the two main terminals C1 and C2. Furthermore, also in this case, the pillars can be made both in semiconductor or metallic materials.

G FIG. 7

Figure 7:
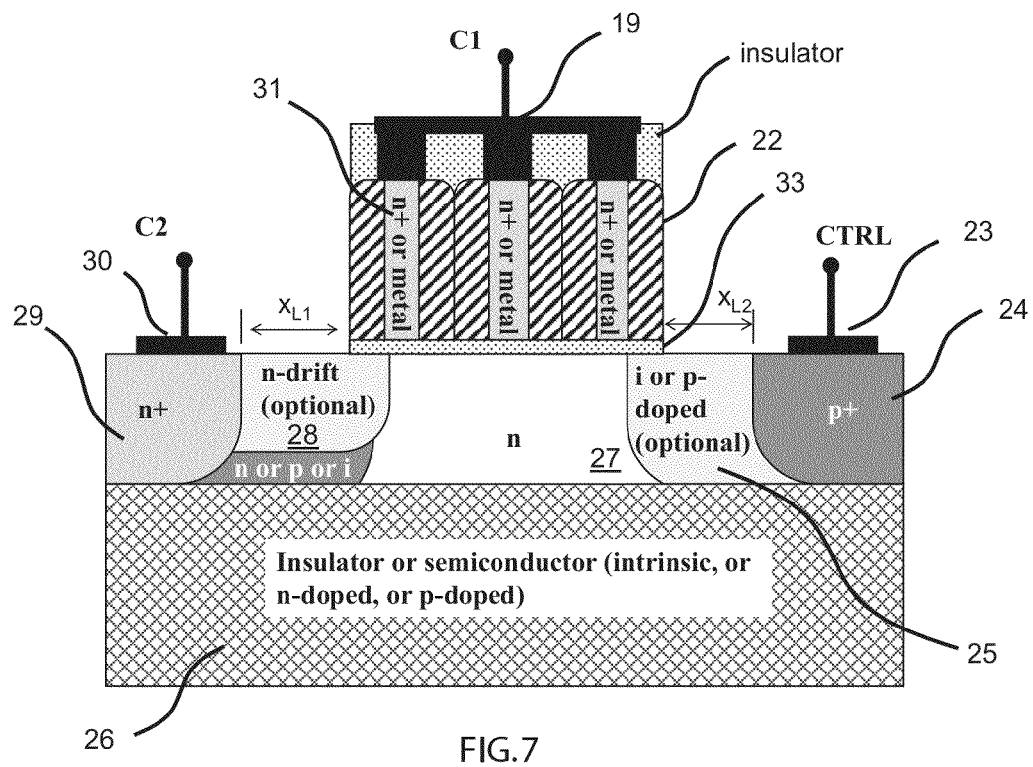
FIG. 7 shows a cross section view of a semiconductor variable capacitor according to a further embodiment of the invention, where a multiplicity of pillars has been used as upper equivalent capacitance plate.

If the highly doped regions (or metallic regions) inside the pillars extend down to the oxide layer 33, the pillar structures can be formed as an array of MOSFET gates, one near the other, by utilizing each polysilicon (o metal) gate region as a pillar as shown in FIG. 7. Alternatively, the pillar structures can be formed for example with a deposition or epitaxial process step followed by an etching step.

H FIG. 8

Figure 8:
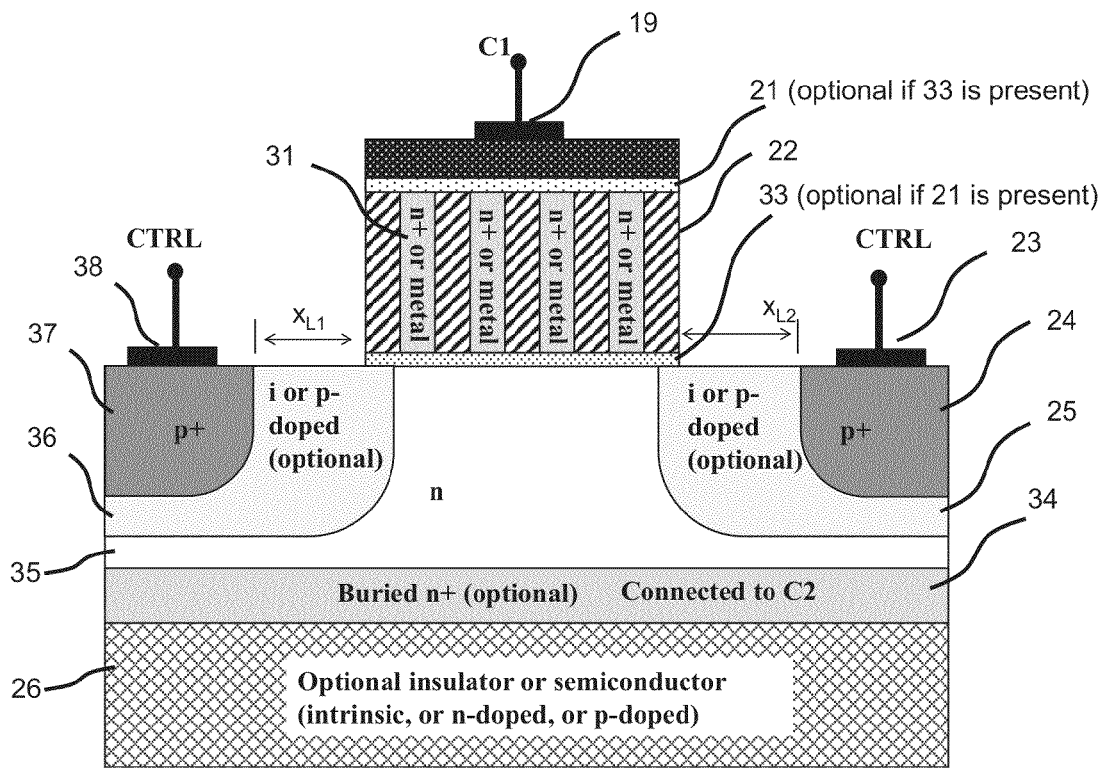
FIG. 8 shows a cross section view of a semiconductor variable capacitor according to a further embodiment of the invention, where a multiplicity of highly conductive pillars has been used as upper equivalent capacitance plate and a second control region has been added to the structure.

In order to reduce the control voltage required to achieve the maximum tuning range of the device, a second control region 37 can be added to the structure as shown in FIG. 8. The presence of the second control region 37 allows for the reduction of the voltage required to deplete the semiconductor area under the oxide 33. Also in this case the C2 implantation can be placed laterally to at least one of the control regions 37 and 24, or in the third dimension, i.e. in the direction perpendicular to the cross section shown in FIG. 8.

If desired also a buried implantation 34 can be added to the structure as shown in FIG. 7, in order to minimize the parasitic resistance associated with C2. Also in this case, the C2 sink implantation can be placed laterally to the structure or in the direction perpendicular to the shown cross section. Alternatively, the optional layer 26 can be omitted and the buried n+ layer can be contacted directly on the lower side of the structure. This configuration is very appealing if the transcap device is realized as discrete component. In this case, the utilized substrate is usually an n-type substrate with a bottom contact placed at the lower side of the wafer.

I FIG. 9

Figure 9:
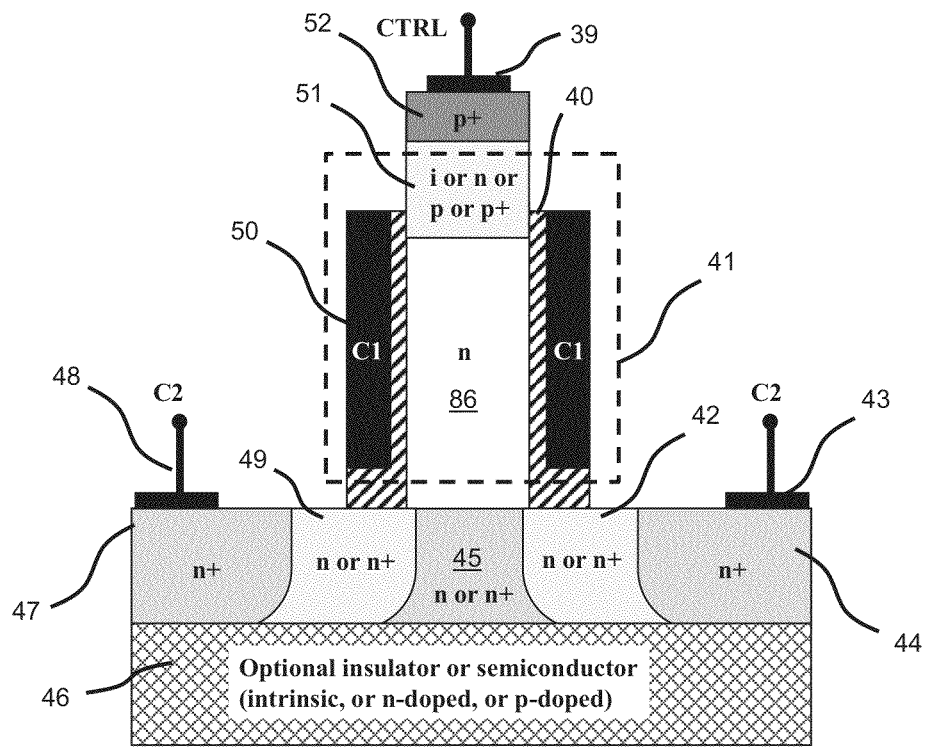
FIG. 9 shows a cross section view of a semiconductor variable capacitor according to a further embodiment of the invention, where the capacitance has been implemented vertically with respect to the primary surface of the semiconductor substrate.

FIG. 9 illustrates a vertical embodiment of the present invention. As it can be seen, in this structure the semiconductor body of the capacitance 86 is formed in a silicon pillar surrounded by the capacitance oxide 40 and the C1 region 50. The p+ control regions 52 is formed above the semiconductor pillar and it allows for the modulation of the depletion region under it.

J FIG. 10

Figure 10:
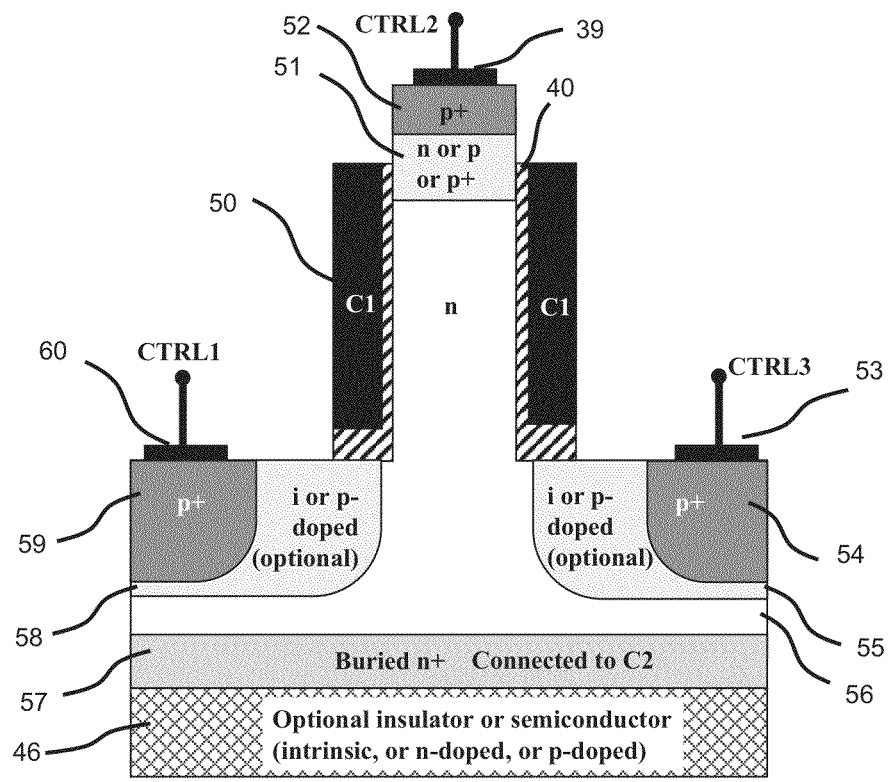
FIG. 10 shows a cross section view of a semiconductor variable capacitor according to a further embodiment of the invention, where the capacitance has been implemented vertically with respect to the device substrate and two extra control regions have been added to the structure.

The vertical geometry of the device increases drastically the capacitance per unit area without requiring silicon on insulator process technology. However, this embodiment as any other one herein discussed can be easily manufactured also in silicon on insulator process technology as it can be easily deduced from the drawings. Another example of vertical embodiment is shown in FIG. 10, where two extra p+ regions 54 and 59 have been added to the structure so as to increase the control on the capacitance value. In this case the n-doped semiconductor body 56 of the capacitor is contacted through a buried n+ region. As discussed for the embodiments of FIGS. 4 and 8, also in this case many other possible configurations can be chosen to contact the n-doped region 56.

K FIG. 11

Figure 11:
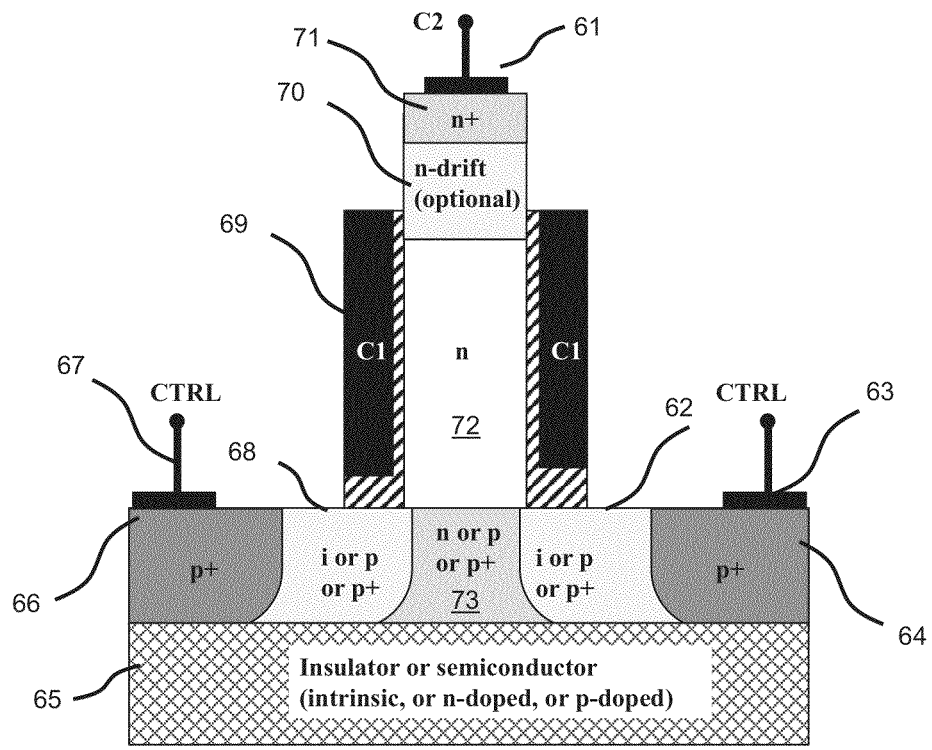
FIG. 11 shows a cross section view of a semiconductor variable capacitor according to a further embodiment of the invention, where the capacitance has been implemented vertically with respect to the device substrate and the C2 region has been placed above the structure.

FIG. 11 depicts the cross-section of another embodiment of the invention, where the terminal C2 has been placed above the semiconductor pillar, and the control regions 66 and 64 have been formed in the lower portion of the structure.

L FIG. 12

Figure 12:
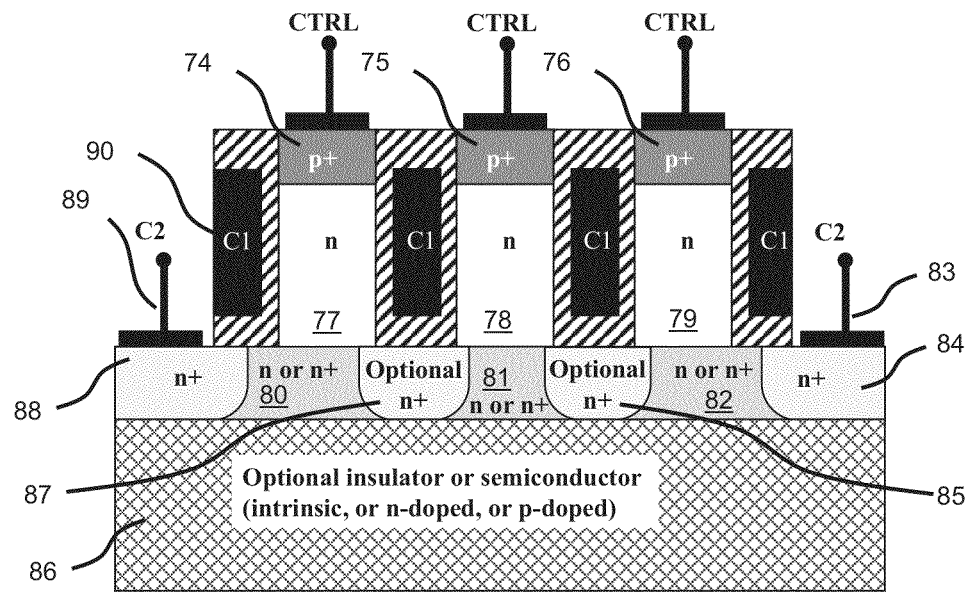
FIG. 12 shows a cross section view of a semiconductor variable capacitor according to a further embodiment of the invention, where the capacitance has been implemented vertically with respect to the device substrate by connecting in parallel multiple semiconductor pillars.

FIG. 12 illustrates the semiconductor device resulting from the connection in parallel of multiple structures resembling the one described in FIG. 9. As it can be seen the resulting device is composed by an array of semiconductor pillars in order to maximize the number of modulated capacitors per silicon area. A similar composed structure can be obtained using the embodiment of FIG. 10 or FIG. 11.

M FIG. 13

Figure 13:
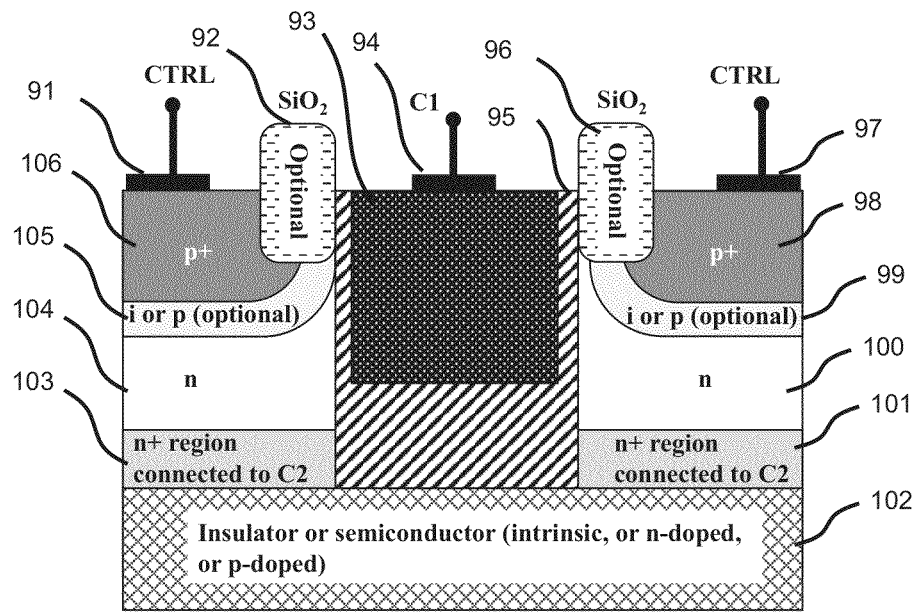
FIG. 13 shows a cross section view of a semiconductor variable capacitor according to a further embodiment of the invention, where the C1 region has been realized in a semiconductor trench.

FIG. 13 illustrates another vertical embodiment of the present invention, where the C1 terminal has been formed in a semiconductor trench surrounded by the p-doped control regions 98 and 106 and the n-doped regions 100 and 104. The two n+ regions 101 and 103 under the n-regions 100 and 104 can be coupled to the C2 terminal in the direction perpendicular to the illustrated cross-section, or laterally (by forming two n+ regions with sinker on the sides of the control regions) or directly on the other side of the structure (e.g. when the device is manufactured in a MOS process for discrete devices). If desired, the C1 region 93 can also be placed above an isolation trench entirely filled with oxide instead of inside the trench as shown in FIG. 13 (however this configuration can affect the performance of the device).

N FIG. 14

Figure 14:
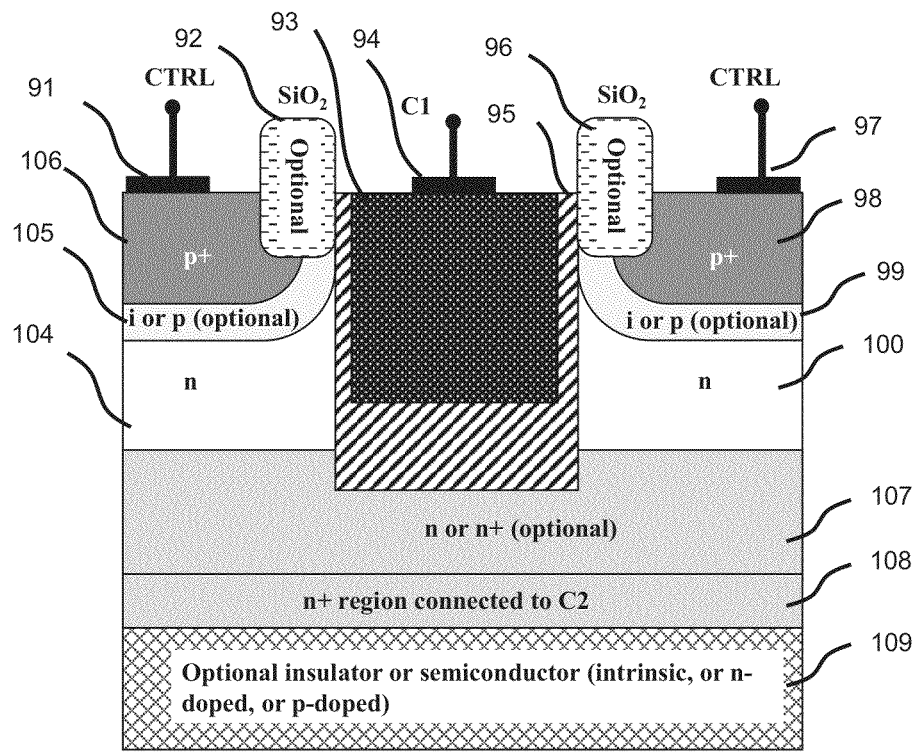
FIG. 14 shows a cross section view of a semiconductor variable capacitor according to a further embodiment of the invention, where the C1 region has been realized in a semiconductor trench and a buried n+ region has been used to connect the two semiconductor regions on the sides of the trench.

FIG. 14 shows a variant of the embodiment of FIG. 13, where the two n+ regions 101 and 103 of FIG. 13 have been merged in a single n+ region 108 which can be formed directly in contact with the trench oxide, or can be spaced apart from it by a drift region 107. Also in this case, the n+ region 108 can be connected to the C2 terminal in the direction perpendicular to the illustrated cross-section, or laterally (by forming two n+ regions with sinker on the external sides of the control regions) or directly on the lower side of the structure by omitting the optional layer 109 (e.g. when the device is manufactured in a MOS process for discrete devices).

O FIG. 15

Figure 15:
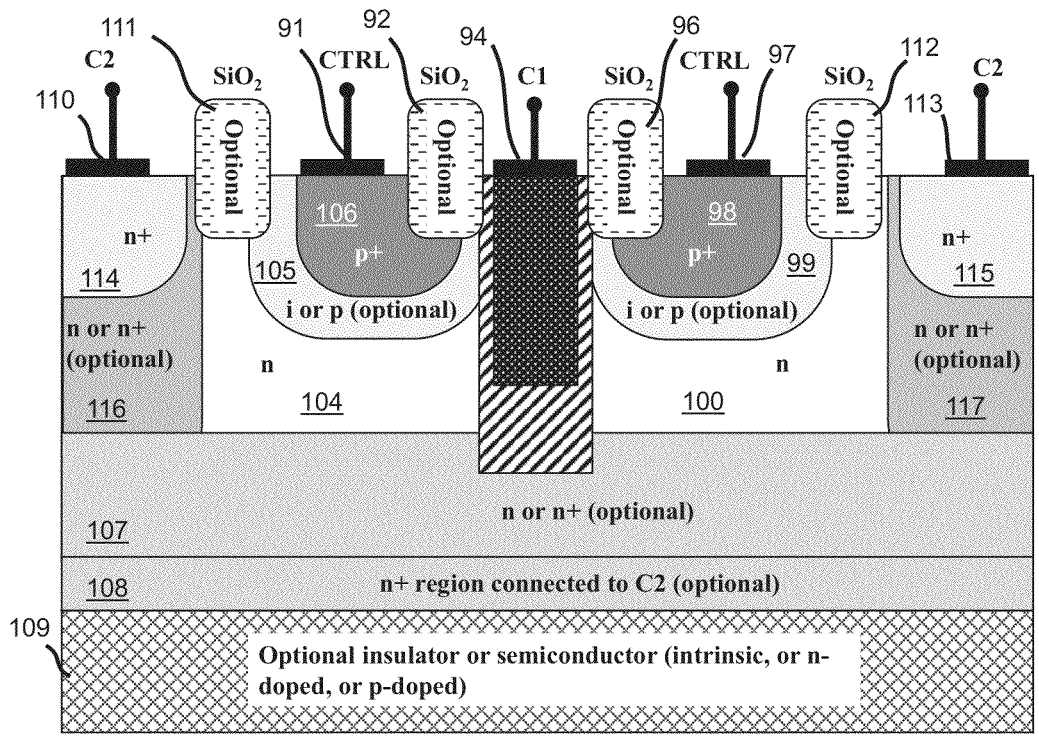
FIG. 15 shows a cross section view of a semiconductor variable capacitor according to a further embodiment of the invention, where the C1 region has been realized in a semiconductor trench and the n-doped regions have been laterally connected to the C2 terminal.

FIG. 15 depicts the lateral connection configuration for the embodiment of FIG. 14, obtained by adding two extra n+ regions 114 and 115 on the sides of the two control regions 98 and 106.

P FIG. 16

Figure 16:
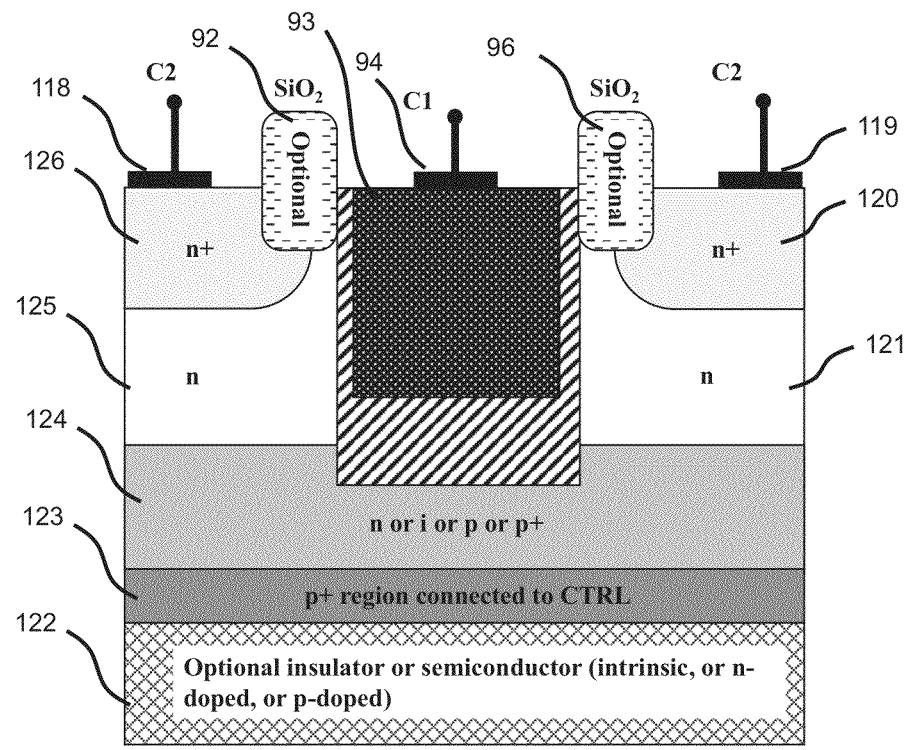
FIG. 16 shows a cross section view of a semiconductor variable capacitor according to a further embodiment of the invention, where the C1 region has been realized in a semiconductor trench and the control regions have been formed on the surface of the structure.

FIG. 16 shows a variant of the vertical embodiment of FIG. 13-15 where the n+ regions 120 and 126 have been formed on the semiconductor surface while the p+ control region 123 has been placed at the lower side of the device. The p+ region can be formed directly in contact with the trench oxide, or it can be spaced apart from it by a lightly p-doped or intrinsic region 124. Also in this case, the p+ region can be contacted in the third dimension (i.e. in the direction perpendicular to the illustrated cross-section), or laterally (by forming two p+ regions with sinker on the sides of the control regions) or directly at the lower side of the structure by omitting the optional layer 122 (e.g. when the device is manufactured in a MOS process for discrete devices).

Q FIG. 17

Figure 17:
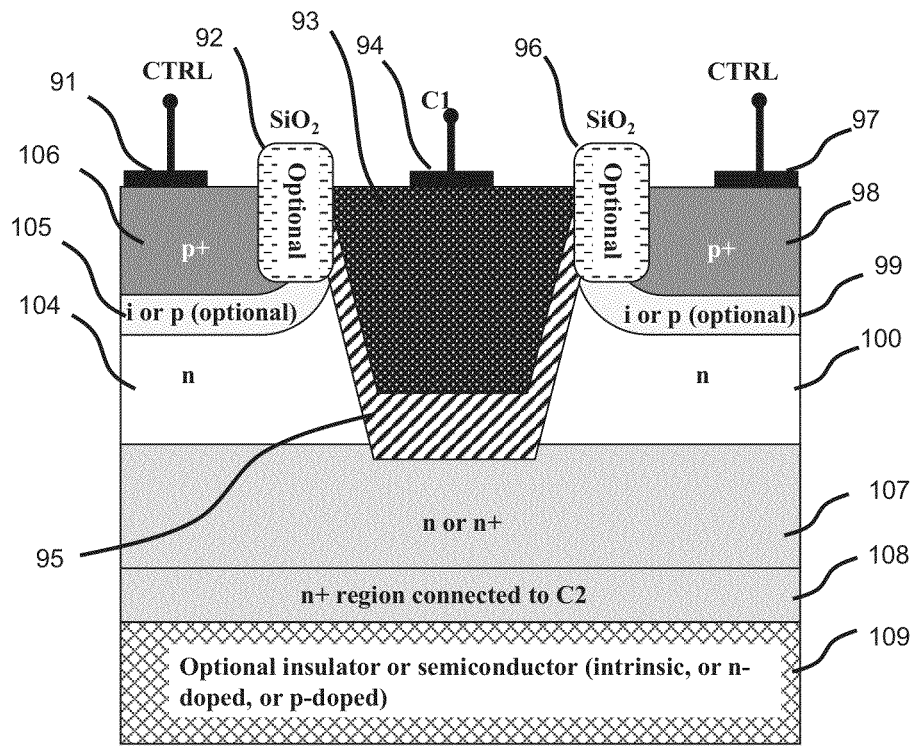
FIG. 17 shows a cross section view of a semiconductor variable capacitor according to a further embodiment of the invention, where the C1 region has been realized in a trapezoidal semiconductor trench.

In general, the C1 trench can be formed with any shape. In FIG. 17 is reported for example a variation of the embodiment of FIG. 14, where the C1 trench MOS structure has a trapezoidal shape.

R FIG. 18

Figure 18:
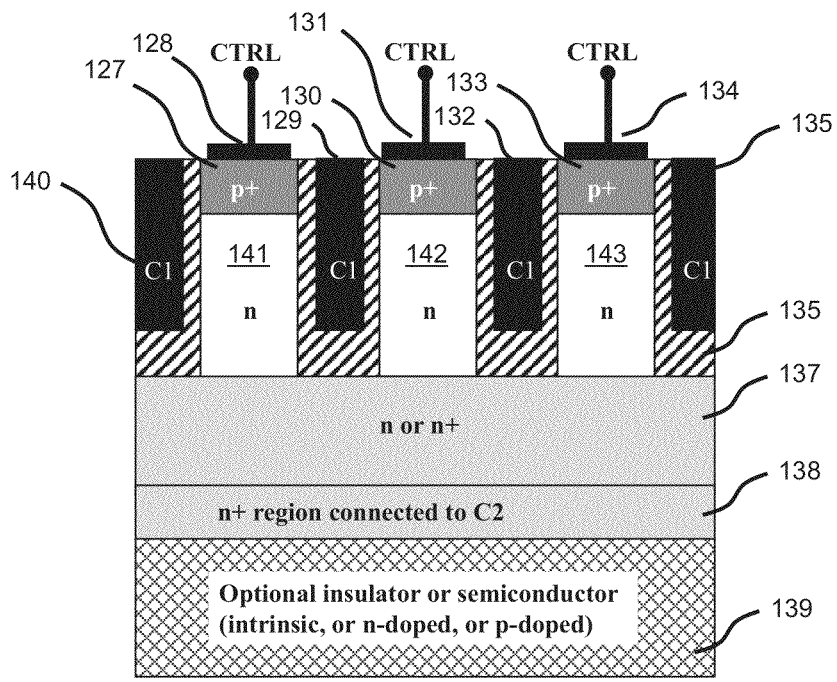
FIG. 18 shows a cross section view of a semiconductor variable capacitor according to a further embodiment of the invention, where the capacitance has been implemented vertically with respect to the device substrate by connecting in parallel multiple variable capacitors according to FIG. 14.

Multiple embodiments as the one illustrated in FIG. 13-17 can be connected in parallel so as to increase the total capacitance of the device. An example of multiple trench structures connected in parallel is reported in FIG. 18 where, in order to increase as much as possible the capacitance density, each semiconductor region has been shared by two trench structures. However, many other configurations are possible (e.g. the semiconductor trenches or the corresponding semiconductor regions can be isolated one from the other).

S FIG. 19

Figure 19:
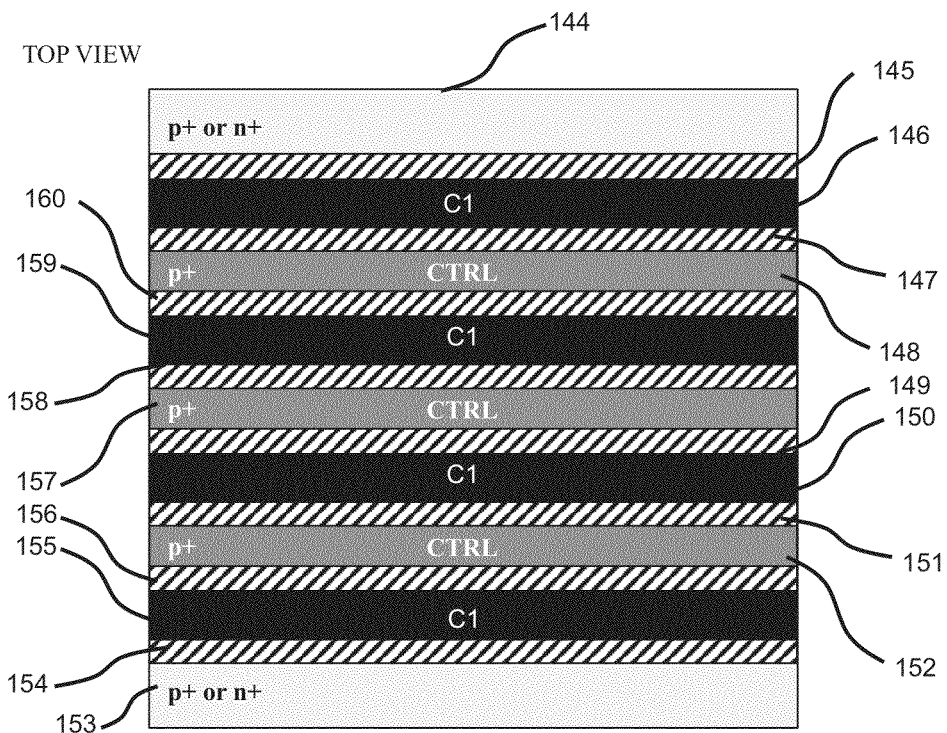
FIG. 19 shows an example of layout for a vertical embodiment of a semiconductor variable capacitor according to the invention.

The different pillars composing the embodiment of FIG. 9-12 and the trench structures composing the embodiment of FIG. 13-18 can be fabricated with any shape. The dimensions and the shape of the pillars/trenches cross-sections determine the specific capacitance (capacitance per unit area) improvement with respect to the more planar structures of FIG. 1-4. FIG. 19 depict an example of layout for the vertical structures described above.

T FIG. 20

Figure 20:
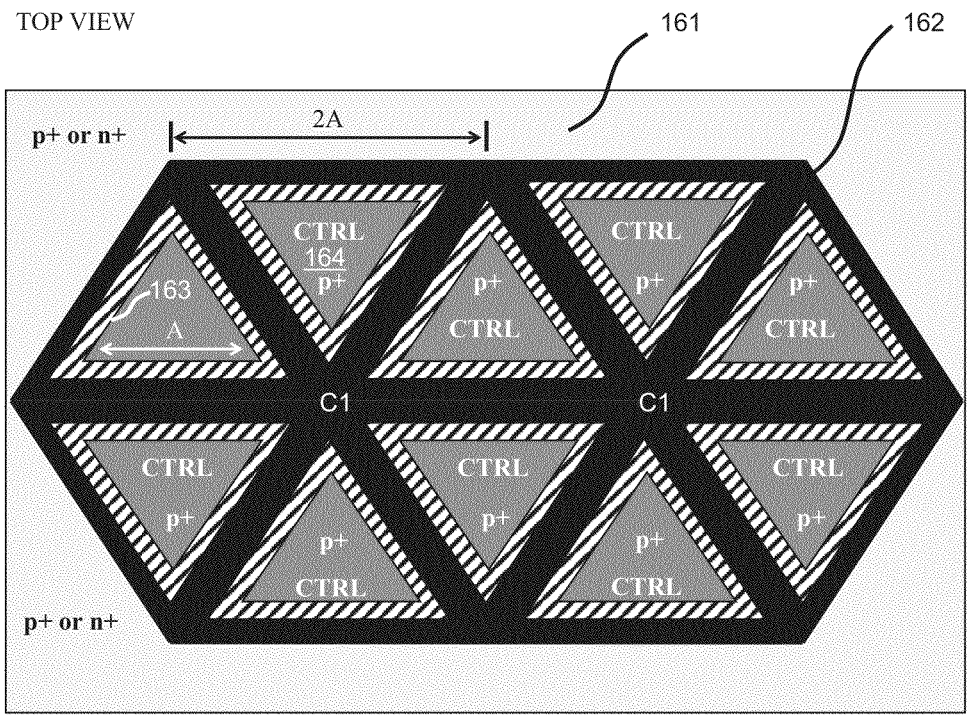
FIG. 20 shows a further example of layout for a vertical embodiment of a semiconductor variable capacitor according to the invention.

Aside from the parallel plate configuration of FIG. 19, the present invention can be realized with many different pillar/trench shapes. Each semiconductor pillar/trench of the device can have three, four, six or more walls (the cross-section of the semiconductor pillars/trenches can have a triangular, trapezoidal, rectangular, square, octagonal, hexagonal, circular, or oval shape). Similar considerations hold true also for the embodiments of FIG. 5-8. As illustrated in FIG. 20, combining for example triangular pillars/trenches, a significant improvement of the specific capacitance can be achieved. The silicon area between the pillars/trenches is fully utilized, and the number of vertical capacitor plates per silicon area is maximized.

U FIG. 21

Figure 21:
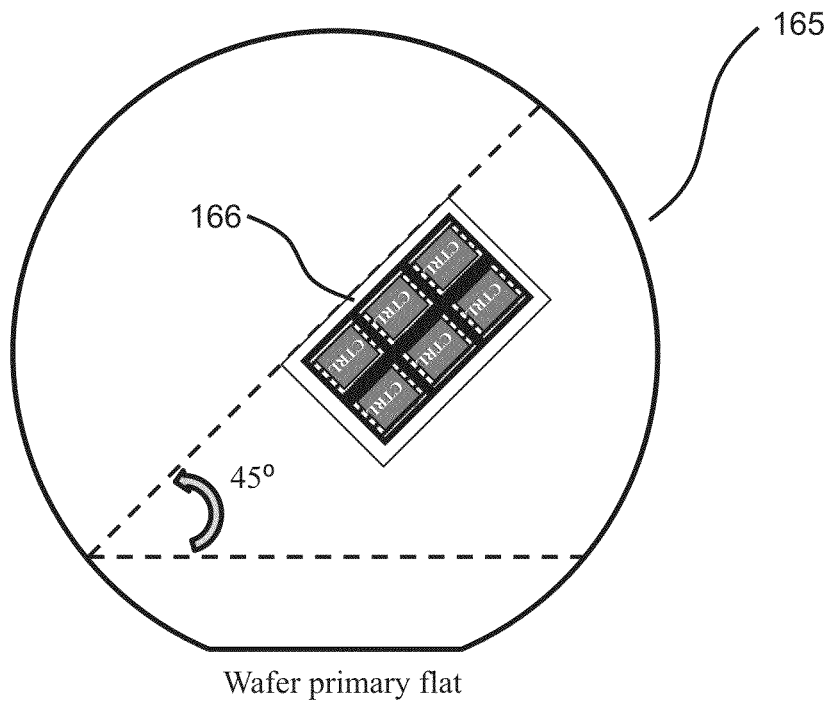
FIG. 21 shows an example on how the layout orientation can be optimized so as to increase the carrier mobility in a vertical embodiment of a semiconductor variable capacitor according to the invention.

In all the vertical embodiments discussed above (including the ones of FIG. 4-8, since also in these embodiments at least a portion of the current flows along the vertical direction), if desired the final layout of the device can be orientated in order to maximize the carrier mobility in the semiconductor body of the device in the vertical direction. For example if the device is realized in a silicon wafer (100) as shown in FIG. 21, since from a crystallographic point of view, the plans (010) and (001) are equivalent to the (100), the device layout 166 can be rotated of 45° degrees with respect to the primary flat of the wafer 165 so as to maximize the electron mobility along the vertical dimension.

V FIG. 22

Figure 22:
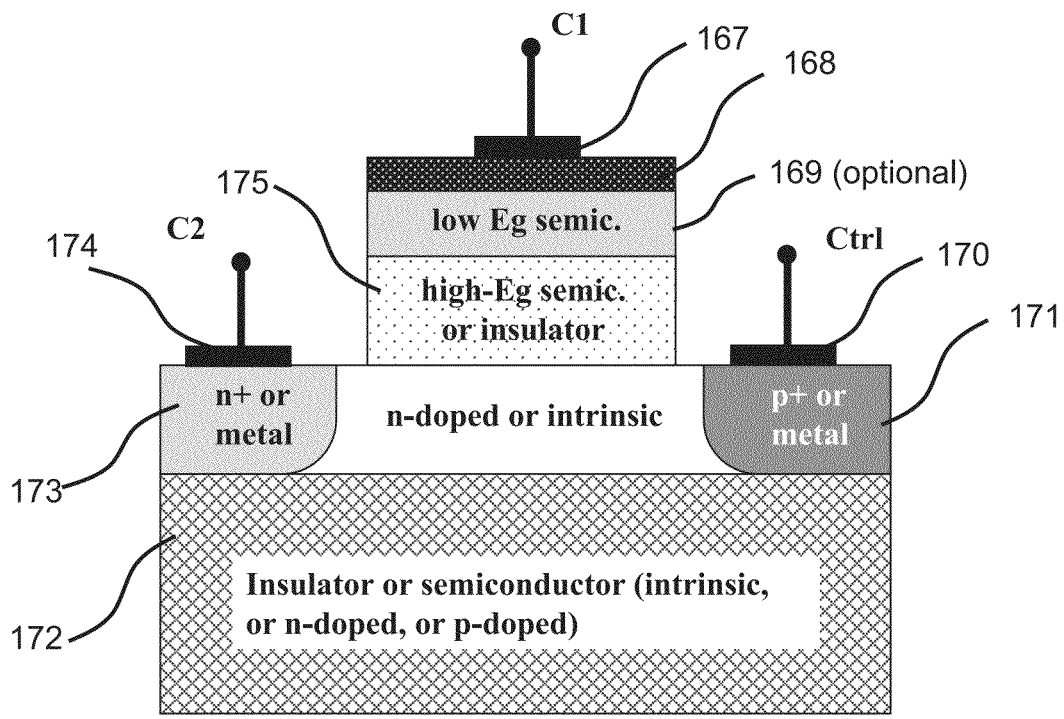
FIG. 22 shows an example of implementation in III-V technology of a semiconductor variable capacitor according to the invention.

FIG. 22 is depicting the cross-section view of a particular example of implementation of the present invention realized in III-V technology. If desired, a (doped or intrinsic) low energy-gap semiconductor layer 169 can be interposed between the wide energy-gap semiconductor layer 175 (e.g. AlGaAs, or AlGaN, or AlN or multiple layers) and the C1 contact region 168, in order to minimize the leakage between the C1 terminal and the other device terminals. Another possibility is to use a dielectric material to form region 175 (instead of a semiconductor material) or to add a dielectric layer between the high energy gap semiconductor layer 175 and the C1 layer 168, in order to further improve the isolation of the C1 terminal without affecting the device performance.

W FIG. 23

Figure 23:
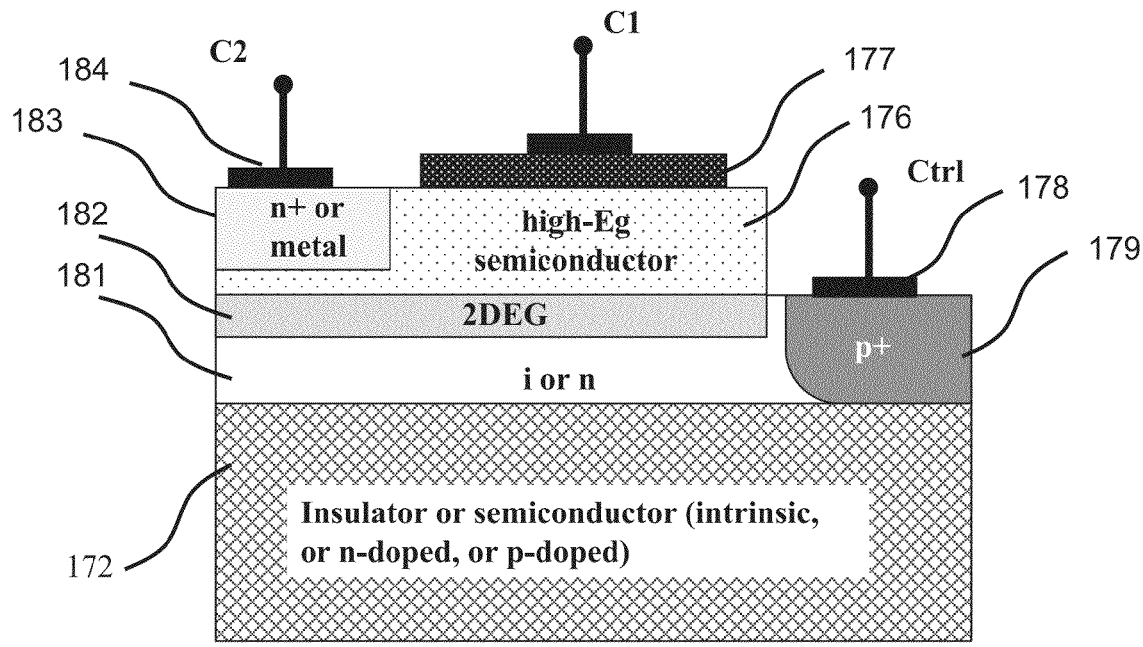
FIG. 23 shows a second example of implementation in III-V technology of a semiconductor variable capacitor according to the invention.

Another interesting implementation of the proposed invention in III-V technology is shown in FIG. 23, where a Two Dimensional Electron Gas (2DEG) 182 is formed at the interface between the semiconductor layer 181 and the wide bandgap material 176. If desired, the contact region 183 can be also extended down to the 2DEG layer or it can be formed directly in the semiconductor layer 181. Also in this case a dielectric layer can be added between the high energy gap semiconductor layer 176 and the C1 layer 177, in order to further improve the isolation of the C1 terminal without affecting the device performance.

X FIG. 24

Figure 24:
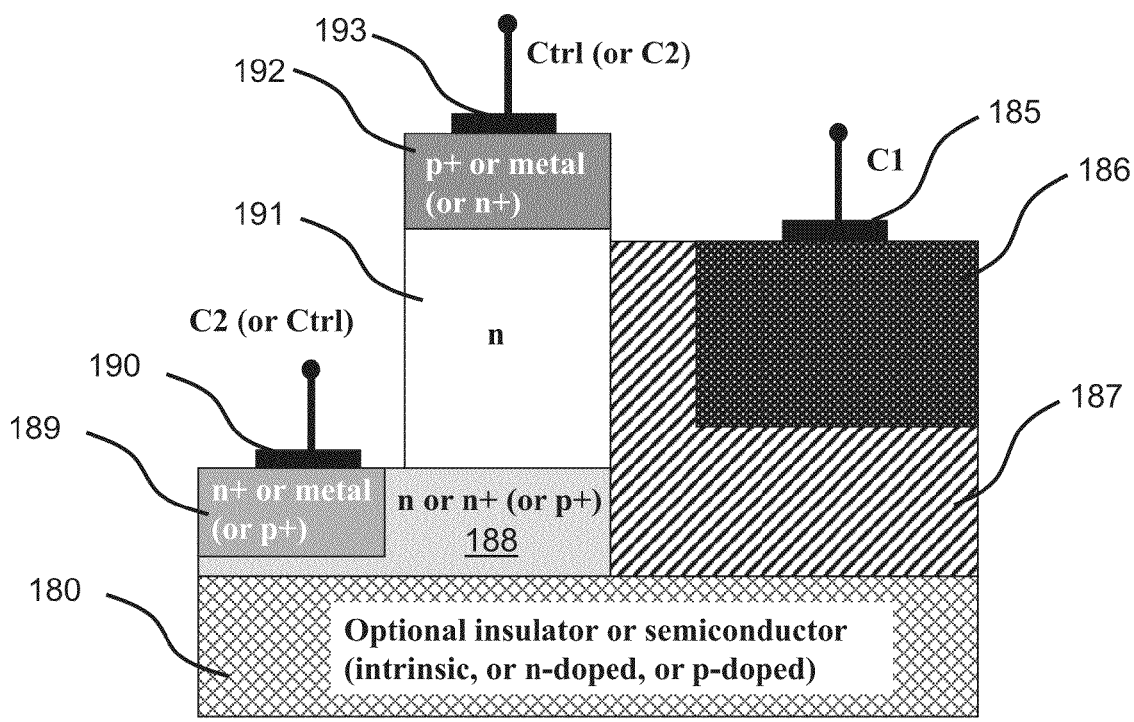
FIG. 24 shows a second example of implementation in III-V technology of a semiconductor variable capacitor according to the invention, where the depletion region moves in the vertical direction with respect to the primary surface of the semiconductor substrate.

The vertical configurations discussed above (including the ones of FIG. 9-21) are of particular interest also in III-V technology, especially in the case where p+ implantations are not available in the manufacturing process. In order to better understand this concept, let's consider a simple vertical implementation of the present invention as the one shown in FIG. 24. In this case, the p+ region 192 can be formed by growing or depositing directly a p+ doped layer (which does not need implantation process steps to be formed) instead of a p+ implantation process step. Furthermore, the p+ doped layer 192 can also be replaced with a metal layer so as to form a schottky contact with the underlining n-doped region 191, eliminating the need for p-dopants (which are usually more difficult to deal with in a III-V process). The n-doped region 191 can be contacted to the C2 terminal through an ohmic contact with an n+ or metallic region 189. If desired, the contact 190 with respect to the C2 terminal can been placed also in the third dimension (i.e. in the direction perpendicular to the cross section), or directly on the bottom of the structure by omitting the optional layer 180 (e.g. when the device is manufactured in a process for III-V discrete devices). It is important to notice that the n-doped region 188 (with the contact region 189) and the p+ region 192 can be swapped, by forming the n+ region above the device and the p+ region underneath.

Y FIG. 25

Figure 25:
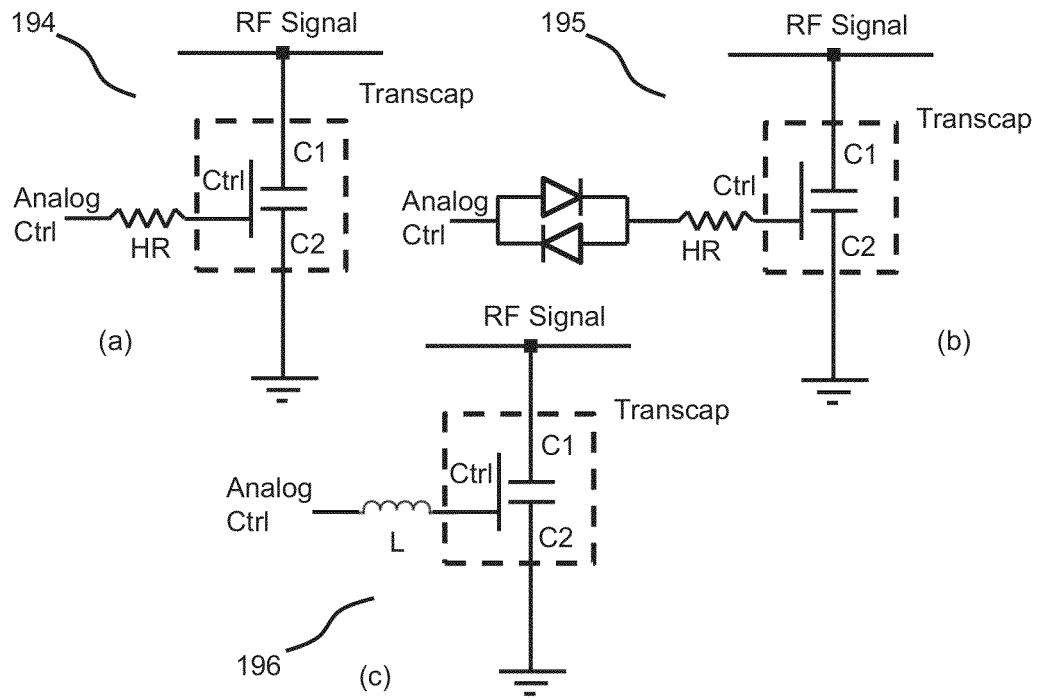
FIG. 25 shows three examples of control configuration for the transcap device.

FIG. 25 illustrates the most conventional control configurations of an analog transcap. As shown in FIG. 25 (a), a high value resistor HR can be placed in series to the Ctrl terminal in order to bias the device control terminal without affecting the RF performance of the device.

FIG. 25 (b) shows a possible variant of this configuration, where two anti-parallel diodes have been inserted in series to the high impedance HR in order to increase the AC de-coupling between the analog bias and the control terminal of the transcap device. A similar approach can be utilized for all the control configurations herein disclosed. Furthermore, the HR resistor can also be replaced with an inductor as shown in FIG. 25 (c).

As it can be seen, the conventional control configurations have several drawbacks: i) it is preferable to have the C2 terminal of the transcap connected to ground to avoid complicated control configurations, ii) the control voltage is negative (when an n-region is used under the capacitance oxide), iii) the RF signal drops entirely across C1 and C2 limiting the linearity of the system, iv) the RF signal can partially propagate through the control terminal leading to distortion.

Z FIG. 26

Figure 26:
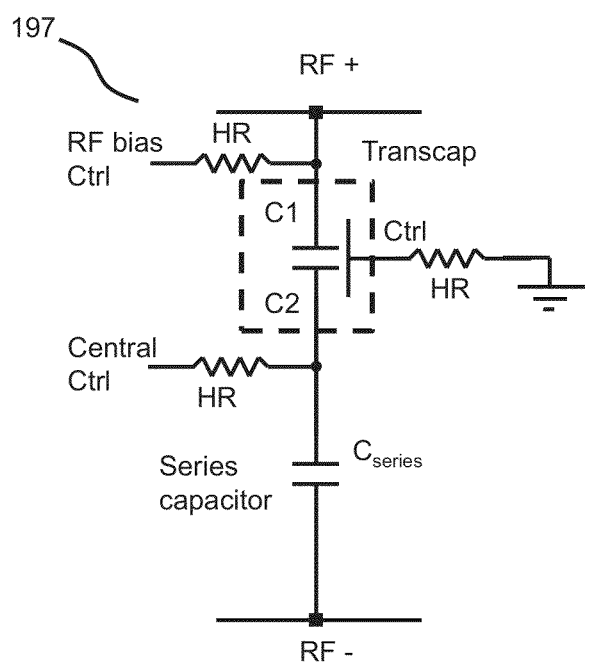
FIG. 26 shows a further example of control configuration for the transcap device.

Some of these problems can be solved by adding a series capacitor $C_{series}$ between the transcap device and one of the RF terminals. In FIG. 26, is shown an example of implementation of this control configuration. In the illustrated case, the control terminal of the transcap device can be coupled through a high impedance to ground (or to a bias DC source), and the middle node (obtained by coupling the C2 terminal to the series capacitance) can be used to modulate the total capacitance seen by the RF signal, by applying a positive DC bias. This configuration is suitable for both shunt and series tuning capacitor configurations.

In all the previous configurations the C1 terminal of the transcap device can be biased through a third high impedance (not shown in FIG. 25, and represented by the RF bias Ctrl pad in FIG. 26) in order to guarantee the correct operation of the structure.

AA FIG. 27

Figure 27:
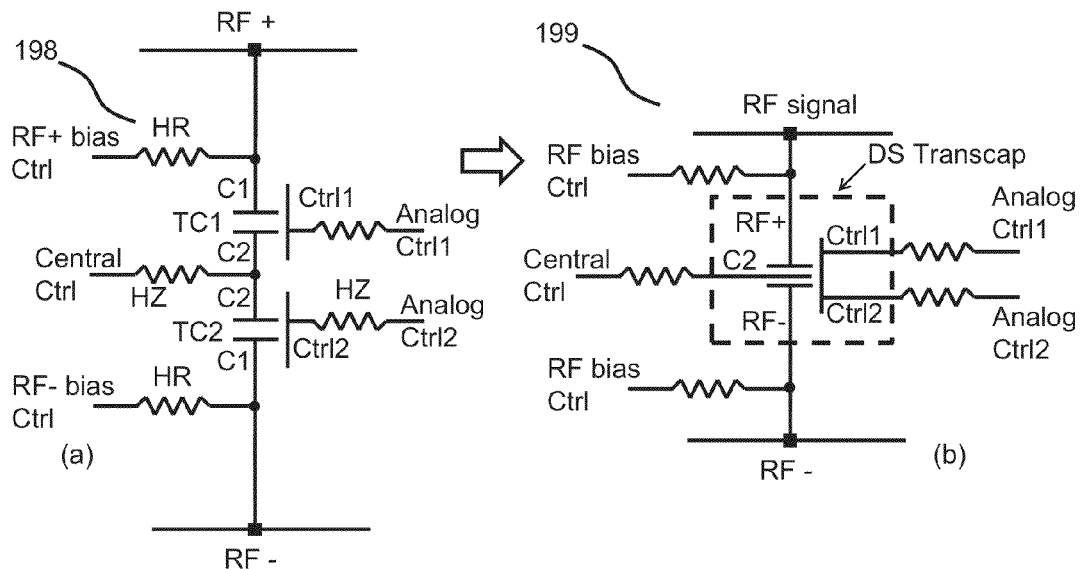
FIG. 27 shows a differential control configuration for the transcap device and the circuital symbol used to identify this particular configuration.

An even better performing approach is shown FIG. 27 (a), where two transcap devices TC1 and TC2 are connected back-to-back and the control terminals Ctrl1 and Ctrl2 are biased through two high impedance paths. The middle node obtained by coupling the two C2 terminals becomes therefore a third control terminal, which can also be used to modulate the capacitance seen by the RF signal. Also in this case, the RF terminals of the transcap device can be biased through high impedances in order to guarantee the correct operation of the transcap devices.

As shown in FIG. 27 (b) the differential series resulting from the connection back-to-back of two transcap devices can be seen as a single device with 5 terminals (RF+, RF−, C2, Ctrl1, Ctrl2), where two of them (RF+ and RF−) are dedicated to the RF signal and three (C2, Ctrl1, and Ctrl2) are used to control the capacitance value seen between RF+ and RF−. Hereafter, when possible, the symbol shown in FIG. 27 (b) will be utilized to represent the described 5 terminal differential series transcap device (DS Transcap) in order to simplify the circuit schematic.

AB FIG. 28

All the embodiments discussed above can be connected in differential series configuration so as to form a single device with 5 terminals. For example, FIG. 28 shows an example of implementation of the described series approach obtained by connecting back-to-back in series two transcap structures resembling the one of FIG. 2 so as to form a 5 terminal device.

AC FIG. 29

Figure 28:
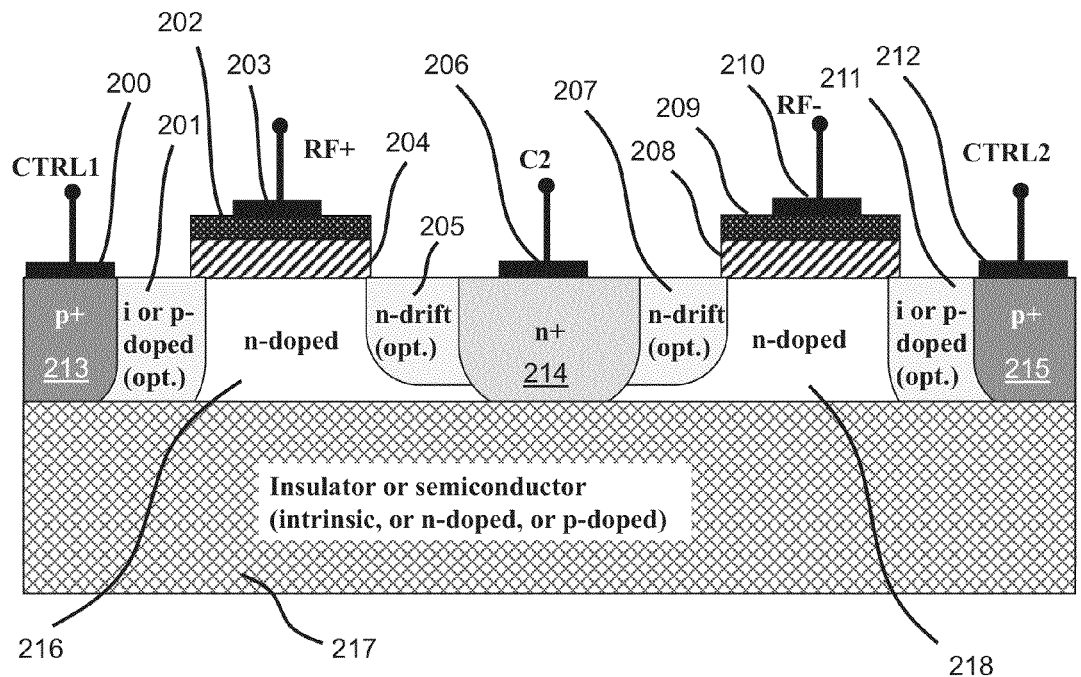
FIG. 28 shows an example of implementation of a 5 terminal differential-series transcap device realized using the device structure of FIG. 2.
Figure 29:
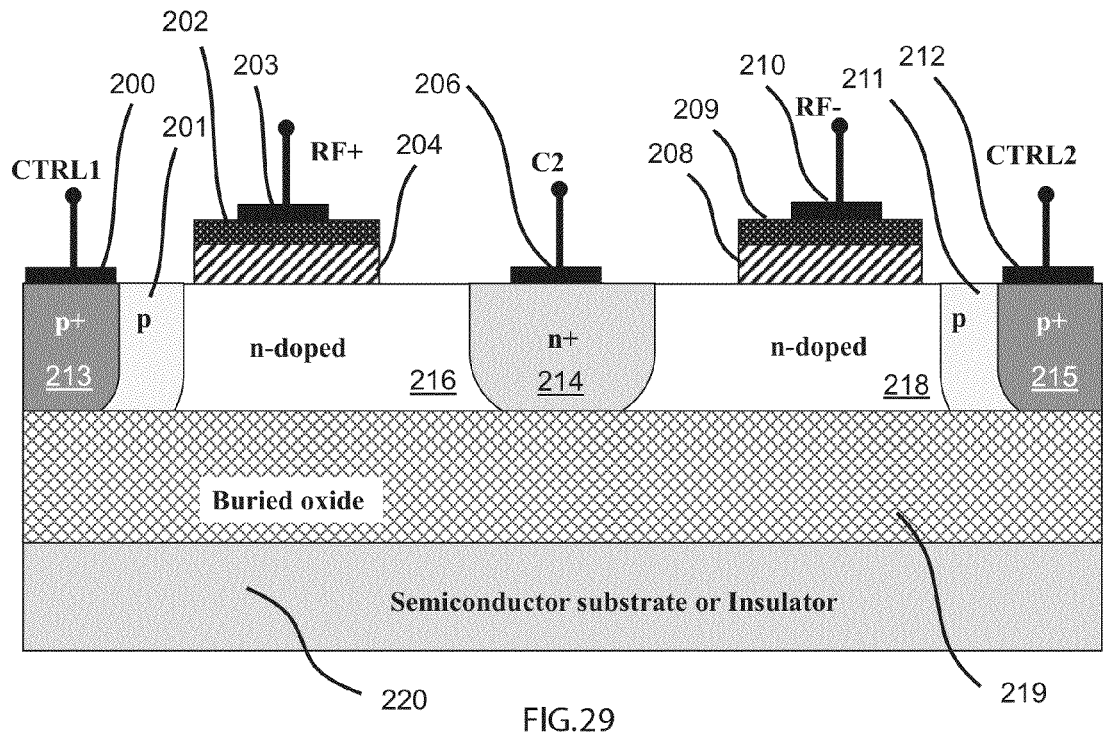
FIG. 29 shows a further example of implementation of a 5 terminal differential-series transcap according to the embodiment of FIG. 28, in fully depleted or partially depleted SOI technology.
Figure 30:
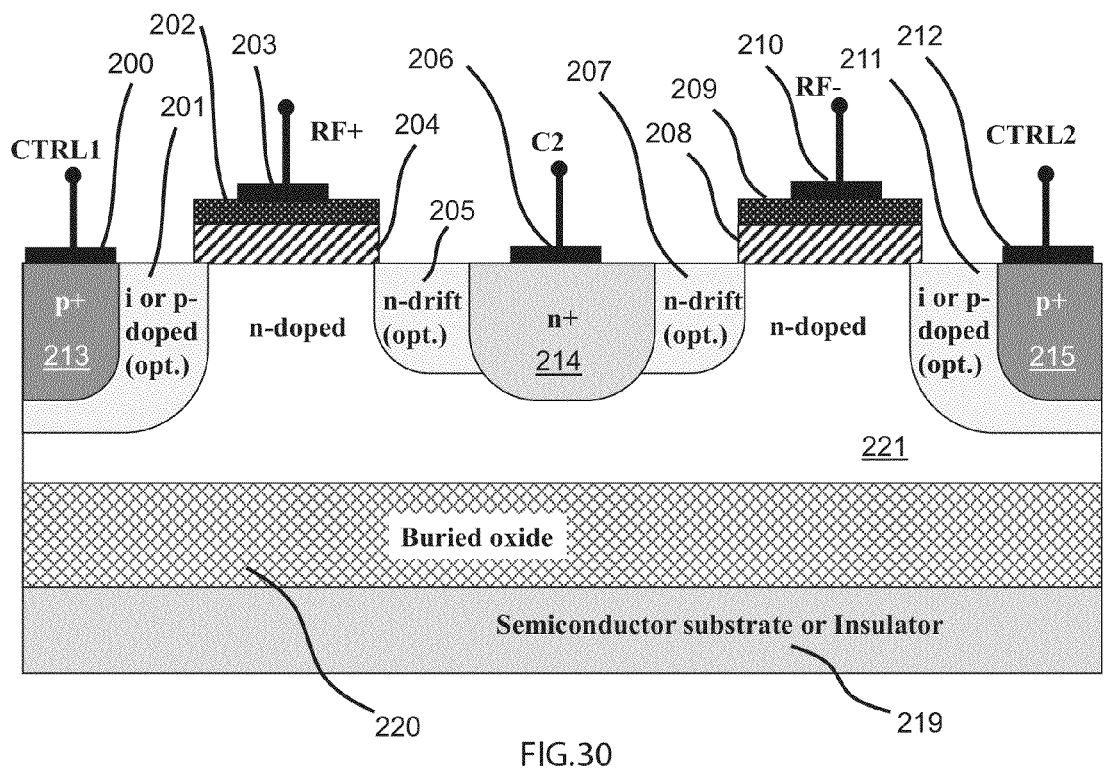
FIG. 30 shows a further example of implementation of a 5 terminal differential-series transcap according to the embodiment of FIG. 28, in high voltage SOI technology.
Figure 31:
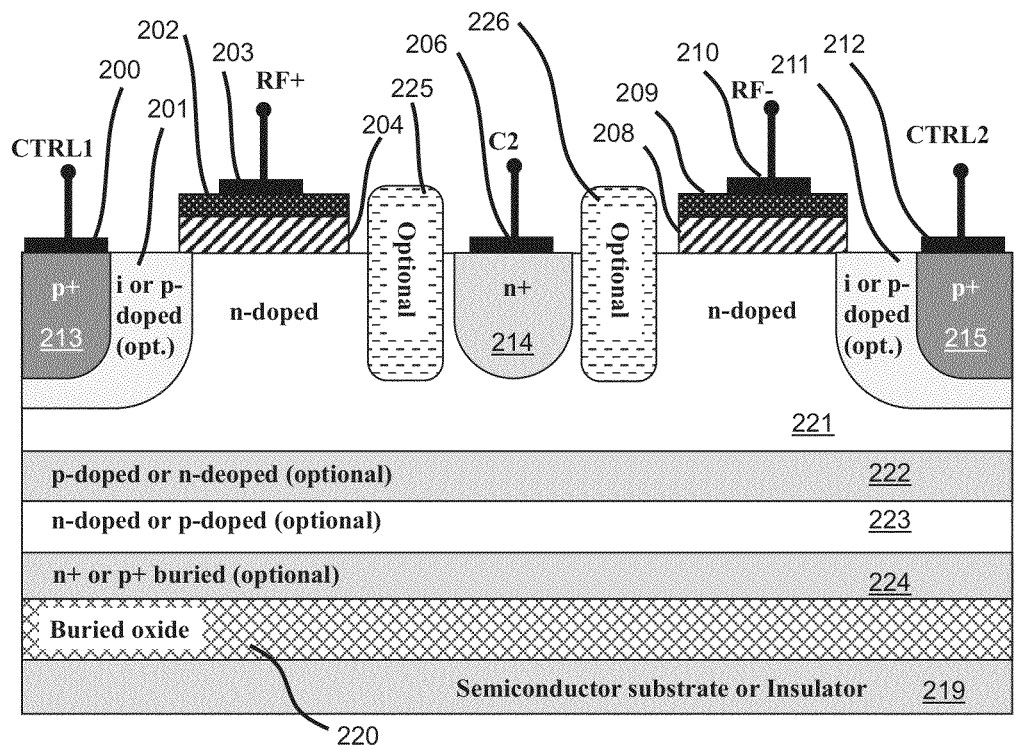
FIG. 31 shows a further example of implementation of a 5 terminal differential-series transcap according to the embodiment of FIG. 28, in high voltage SOI technology, where multiple optional doping implantations are shown.

FIG. 29-31 show three examples of possible implementations of the embodiment of FIG. 28 in SOI technology. In particular, FIG. 29 shows and example of implementation of the proposed invention in standard Fully depleted or Partially Depleted SOI process (where the active silicon layer thickness is usually chosen so as the superficial highly doped regions such as 213, 214, and 215 are formed in direct contact with the buried insulator).

AD FIG. 30

FIG. 30 illustrates an example of implementation of the present invention in high voltage SOI process (where the active silicon layer is usually thicker than the maximum depth achievable by the superficial highly doped region). If desired, when the n-doped region 221 is too deep to allow for a good isolation of the C2 terminal for high control voltage values, two isolating regions (extending below the semiconductor surface) can be placed between the capacitance oxides 204 and 208 and the C2 implantation 214 so as to increase the device tuning range. However, in this case careful attention must be paid not to degrade the quality factor of the device.

AE FIG. 31

FIG. 31 illustrates a second example of implementation of the present invention in high voltage SOI process. Also in this case, when the n-doped region 221 is too deep to allow for a good isolation of the C2 terminal for high control voltage values, two isolating regions 225 and 226 extending below the semiconductor surface, can be optionally added between the capacitance oxides 204 and 208 and the C2 implantation 214 so as to increase the device tuning range.

AF FIG. 32

Figure 32:
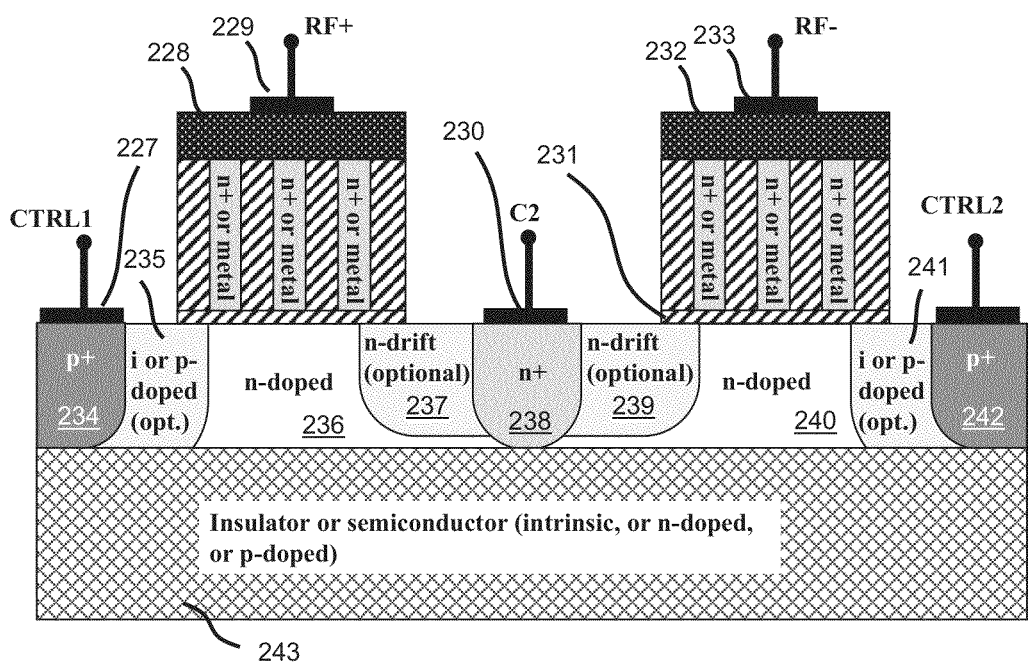
FIG. 32 shows an example of implementation of a 5 terminal differential-series transcap device realized using the device structure of FIG. 6.

FIG. 32 illustrates another possible implementation of the series approach by using two building blocks resembling the one of FIG. 6.

AG FIG. 33

Figure 33:
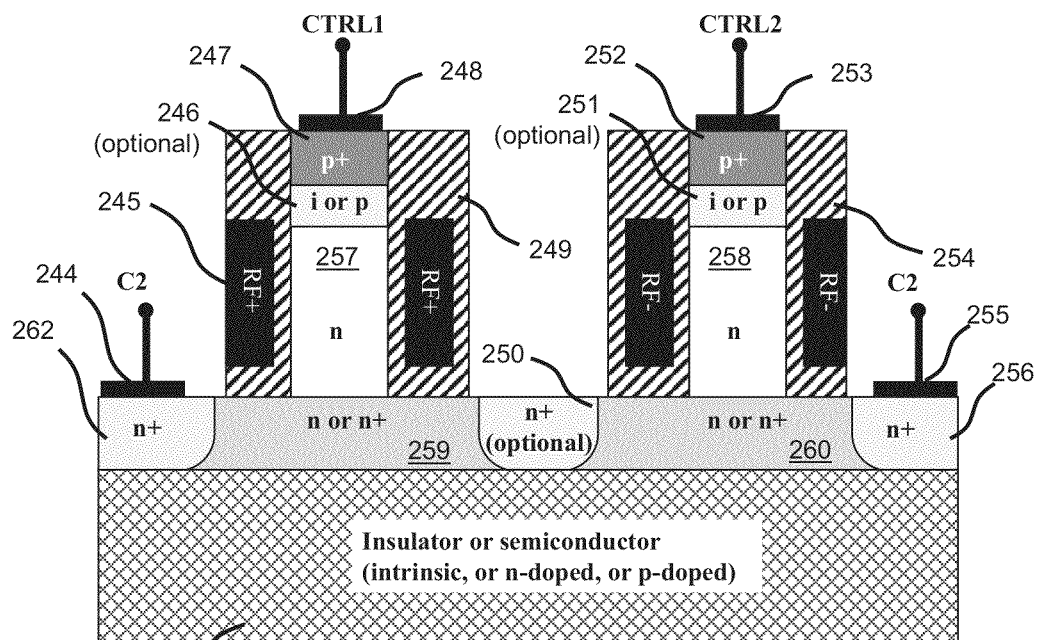
FIG. 33 shows an example of implementation of a 5 terminal differential-series transcap device realized using the device structure of FIG. 9.

FIG. 33 illustrates another possible implementation of the series approach by using the building block of FIG. 9.

AH FIG. 34

Figure 34:
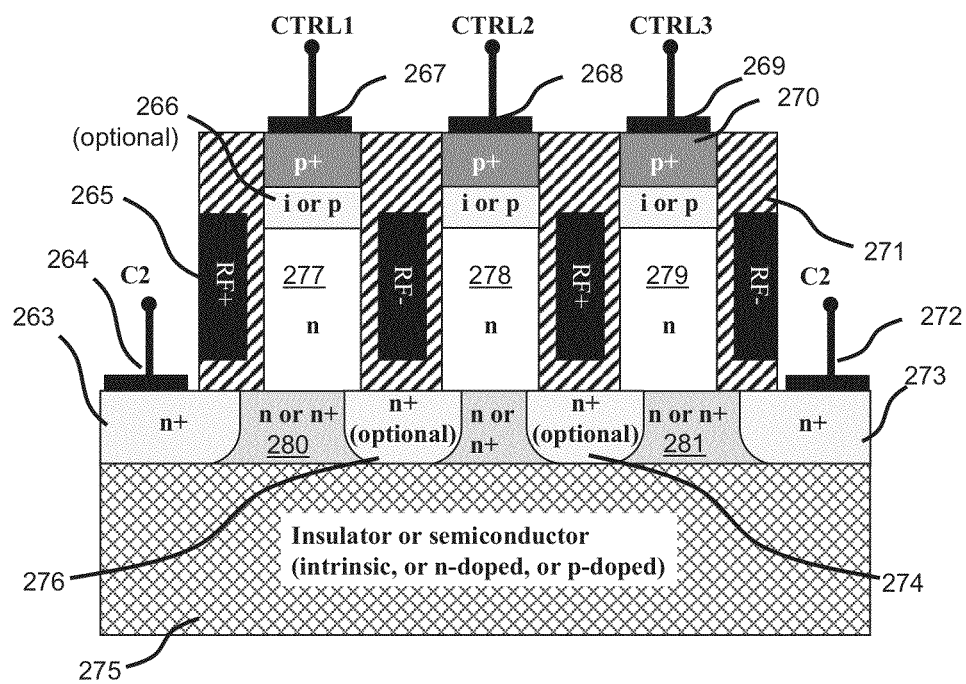
FIG. 34 shows an example of implementation of a differential-series transcap device realized using a device structure resembling the one of FIG. 9, obtained by alternating the RF+ and RF− regions.

A variant of the configuration of FIG. 33 is shown in FIG. 34, where the RF+ and RF− terminals have been alternated in order to maximize the capacitance density.

AI FIG. 35

Figure 35:
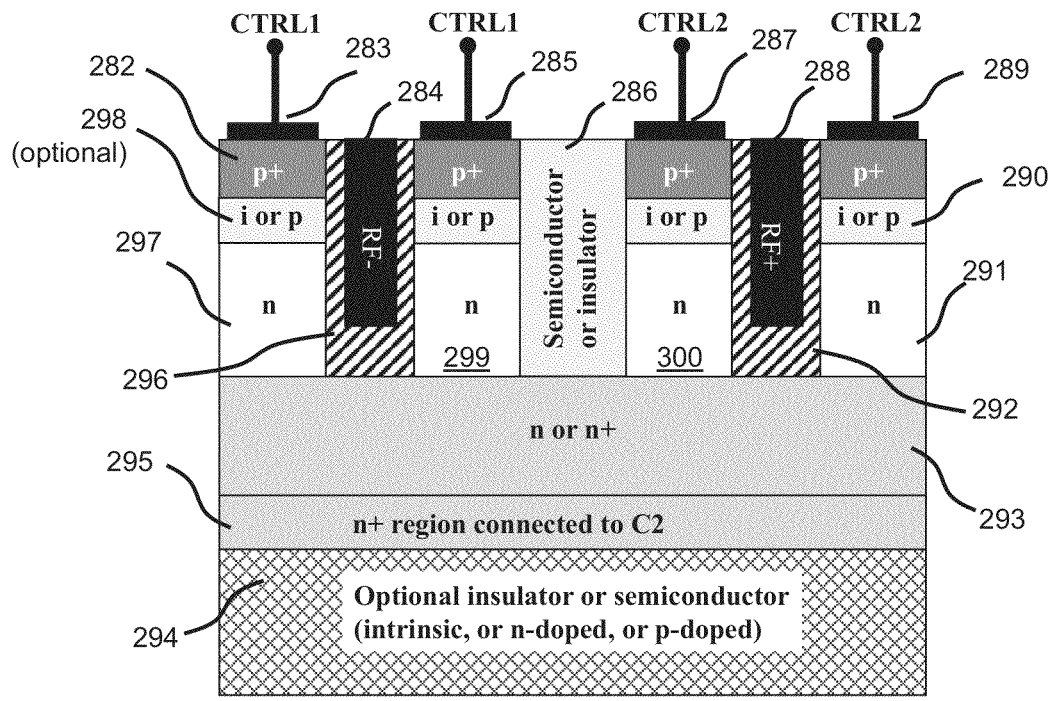
FIG. 35 shows an example of implementation of a 5 terminal differential-series transcap device realized using the device structure of FIG. 14.

FIG. 35 illustrates a further example of differential-series transcap device obtained by connecting in series two devices according to the embodiment of FIG. 14.

AJ FIG. 36

Figure 36:
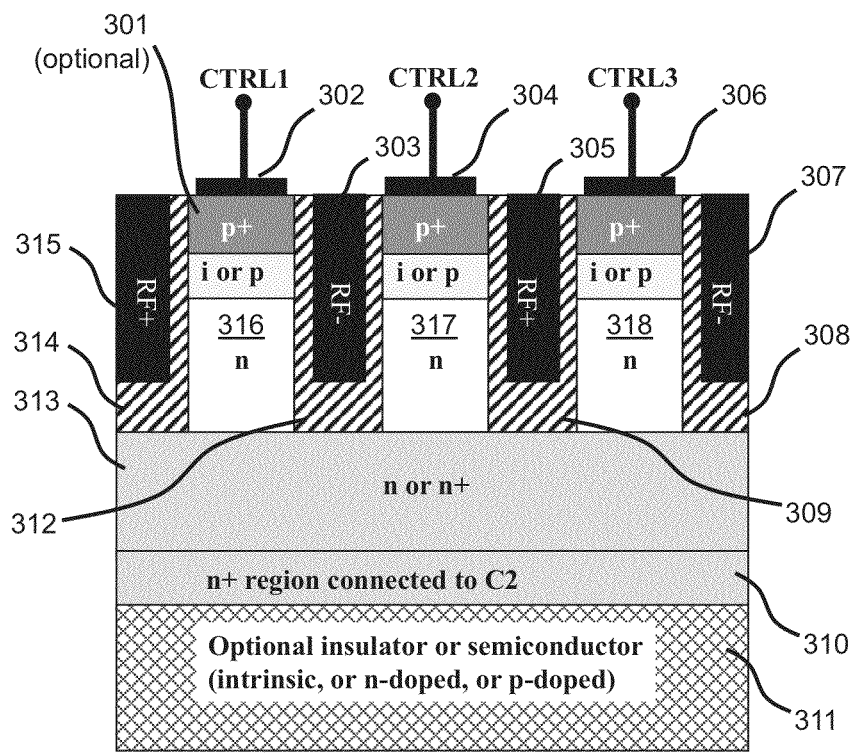
FIG. 36 shows a further example of implementation of a 5 terminal differential-series transcap device realized using the device structure of FIG. 14.

A variant of the configuration of FIG. 35 is shown in FIG. 36, where the RF+ and RF− terminals have been alternated in order to maximize the capacitance density. It is important to notice that the differential-series configuration can be utilized with all the transcap structures herein described and their variants, by connecting two of them back-to-back in series. In general, the ratio of the capacitance values between the two transcap structures composing the differential-series configuration can be made equal or different from the unity.

AK FIG. 37

Another set of interesting implementations of the differential-series approach in CMOS/BiCMOS technology is shown in FIG. 37-50. These embodiments present a set of optional regions that can be added or omitted from the structure based on the characteristics of the utilized process, the characteristics of the application, and if the transcap device is utilized as a discrete device or if multiple components must be integrated in the same die. Each of these layers can be shorted directly or through a high impedance path (e.g. through a high value resistor) to ground, or to the supply, or to the control voltage, or to a voltage greater or equal to the maximum RF signal value, or lower or equal the minimum RF signal value, or any other semiconductor region or terminal of the device depending from the chosen implementation and the type of substrate (n-doped, p-doped or intrinsic and/or epitaxial). In general, if desired, others n-doped or p-doped or intrinsic layers/regions (including heavily doped barrier layers) can be also added to the structures. Any doping profile or concentration can utilized for the different semiconductor regions/layers composing the device.

Figure 37:
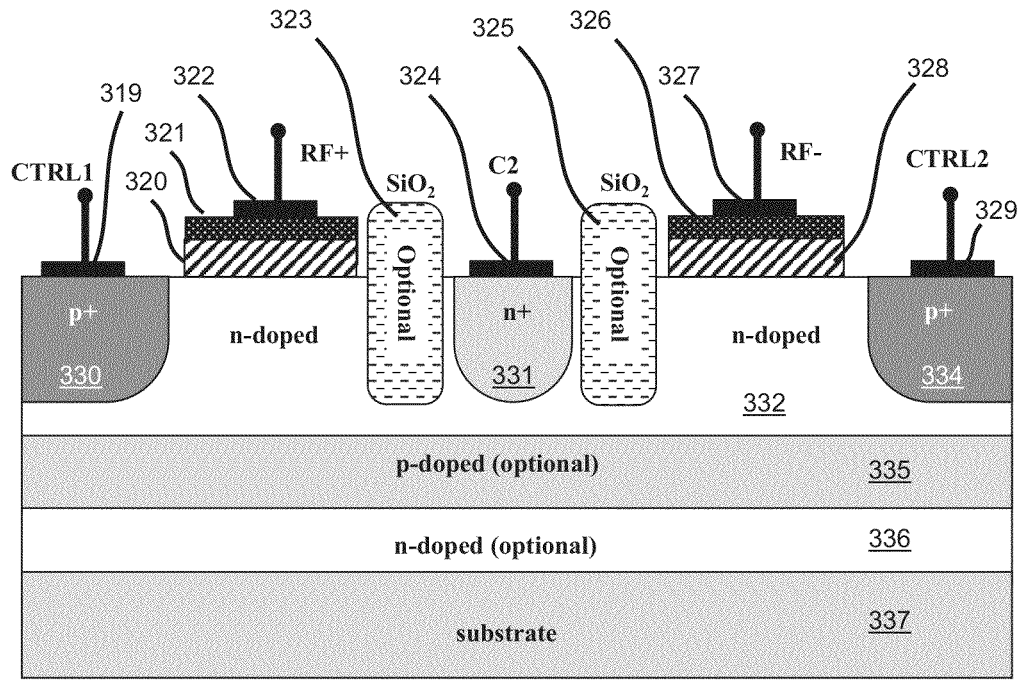
FIG. 37 shows an example of implementation of a 5 terminal differential-series transcap according to the embodiment of FIG. 28, in CMOS/BiCMOS process technology.

In the embodiment of FIG. 37 the n-doped region 332 can be obtained with any n-type implantation available in the process such as drift, dext or n-well implantations. While the other n-type and p-type implantations 335 and 336 can be obtained usually through n-well, deep n-well, p-well, deep p-well or buried implantations. For example, if the transcap device is formed in standard CMOS process on a p-type substrate, and the device does not need to be isolated, the p-doped region 335 and/or the n-doped region 336 can be omitted, while region 337 represents the p-doped substrate. The substrate 337 can be connected through a high impedance path (or directly) to another terminal of the device (e.g. CTRL) or it can be connected through a high impedance path (or directly) to ground.

If instead, the device must be isolated, typically because the RF signal swings from positive voltage values to negative ones, and the n-doped region 332 has been formed with a n-drift or n-dext implantation (or a n-well implantation), the p-doped and n-doped regions can be formed with a p-well implantation and a n-well (or a deep n-well) implantation, respectively. In this case, the substrate 337 must be connected directly to ground (unless it is intrinsic), and the p-doped region can be connected through a high impedance path to ground (so as to become a control region), or it can be shorted to one (or more) p+ control regions. The n-doped region can be coupled (directly or through a high impedance path) to a voltage greater or equal to the maximum RF signal value or (through a high impedance path and/or a diode) to the supply voltage as will be discussed more in detail later in the specifications. Also in this case two isolating regions 323 and 325 can be optionally added on the sides of the capacitance oxides 320 and 328 so as to increase the isolation of the n+ region 331 for high control voltage values.

AL FIG. 38

Figure 38:
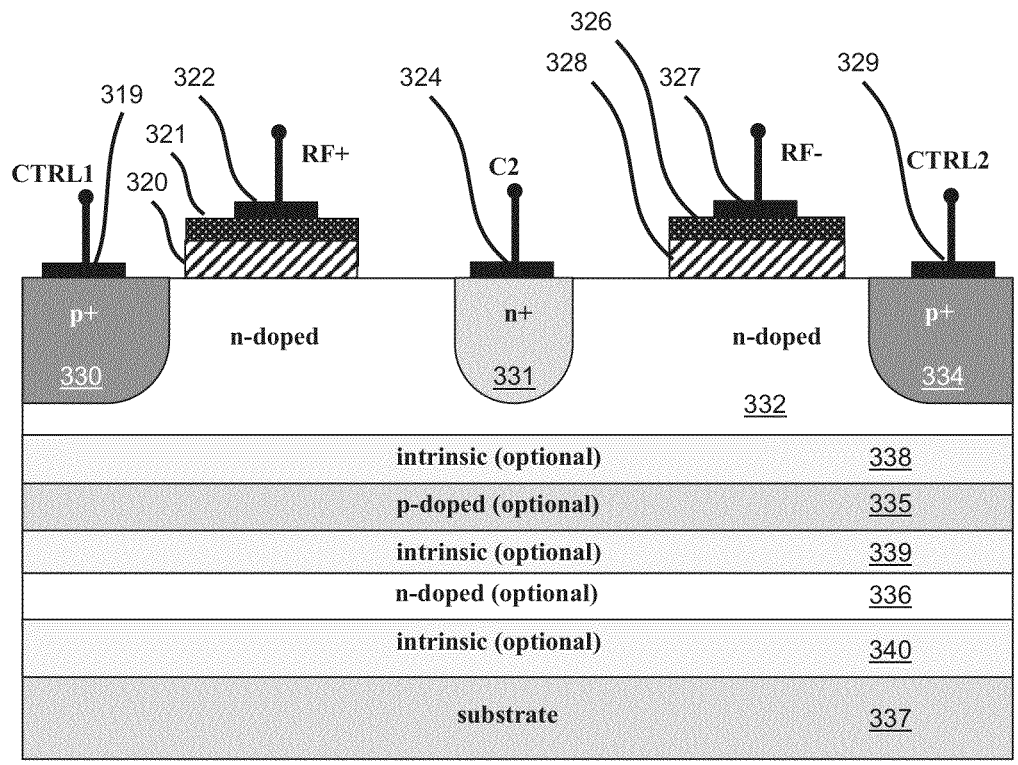
FIG. 38 shows a further example of implementation of a 5 terminal differential-series transcap according to the embodiment of FIG. 28, in CMOS/BiCMOS process, technology where intrinsic regions have been added between the n-doped and p-doped regions so as to decrease the parasitic capacitances.

If desired, one or more intrinsic regions can be added to the structure, for example between the p-doped and n-doped regions as shown in the embodiment of FIG. 38 so as to decrease the parasitic capacitances of the device, or an intrinsic epitaxial layer can be used as a substrate.

AM FIG. 39

Figure 39:
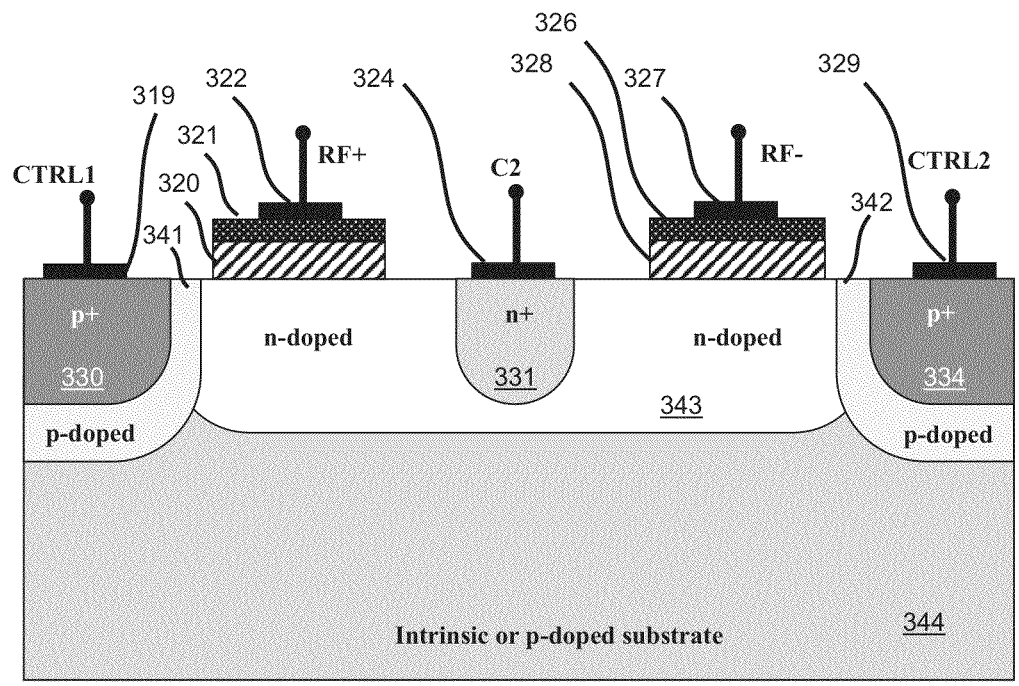
FIG. 39 shows a further example of implementation of a 5 terminal differential-series transcap according to the embodiment of FIG. 28, in CMOS/BiCMOS process technology with an intrinsic or p-doped substrate.

FIG. 39 illustrates another interesting implementation of the present invention, where the device has been formed directly into the substrate 344 without isolation wells.

AN FIG. 40

Figure 40:
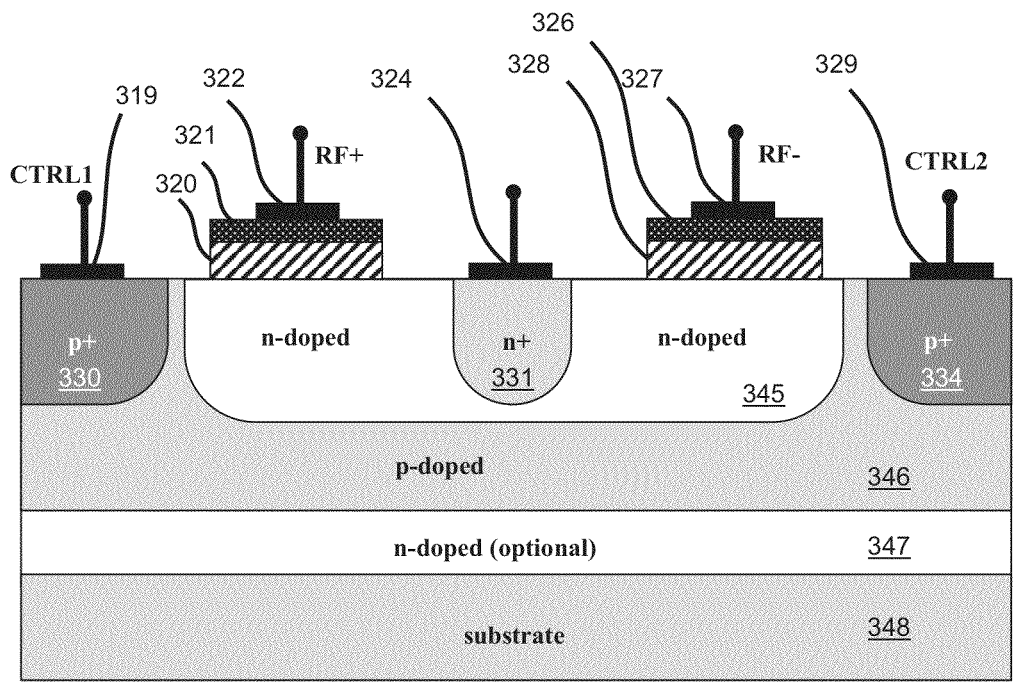
FIG. 40 shows a further example of implementation of a 5 terminal differential-series transcap according to the embodiment of FIG. 28, in CMOS/BiCMOS process technology where the control regions have been formed directly in a p-well.

In general, one or both control regions can also be formed directly in contact or within a p-doped region as shown in FIG. 40.

AO FIG. 41

Figure 41:
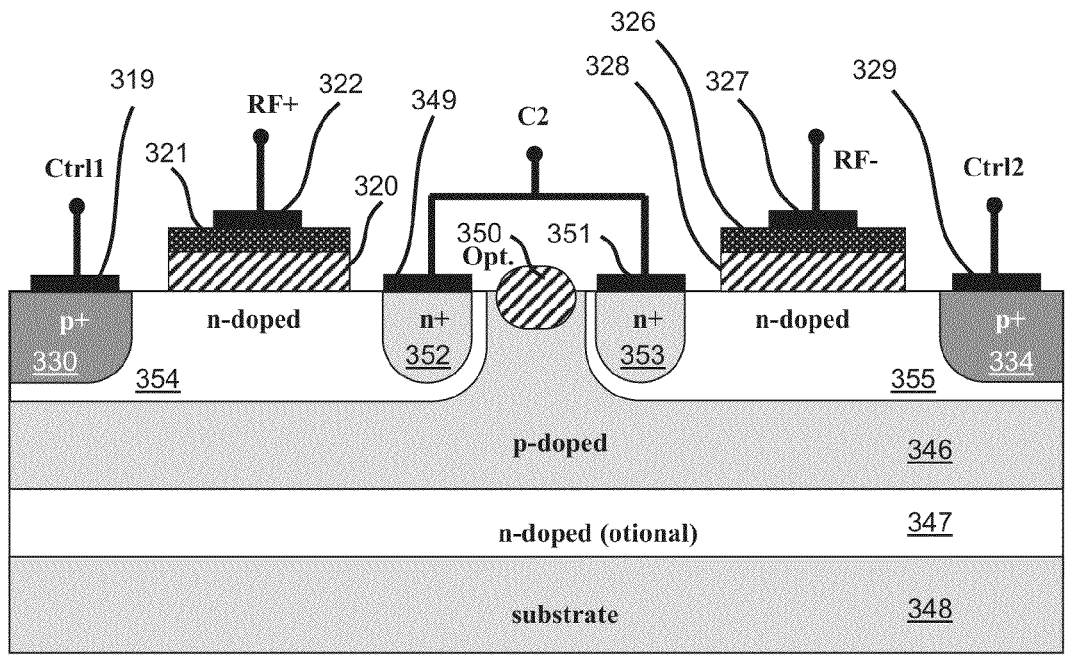
FIG. 41 shows a further example of implementation of a differential-series transcap according to the embodiment of FIG. 28, in CMOS/BiCMOS process technology where the two transcap devices have been formed in separated n-doped regions.

FIG. 41 shows a further example of implementation of a differential-series transcap according to the embodiment of FIG. 28, in CMOS/BiCMOS process technology where the two transcap devices have been formed in separated n-doped regions. The insulating region 350 is optional.

AP FIG. 42

Figure 42:
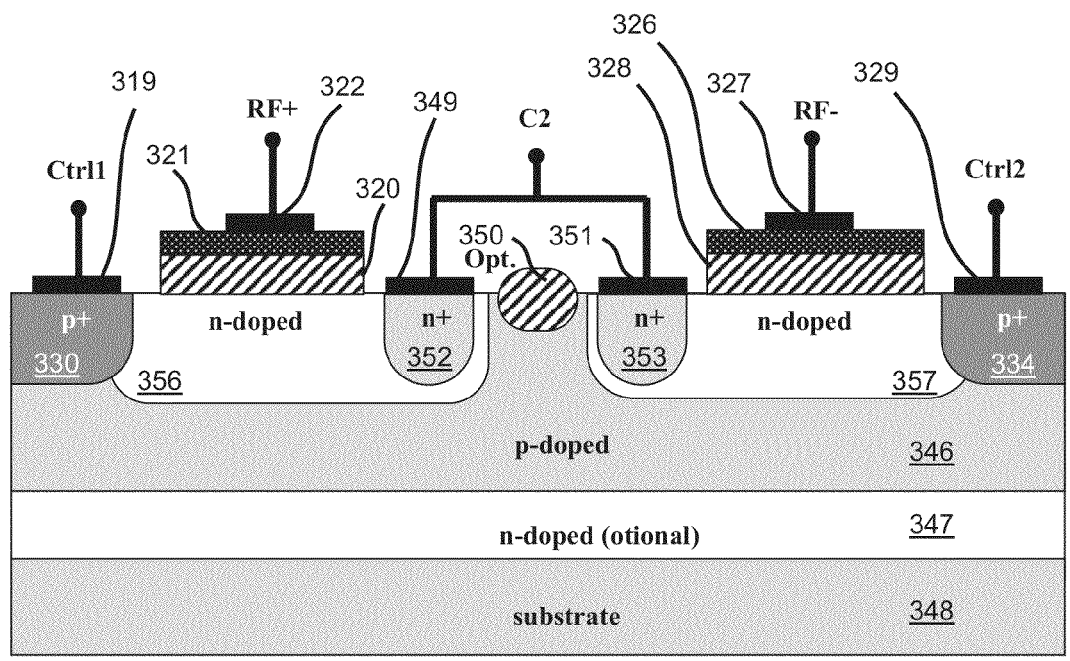
FIG. 42 shows a further example of implementation of a differential-series transcap according to the embodiment of FIG. 28, in CMOS/BiCMOS process technology where the two transcap devices have been formed in separated n-doped regions and the control regions have been formed directly in a p-well.

FIG. 42 shows a further example of implementation of a differential-series transcap according to the embodiment of FIG. 28, in CMOS/BiCMOS process technology where the two transcap devices have been formed in separated n-doped regions and the control regions have been formed directly in a p-well.

AQ FIG. 43

Figure 43:
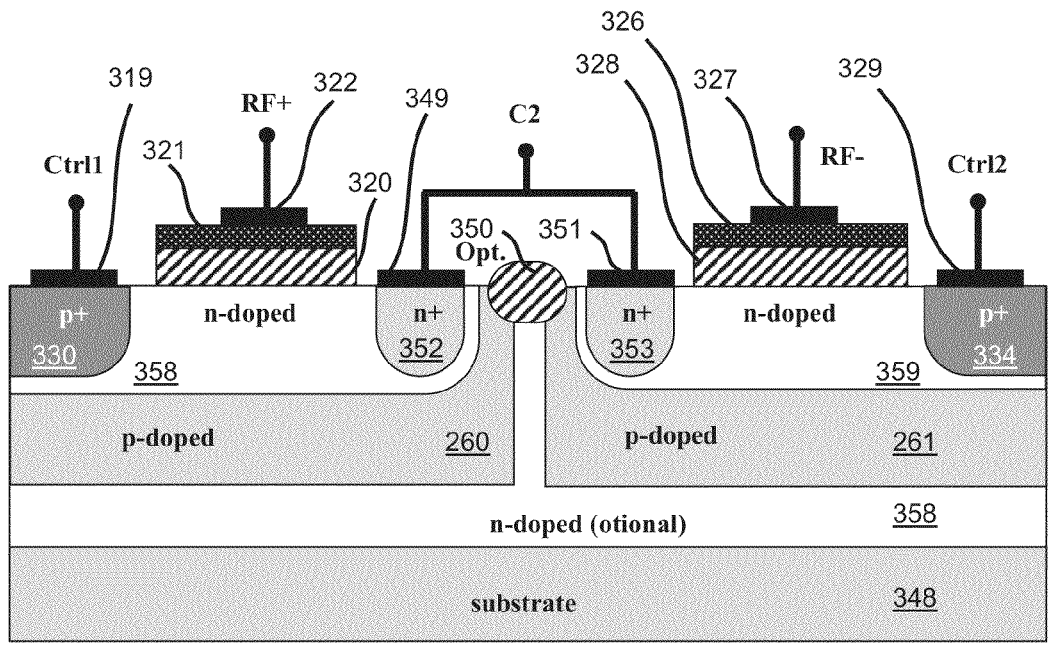
FIG. 43 shows a further example of implementation of a differential-series transcap according to the embodiment of FIG. 28, in CMOS/BiCMOS process technology where the two transcap devices have been formed in separated p-wells.

FIG. 43 shows a further example of implementation of a differential-series transcap according to the embodiment of FIG. 28, in CMOS/BiCMOS process technology where the two transcap devices have been formed in separated p-wells.

AR FIG. 44

Figure 44:
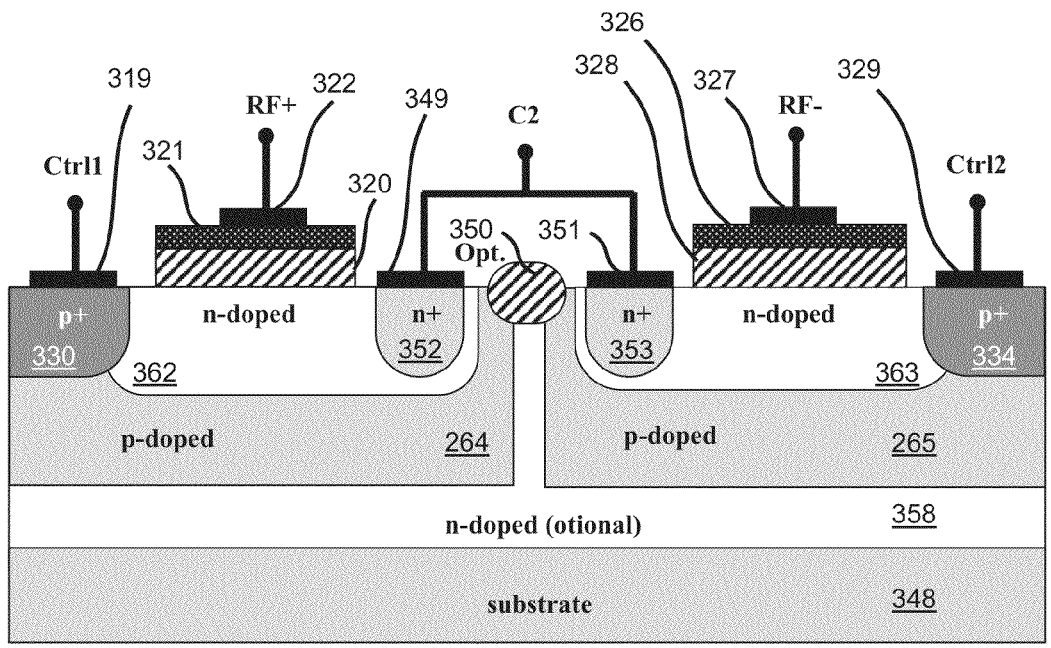
FIG. 44 shows a further example of implementation of a differential-series transcap according to the embodiment of FIG. 28, in CMOS/BiCMOS process technology where the two transcap devices have been formed in separated p-wells and the control regions have been formed directly in a p-well.

FIG. 44 shows a further example of implementation of a differential-series transcap according to the embodiment of FIG. 28, in CMOS/BiCMOS process technology where the two transcap devices have been formed in separated p-wells and the control regions have been formed directly in a p-well.

AS FIG. 45

Figure 45:
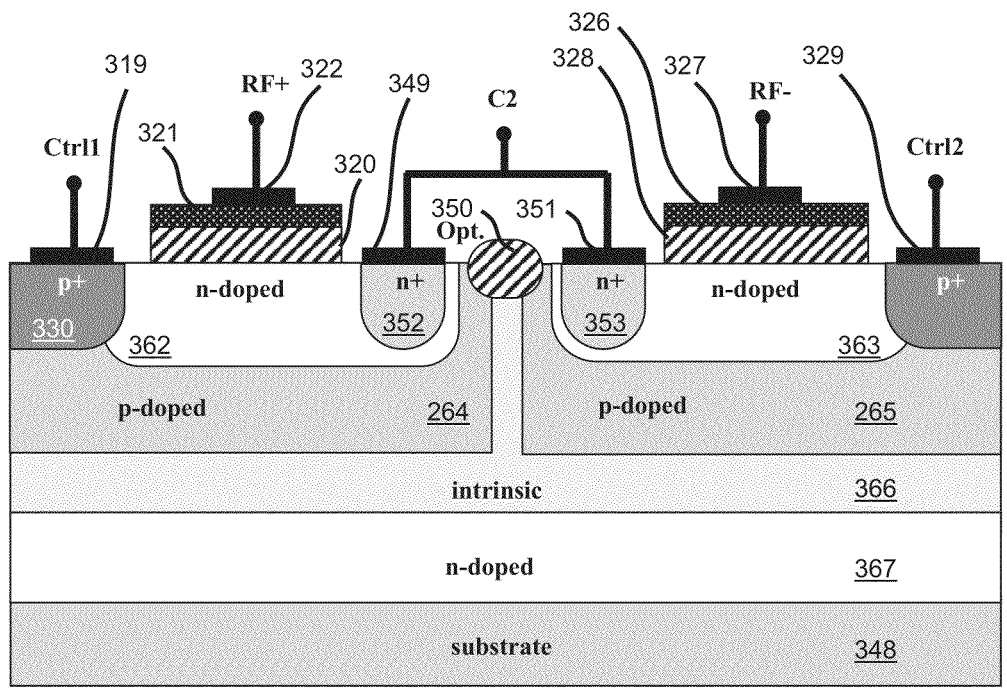
FIG. 45 shows a further example of implementation of a differential-series transcap according to the embodiment of FIG. 28, in CMOS/BiCMOS process technology where the two transcap devices have been formed in separated p-wells and an intrinsic layer has been added between the n-well and the p-wells.

FIG. 45 shows a further example of implementation of a differential-series transcap according to the embodiment of FIG. 28, in CMOS/BiCMOS process technology where the two transcap devices have been formed in separated p-wells and an intrinsic layer has been added between the n-well and the p-wells.

AT FIG. 46

Figure 46:
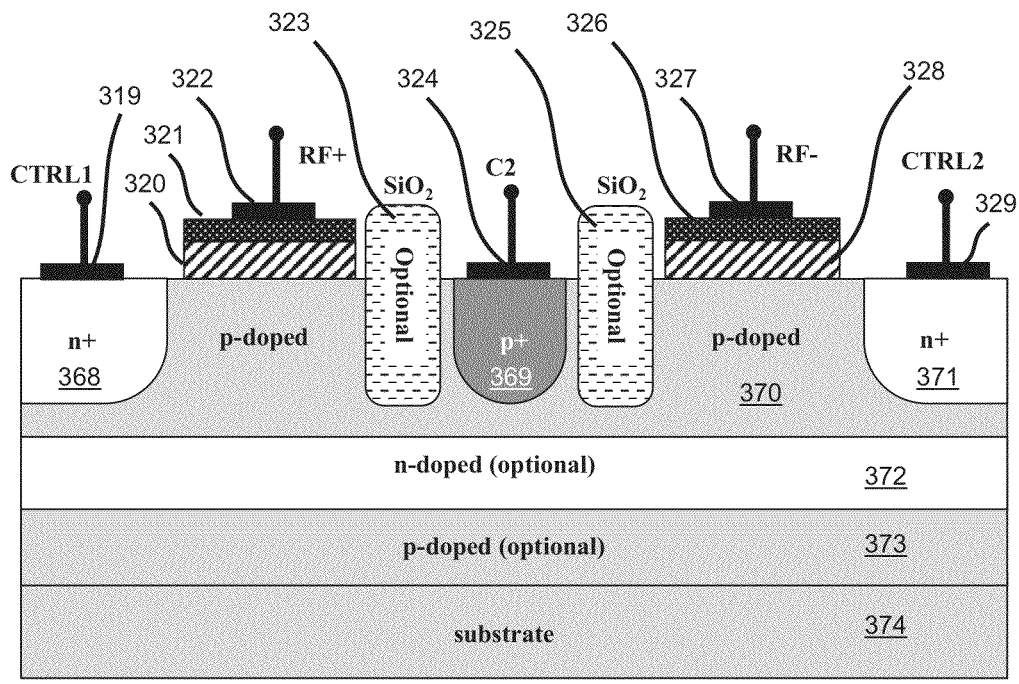
FIG. 46 shows a further example of implementation of a differential-series transcap according to the dual version of the embodiment of FIG. 237.

For all the embodiments herein described, the dual version can be obtained by simply substituting the n-doped regions with p-type ones and vice-versa. In FIG. 46 is reported an example of dual version of the transcap device shown in FIG. 37. If a p-type substrate is used, the optional p-doped region can be omitted. In the embodiment of FIG. 46, the C2 terminal can be connected (through a high impedance path) to ground, while a positive control voltage can be applied (preferably through two separate high impedance paths) to the CTRL1 and CTRL2 terminals.

AU FIG. 47

Figure 47:
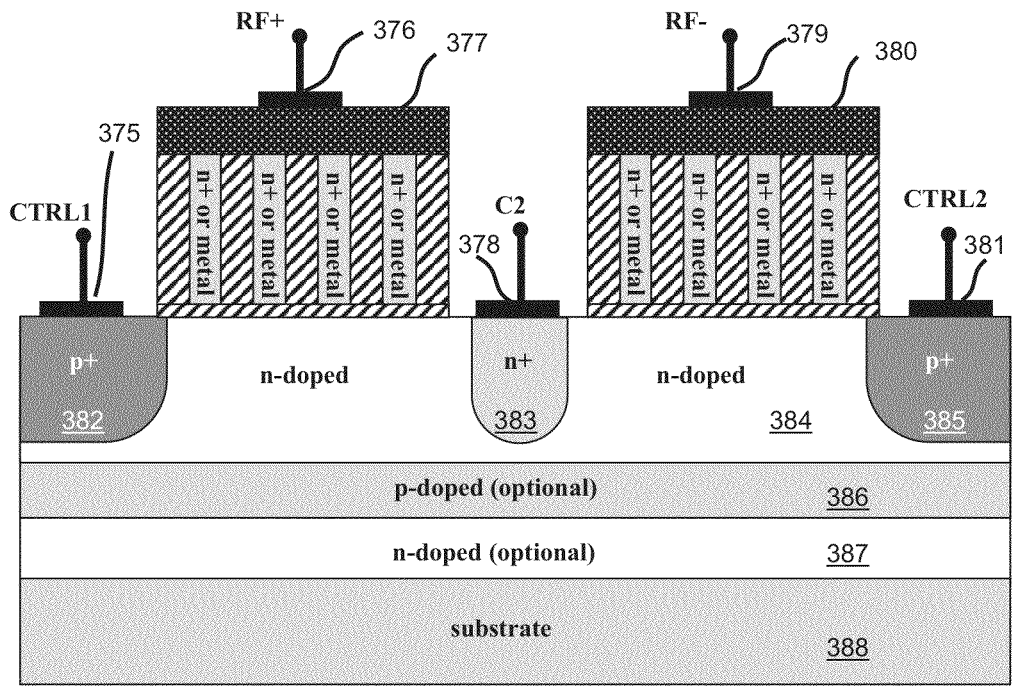
FIG. 47 shows an example of implementation of a 5 terminal differential-series transcap according to the embodiment of FIG. 32, in CMOS/BiCMOS process technology.

FIG. 47 shows an example of implementation of a 5 terminal differential-series transcap according to the embodiment of FIG. 32, in CMOS/BiCMOS process technology.

AV FIG. 48

Figure 48:
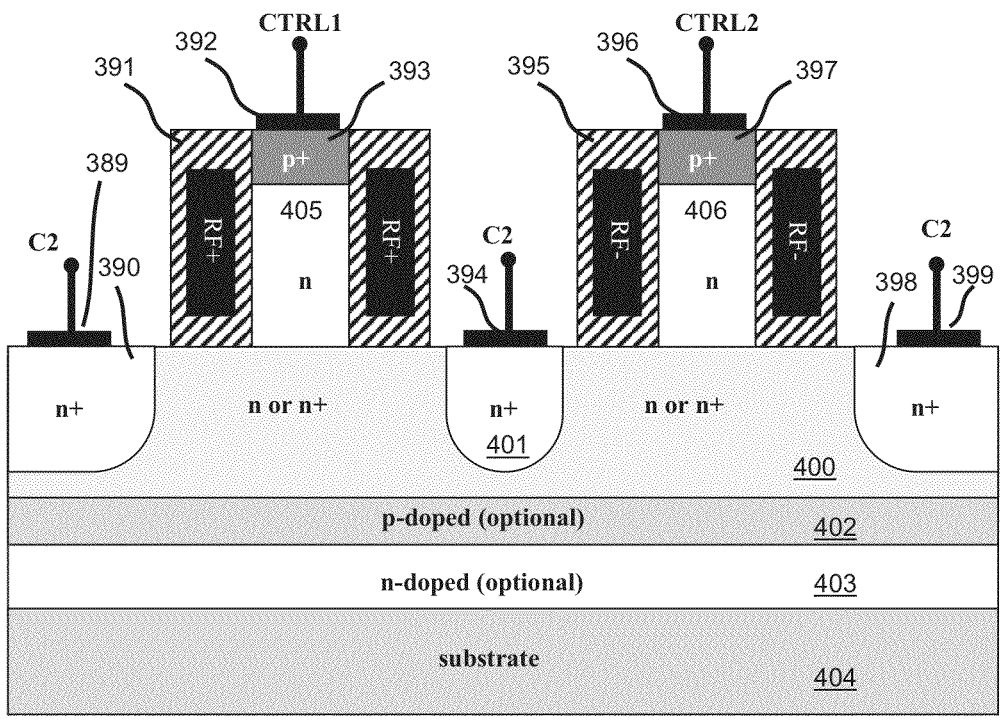
FIG. 48 shows an example of implementation of a 5 terminal differential-series transcap according to the embodiment of FIG. 33, in CMOS/BiCMOS process technology.

FIG. 48 shows an example of implementation of a 5 terminal differential-series transcap according to the embodiment of FIG. 33, in CMOS/BiCMOS process technology.

AW FIG. 49

Figure 49:
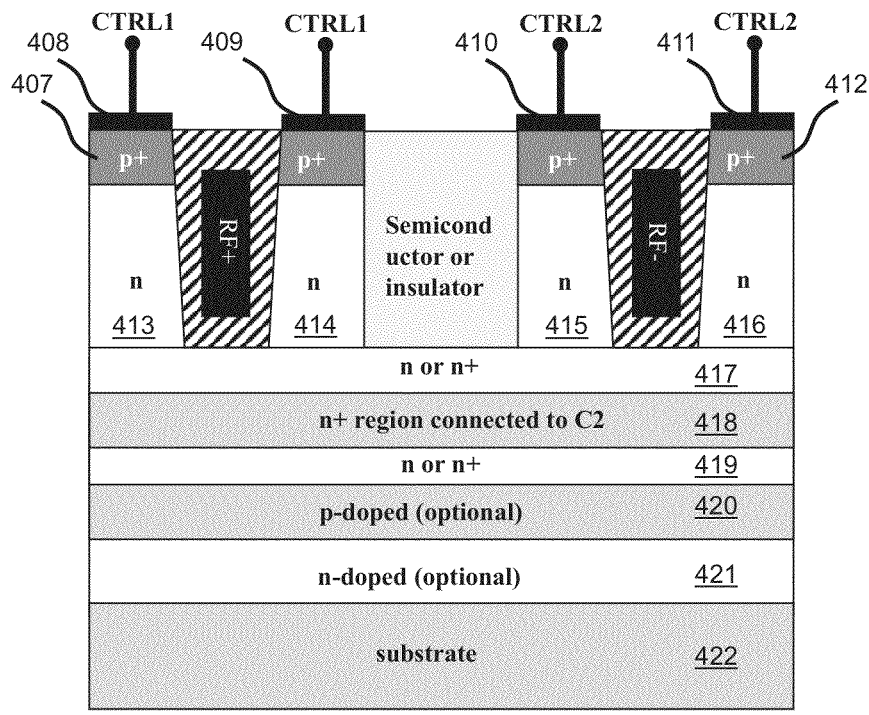
FIG. 49 shows an example of implementation of a 5 terminal differential-series transcap according to the embodiment of FIG. 35, in CMOS/BiCMOS process technology.

FIG. 49 shows an example of implementation of a 5 terminal differential-series transcap according to the embodiment of FIG. 35, in CMOS/BiCMOS process technology. It is important to notice that also for the embodiments of FIGS. 47, 48, and 49, all the observations discussed above for the other embodiments build in CMOS/BiCMOS technology hold true. Furthermore, it is important to notice that similar implementations in CMOS/BiCMOS technology can be obtained for many other embodiments of the present invention including the ones of FIG. 1-21.

AX FIG. 50

Figure 50:
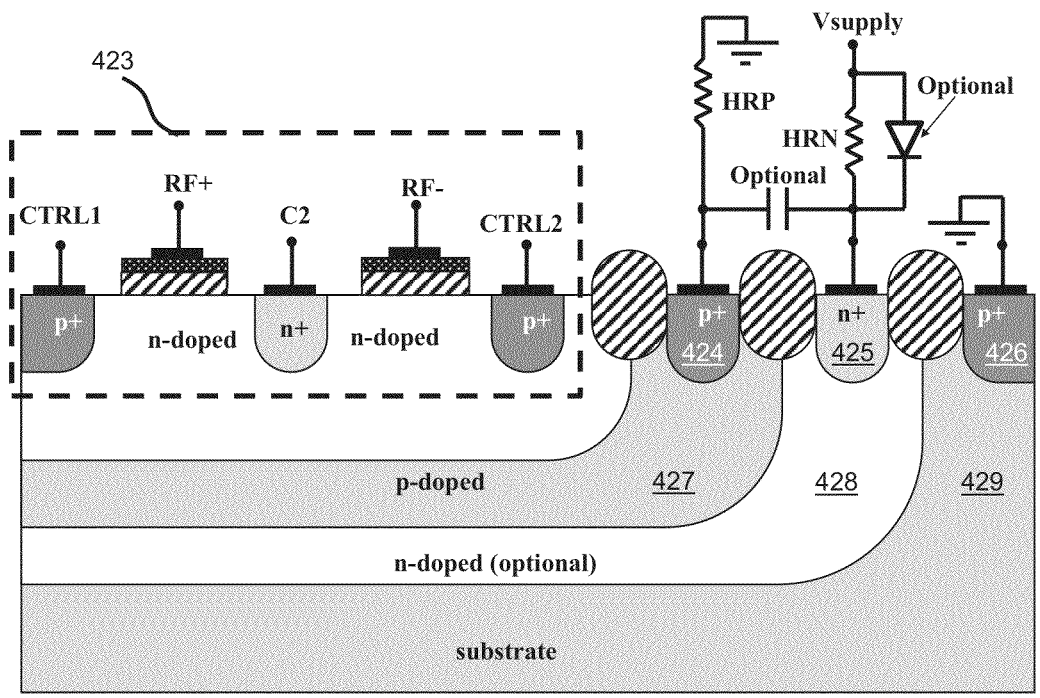
FIG. 50 shows an example of bias configuration that can be used to isolate a transcap device from other devices in the circuit when the invention is realized in CMOS/BiCMOS process technology.

For all the embodiments herein discussed, each semiconductor layer/region can be biased in many different ways in order to guarantee the correct operation of the device. In particular, if n-well, and/or deep n-well, and/or p-well, and/or deep p-well, and/or buried implants are used to isolate the transcap device from other devices, a possible bias configuration is to connect the p-well (and/or deep p-well and/or p+ buried) through an high impedance path (e.g. a high value resistor) to ground and the n-well (and/or deep n-well and/or n+ buried) to the supply voltage, once again through an high impedance path (e.g. a high value resistor) as shown in FIG. 50. If desired, in order to improve the device isolation, a diode can be placed in parallel to the resistor HRN biasing the n-well (and/or deep n-well and/or n+ buried) or the HRN resistor itself can be replaced with a diode, so as to limit the minimum voltage of the n-well (and/or deep n-well and/or n+ buried) to the supply voltage. Another possibility is to add the diode in parallel to the HRP resistor biasing the p-well (and/or deep p-well and/or p+ buried) instead of adding it in parallel to HRN (or use two diodes, one to bias the n-doped isolation region and one to bias the p-doped isolation region), by connecting the anode of the diode to the p-well (and/or deep p-well and/or p+ buried) and the cathode to ground. An optional capacitor can also be added between the n-well (and/or deep n-well and/or n+ buried) and the p-well (and/or deep p-well and/or p+ buried) if needed, so as to guarantee that the n-well potential follows the potential of the p-well, when the latter moves toward positive values (in the case illustrated in FIG. 50). The above described bias configuration can be extended to any of the embodiments herein described with simple modifications (if any).

AY FIG. 51

Figure 51:
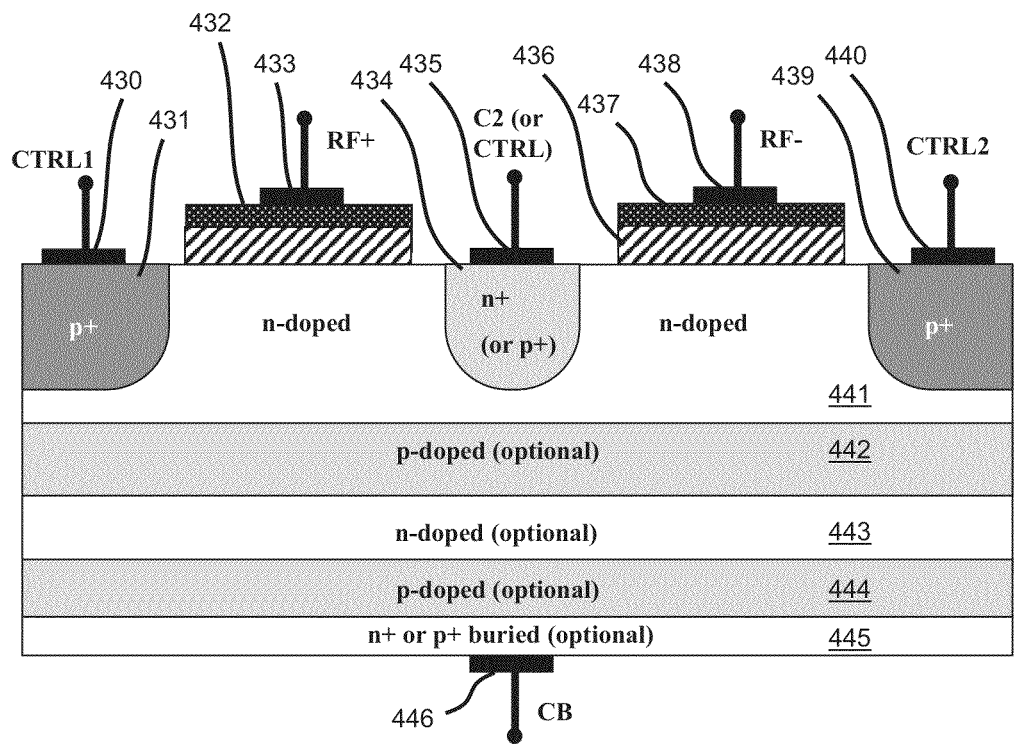
FIG. 51 shows an example of implementation of a 5 terminal differential-series transcap according to the embodiment of FIG. 28, in discrete process technology.

All the embodiments discussed above can be quite easily modified to be used in a discrete process technology. An example of implementation of the present invention in discrete process technologies is shown in FIG. 51, where a contact 446 has been added on the back side of the device. Also this embodiment presents a set of optional regions that can be added or omitted from the structure based on the characteristics of the utilized process and the characteristics of the application. Furthermore, other doped or intrinsic regions and/or layers can be added to the structure (for example one or more intrinsic regions can be added between the p-doped and n-doped regions (or layers) so as to decrease the parasitic capacitances of the device, or an intrinsic epitaxial layer can be added to the structure). Each of these regions and the back-contact 446 can be shorted directly or through a high impedance path (e.g. through a high value resistor) and/or through diodes to the ground, or the supply, or the control voltage, or to a voltage greater than (or substantially equal to) the maximum RF signal value or lower than (or substantially equal) the minimum RF signal value, or any other semiconductor region or terminal of the device depending from the chosen implementation and the type of substrate (n-doped, p-doped or intrinsic and/or epitaxial).

AZ FIG. 52

Figure 52:
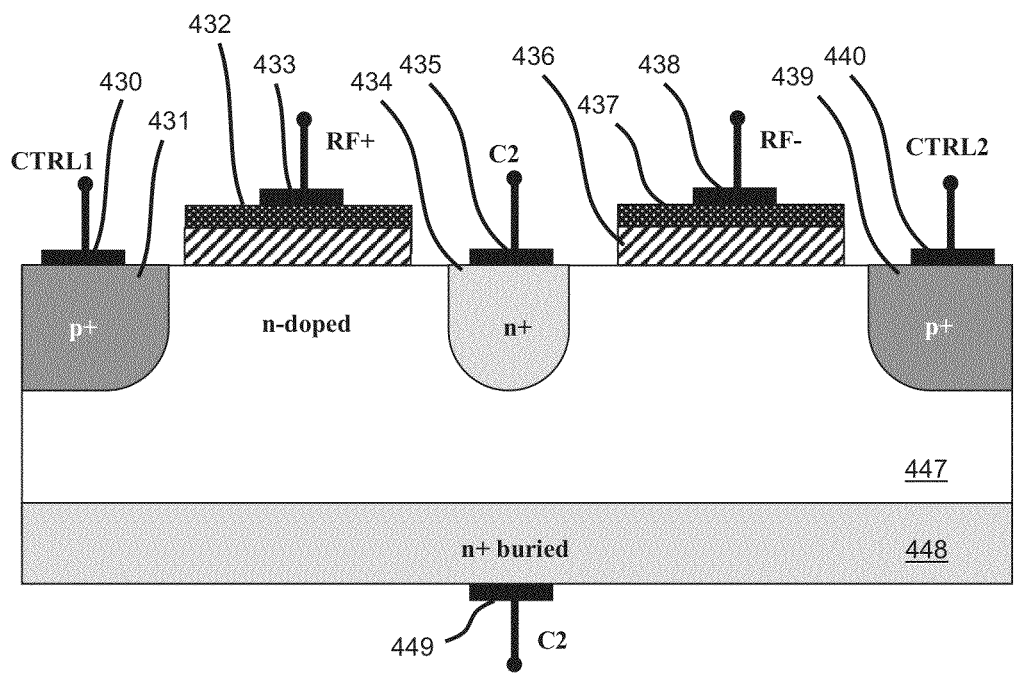
FIG. 52 shows an example of implementation of a 5 terminal differential-series transcap according to the embodiment of FIG. 37.

A particularly simple example of implementation of the embodiment of FIG. 51 is reported in FIG. 52, where many of the optional layers have been removed so as to simplify the structure. The back terminal 449 has been used in this case as extra C2 terminal. If desired, the central n+ region 434 and the corresponding C2 terminal 435 can be also removed from the structure.

BA FIG. 53

Figure 53:
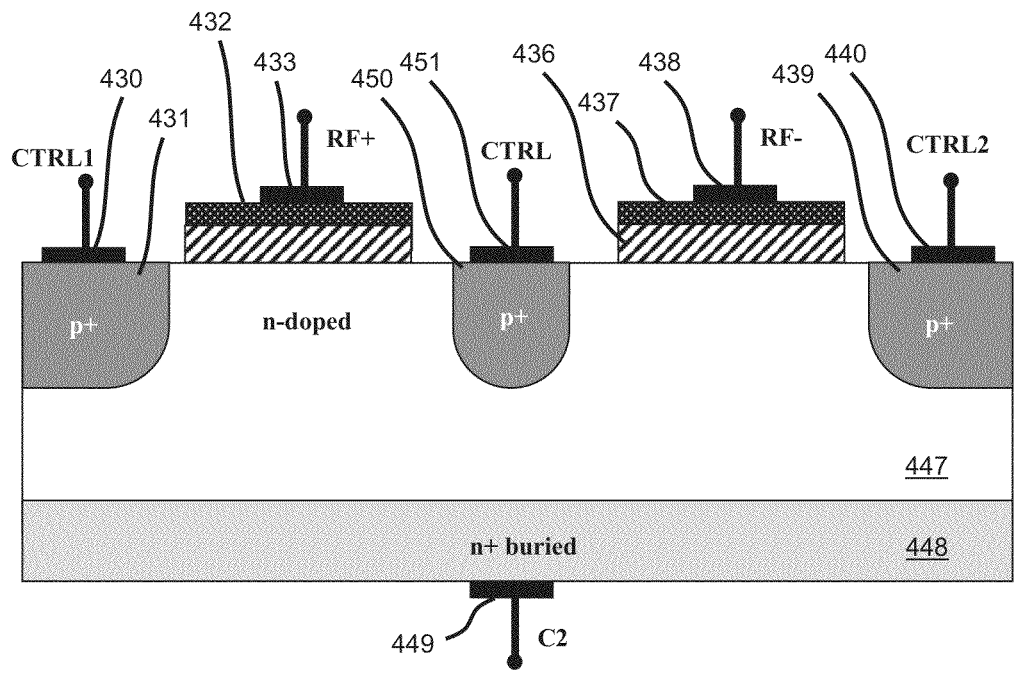
FIG. 53 shows a further example of implementation of a 5 terminal differential-series transcap according to the embodiment of FIG. 37, where the central C2 region has been replaced with an extra control region.

Alternatively, the central n+ region 434 can be replaced with an extra p+ control region 450 as shown in FIG. 53. Another variant can be obtained by replacing the n+ buried layer 448 of FIG. 52 (or FIG. 53) with a p+ buried control region (in this case, in FIG. 53 the C2 n+ implantation can be indeed placed in the dimension perpendicular to the shown cross-section).

BB FIG. 54

Figure 54:
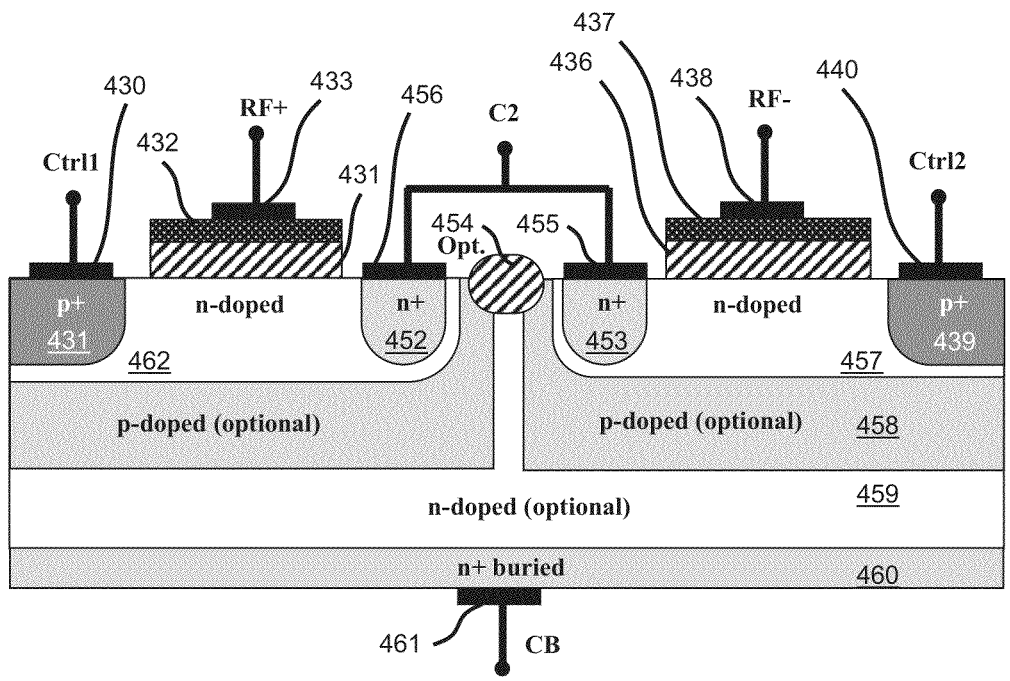
FIG. 54 shows a further example of implementation of a 5 terminal differential-series transcap according to the invention in discrete process, where the two transcap devices have been formed in two separate p-wells.

In FIG. 54 is shown another variant of a discrete implementation of the present invention, where the two transcap devices have been formed in two separated p-wells. The insulating region 454 is optional.

BC FIG. 55

Figure 55:
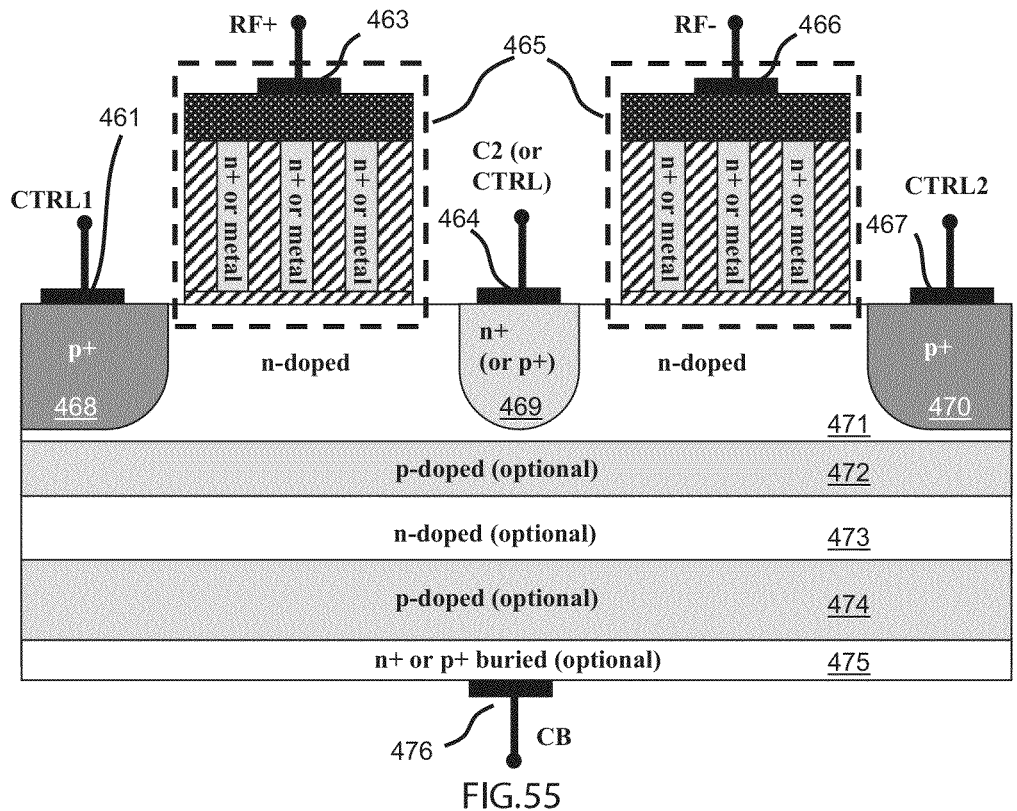
FIG. 55 shows an example of implementation of a 5 terminal differential-series transcap according to the embodiment of FIG. 32, in discrete process technology.

FIG. 55 illustrates an example of implementation of the embodiment of FIG. 32 in discrete process technology. Also in this case many device regions/layers are optional and can be removed if desired.

BD FIG. 56

Figure 56:
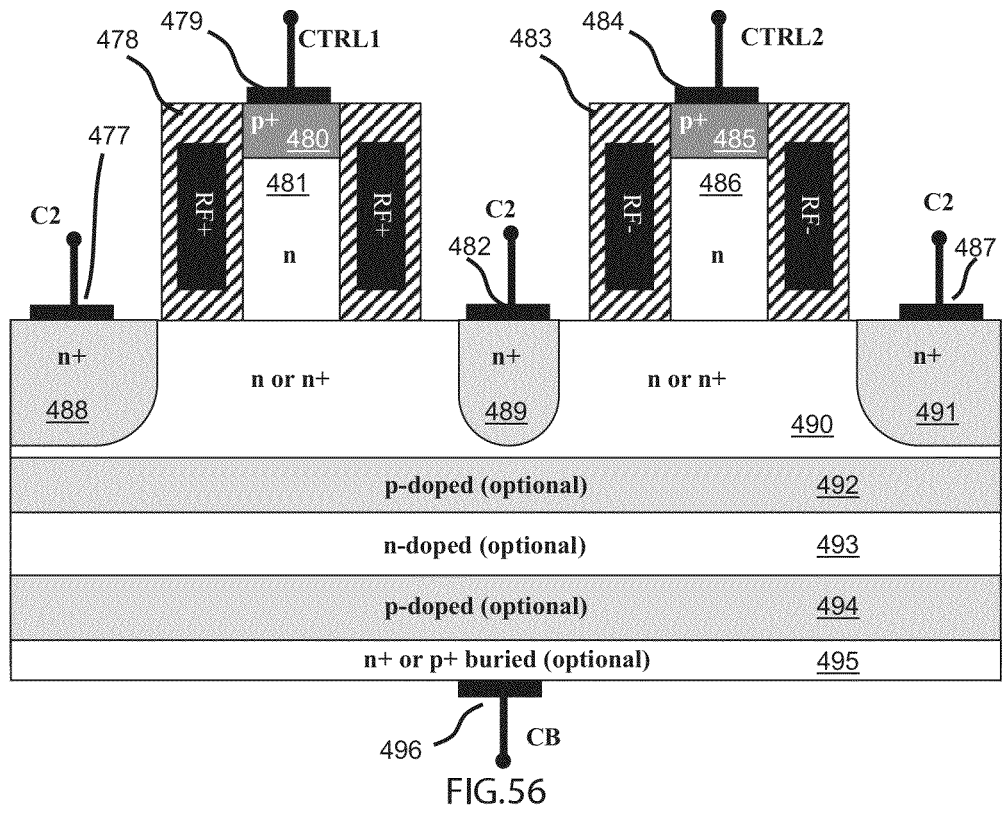
FIG. 56 shows an example of implementation of a 5 terminal differential-series transcap according to the embodiment of FIG. 33, in discrete process technology.

FIG. 56 illustrates an example of implementation of the embodiment of FIG. 33 in discrete process technology. Also in this case many device regions/layers are optional and can be removed if desired.

BE FIG. 57

Figure 57:
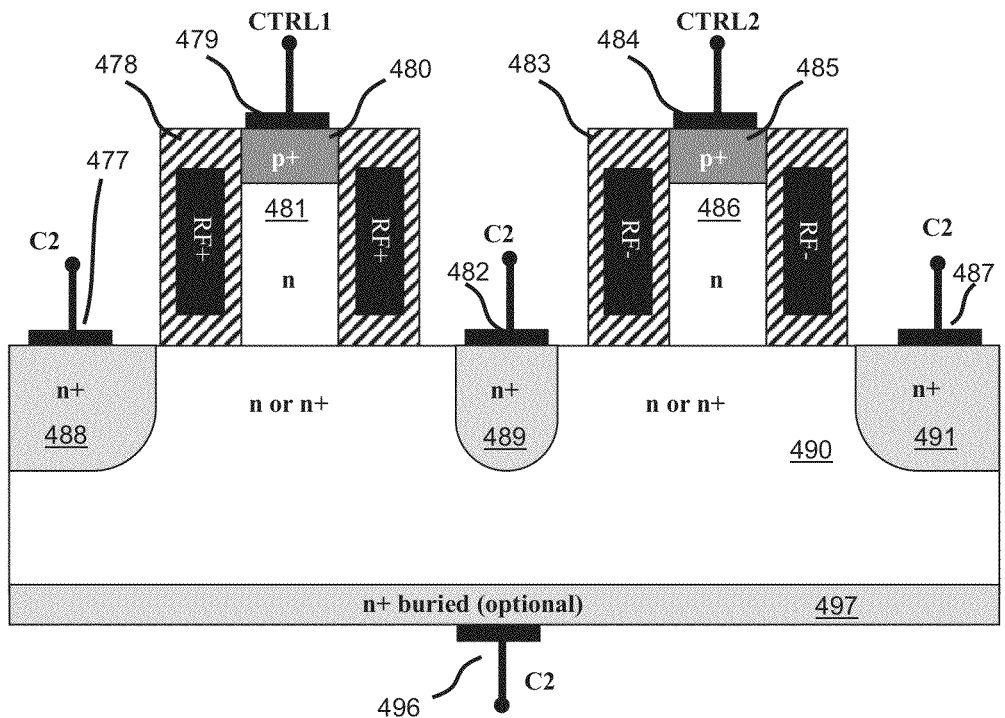
FIG. 57 shows an example of implementation of a 5 terminal differential-series transcap according to the embodiment of FIG. 56.

FIG. 57 illustrates a further example of implementation of the embodiment of FIG. 33 in discrete process technology, where many device regions/layers have been removed so as to simplify the structure.

BF FIG. 58

Figure 58:
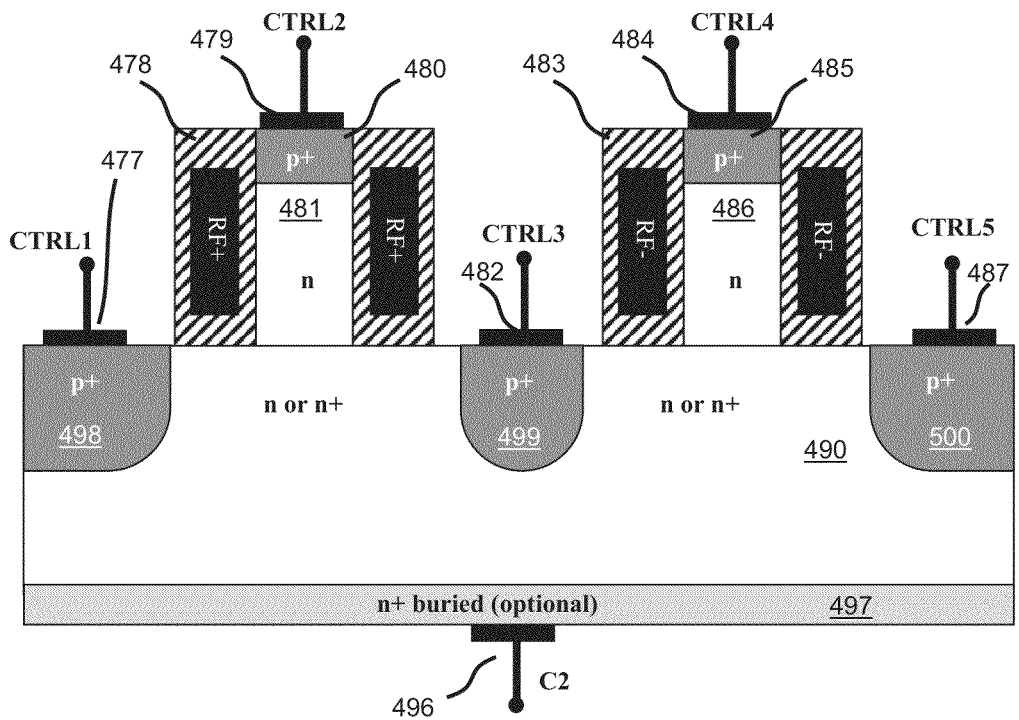
FIG. 58 shows an example of implementation of a 5 terminal differential-series transcap according to the embodiment of FIG. 56, where the superficial C2 implantations have been replaced with control regions.

In the embodiments of FIGS. 56 and 57 one or more of the n+ regions and the corresponding C2 terminals can be omitted or replaced with p+ control regions as shown for example in FIG. 58.

BG FIG. 59

Figure 59:
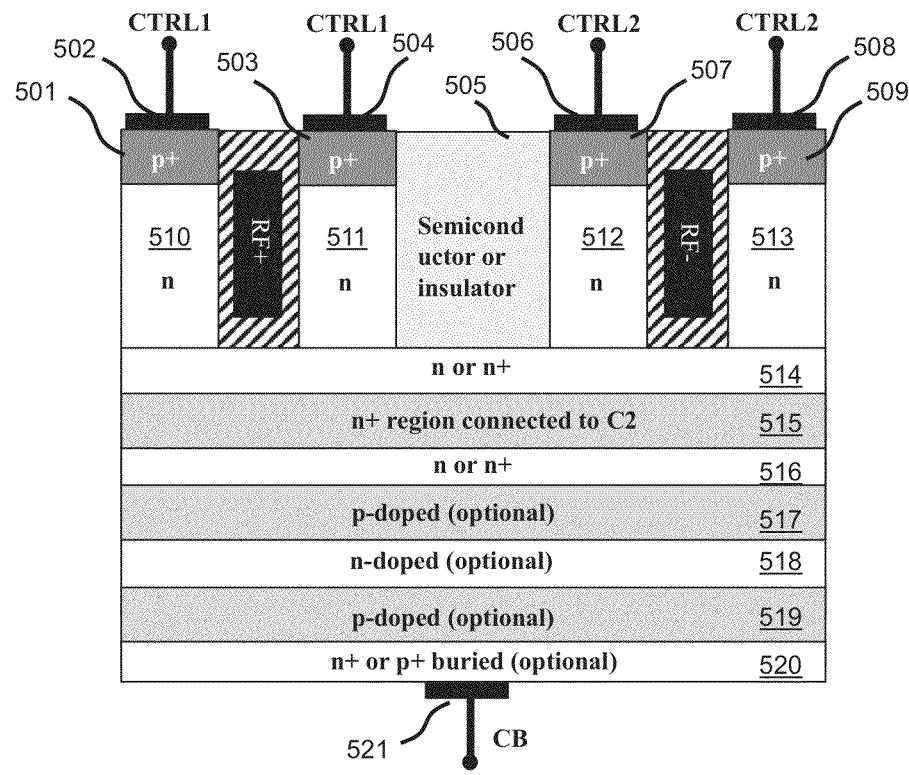
FIG. 59 shows an example of implementation of a 5 terminal differential-series transcap according to the embodiment of FIG. 35, in discrete process technology.
Figure 60:
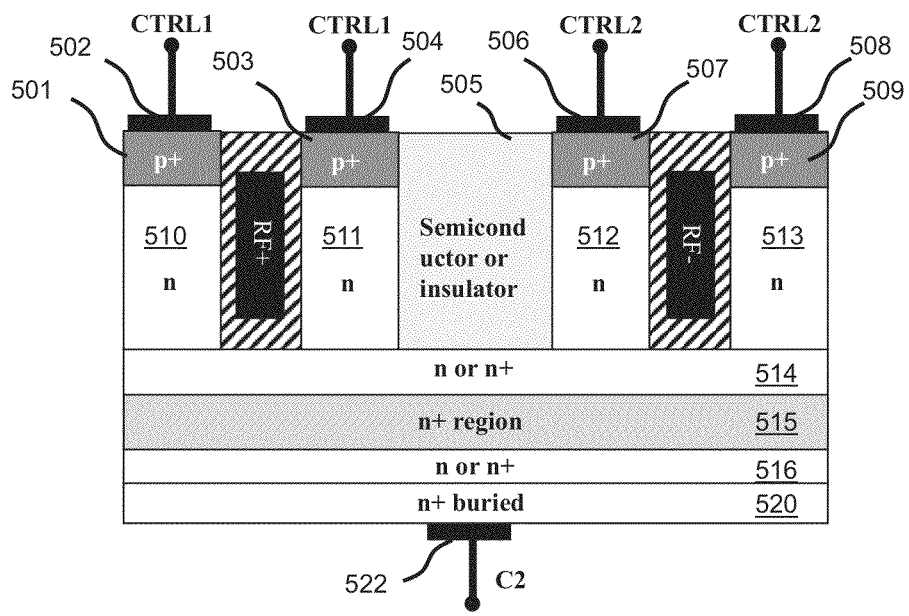
FIG. 60 shows an example of implementation of a 5 terminal differential-series transcap according to the embodiment of FIG. 59.

FIG. 59 illustrates an example of implementation of the embodiment of FIG. 35 in discrete process technology. Also in this case many device regions/layers are optional and can be removed if desired.

BH FIG. 60

FIG. 59 illustrates a further example of implementation of the embodiment of FIG. 35 in discrete process technology, where many device regions/layers have been removed so as to simplify the structure.

BI FIG. 61

Figure 61:
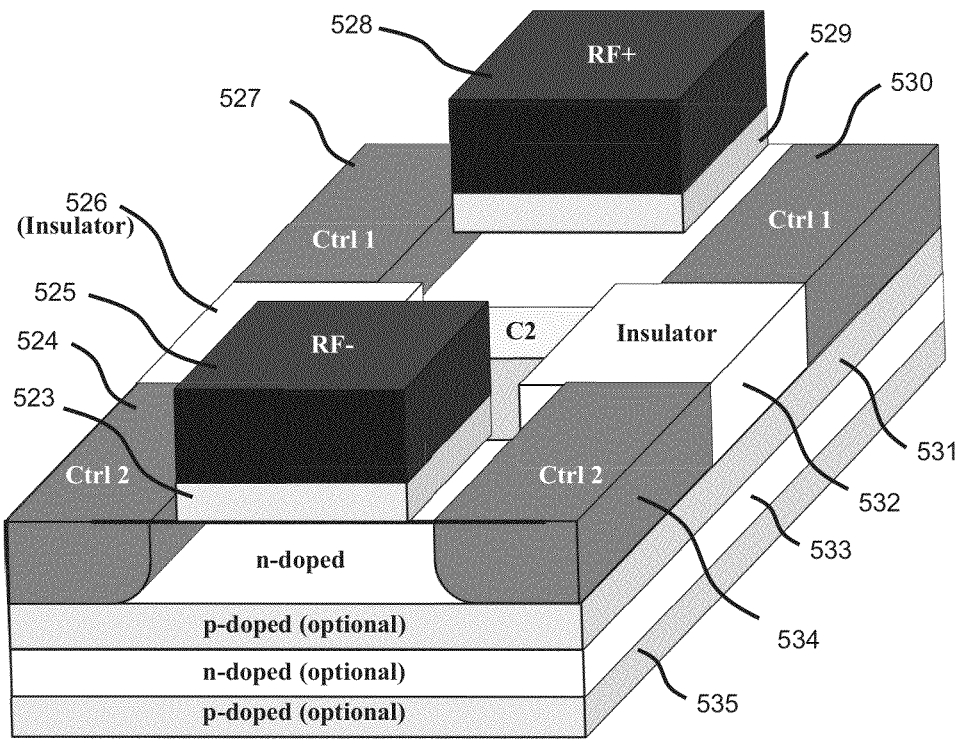
FIG. 61 shows a tridimensional view of a semiconductor variable capacitor with double control regions according to a further embodiment of the invention.

In FIG. 61 is reported a three-dimensional view of a further example of implementation of a transcap device in differential-series configuration. As it can be seen, the p+ control regions and the n+ regions of the device can be placed in many possible ways so as to increase the device performances. If desired a buried layer and/or a back contact can be added to this embodiment in order to obtain an implementation in discrete process technology.

BL FIG. 62

Figure 62:
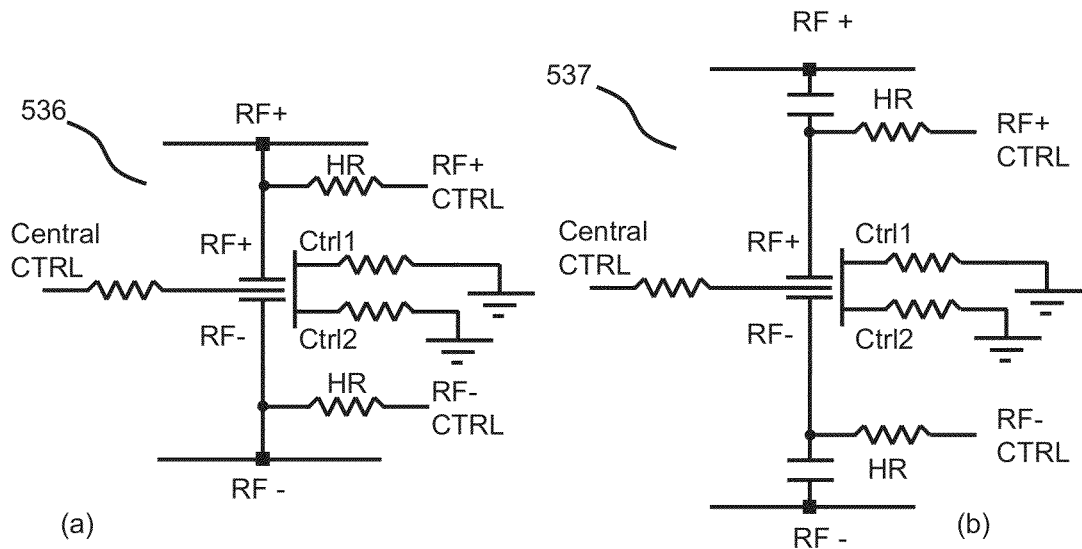
FIG. 62 shows a differential control configuration for the transcap device and the circuital symbol used to identify this particular configuration.

FIG. 62 shows two possible control configurations that can be used to bias the different terminals of a 5 terminals DS transcap device. As it can be seen, in both configurations, the Ctrl1 and Ctrl2 terminals have been coupled to ground through high impedances, and the central control terminal C2 has been used to modulate the device capacitance between RF+ and RF− terminals. Optionally, also the RF terminals can be connected through high impedance paths to ground or to a control voltage or to a voltage source so as to optimize the device performance. For each device terminal, a FET transistor can also be connected in parallel to the high impedance HR in order to speed up the tuning speed of the transcap device (i.e., for example, the FET device is always off except during the transitions of the control voltage). As discussed above, many others configurations can be used to bias the terminals of the device.

In principle, the Ctrl1 and Ctrl2 terminals can also be shorted together before the high impedance, however this approach can significantly degrade the device tuning range, especially in the case where the capacitance between Ctrl1 and C2 (and/or between Ctrl2 and C2) is comparable to the one between C2 and RF+ (and/or between C2 and RF−) as in the case of an SOI process with a thin silicon active layer (in this case, the shortening of the two controls terminals Ctrl1 and Ctrl2 can decrease the tuning range by a factor greater than 2).

BM FIG. 63

Figure 63:
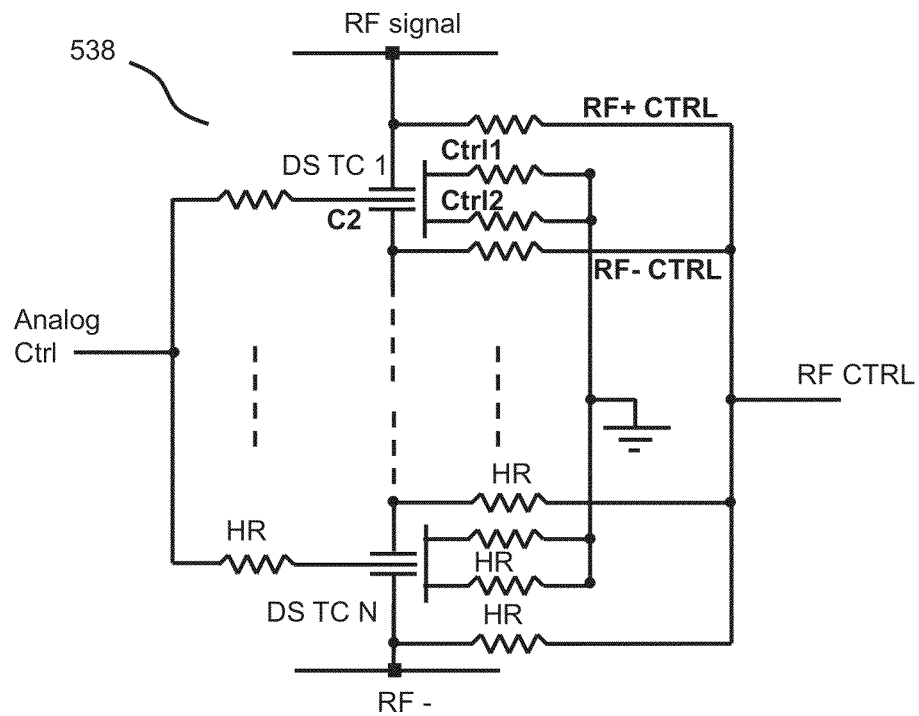
FIG. 63 shows an example of how to connect in series multiple differential-series transcap devices.

As shown in FIG. 63, by using the control configurations of FIG. 62, more structures can be placed in series (by short-circuiting the resistors coupled to the C2 terminals) in order to withstand higher RF voltages. If desired, the RF+ CTRL and RF− CTRL terminals (if present) can be all shorted together after the high impedance paths and connected to ground or to a control voltage or to a fixed voltage source. If required, equalizing resistors can also be used between the different transcap structures in order to equalize the RF voltage drop on the different structures.

BN FIG. 64

Figure 64:
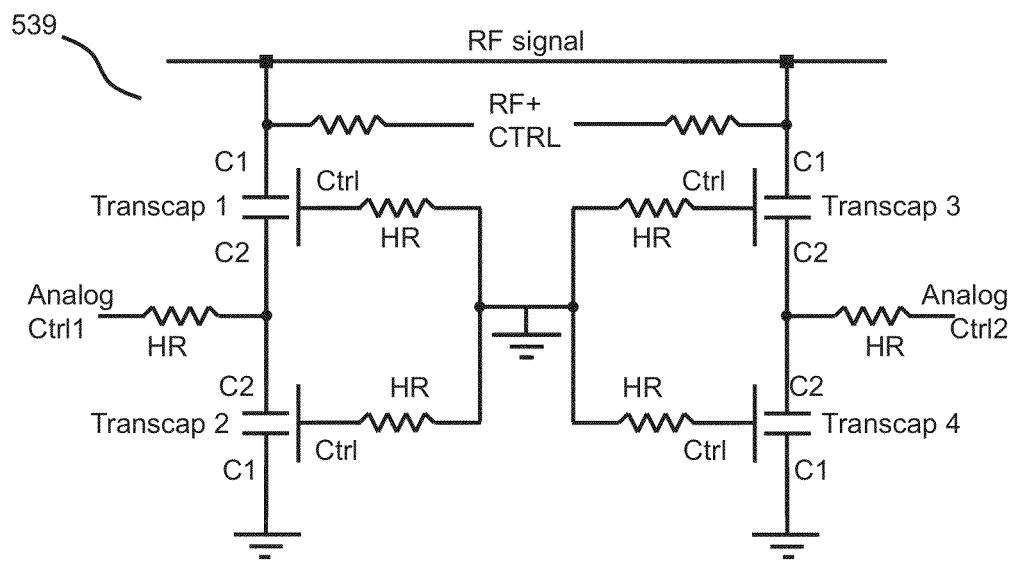
FIG. 64 shows an example of how to connect in parallel multiple differential-series transcap devices.

As shown in FIG. 64, multiple differential-series devices can also be places in parallel (or anti-parallel). In this case, the dimensions of the 4 transcaps can be optimized in order to optimize the linearity of the system, for example by sizing the $1^{st}$ transcap in order to match the dimensions of the $4^{th}$ one, and by sizing the $2^{nd}$ to match the $3^{rd}$ one so as to obtain an anti-parallel configuration. If desired, the two analog controls can be coupled together in order to simplify the driving circuitry.

BO FIG. 65

Figure 65:
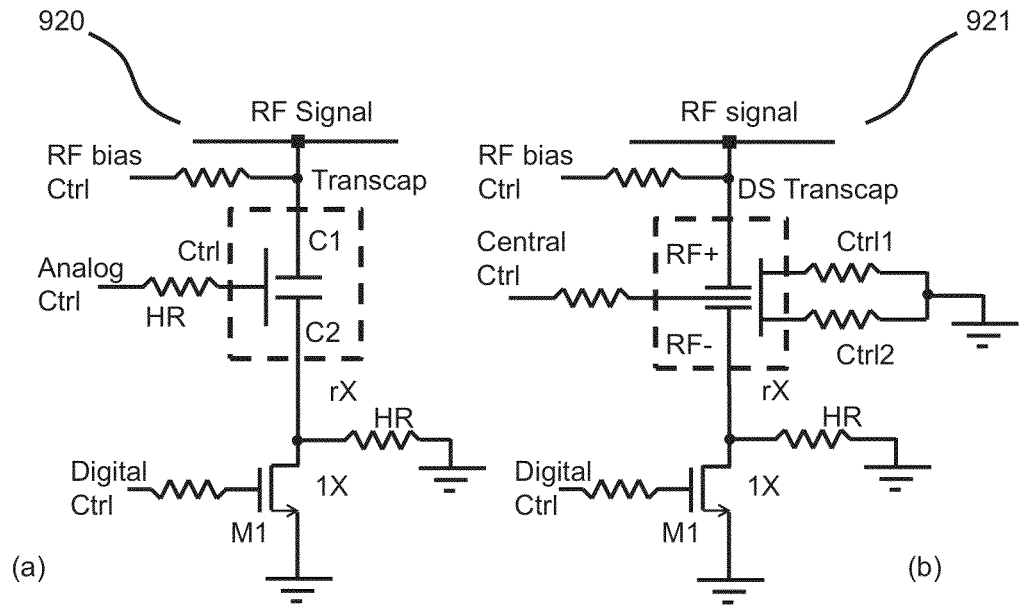
FIG. 65 shows two possible hybrid control configurations for a transcap device and a differential-series transcap device.

FIG. 65 illustrates another interesting control configuration, where a hybrid approach between analog and digital/discrete solution is presented as a switch is placed in series to the described variable capacitor. In this configuration, the size of the transistor M1 must be opportunely chosen in order to maximize the tuning range, maintaining, at the same time, the possibility of choosing, in a continuous fashion, all the possible capacitance values in the selected tuning range.

The modus operandi of this configuration is quite simple. Referring to FIG. 65 (a), the minimum capacitance value (seen from the RF signal) is obtained when the transistor M1 is turned off, and the analog control terminal of the transcap device is biased at high negative voltages so as to minimize the capacitance value between C1 and C2. The maximum capacitance value, instead, is obtained when M1 is turned-on and the analog control voltage is set to zero. The intermediate capacitance values can be obtained by turning-on or off M1, and by varying the analog control voltage fed to the analog control terminal. Similar considerations hold true also for the configuration of FIG. 65 (b), where a DS transcap has been placed in series to a MOS device.

The transistor M1 can also be replaced with a multiplicity of transistors (connected in series or in parallel to each other). In this case, by properly choosing the ratio between the different components of the network, it is possible to increase the tuning range of the network.

BP FIG. 66

Figure 66:
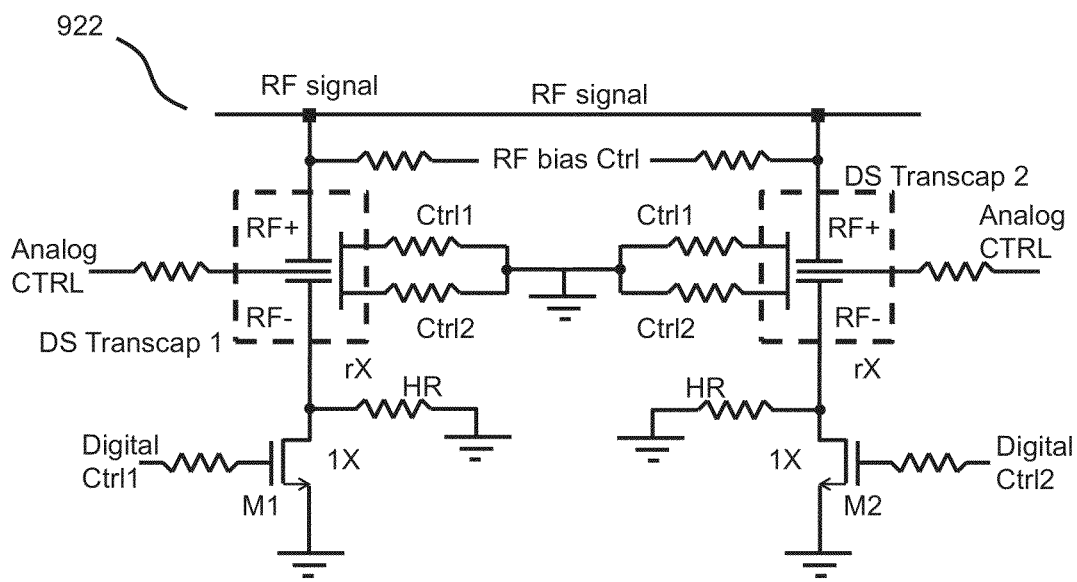
FIG. 66 shows the parallel of two hybrid controlled DS transcap devices.

FIG. 66 illustrates another interesting configuration, where two of the previous networks have been connected in parallel. In this configuration, the devices belonging to the second branch of the parallel (DS transcap 2 and M2) must be opportunely sized in order to increase as much as possible the capacitance tuning range, maintaining at the same time the possibility of choosing in analog fashion all the possible capacitance values in the selected tuning range.

The operation of this configuration is similar to the one of the network shown in FIG. 65. The minimum capacitance value (seen from the RF signal) is obtained when both transistors M1 and M2 are turned off, and the analog control terminals of the two DS transcap devices (which are short-circuited through two high impedances in order to simplify the overall control circuitry) are biased at high positive voltages so as to minimize the capacitance values of DS Transcap 1 and DS Transcap 2. The maximum capacitance value, instead, is obtained when both transistor M1 and M2 are turned-on and the analog control voltage is set to zero. The intermediate capacitance values can be obtained tuning-on only M1, only M2, both or none of them, and varying the analog control voltage.

If the dimensions of the two transistors M1 and M2 and the size of DS Transcap 1 and DS Transcap 2 are opportunely chosen, for example such as M2 and DS Transcap 2 are both r times bigger than M1 and DS Transcap 1, respectively, all the intermediate capacitance values can be chosen in an analog fashion way.

It is important to notice that, if desired, the two analog controls of the two transcap devices can be separated and driven independently. Furthermore, more capacitive branches can be coupled in parallel using a similar configuration.

In all the configurations described above, the capacitance between the control terminal of each transcap device and the C2 terminal can be increased in order to improve the linearity of the overall network. Alternatively, external or integrated capacitors can also be added in order to increase the C2-CTRL capacitances. In particular with the differential series approach, external or integrated capacitors can be added between the two control terminals or between each control terminal and the central node of the series, in order to improve the linearity of the system.

All the described embodiments can be built in many different technologies, comprising: Bulk CMOS, BCD, BiCMOS, Bipolar, Silicon On Insulator, Silicon On Sapphire, thin-film, trench MOS, JFET, SiC, Ge, SiGe (any other IV-IV compound semiconductor material), III-V technology (e.g. GaN, AlGaN, AlN, InN, InGaN, GaAs, AlGaAs, AlAs, and any other polar and non-polar III-V compound semiconductor material including ternary and quaternary alloys) with or without hetero-junctions, II-VI technology (polar and non-polar II-VI compound semiconductor material including ternary and quaternary alloys) with or without hetero-junctions, or discrete device technologies (e.g. the ones used for discrete silicon or SiC MOS discrete power devices or for III-V discrete devices). Different doping profiles can be utilized in order to improve the device performance. If desired, high-k dielectric materials can be utilized to form the capacitance dielectric so as to increase as much as possible the capacitance density.

The formation of the control or C2 region in the third dimension is a concept that can be utilized for any of the previously described structures in order to increase the control on the device characteristic without degrading the quality factor. Furthermore, also extra control regions and/or C2 regions can be formed in the third direction or under the structure (the latter case is a very appealing configuration in the case where the device is realized in a process for discrete devices.) Furthermore, super junction configurations can be used to increase the control breakdown voltage.

In all the described embodiments, the p+ region can be replaced with a Schottky contact and/or the n+ region can be replaced with a metal ohmic contact. In the case where a Schottky contact is used in combination with a III-V process technology, an extra wide energy-gap layer can be interposed between the metal and the n-doped semiconductor in order to reduce the current leakage associated with the Schottky contact.

All the embodiments illustrated above can be realized as integrated or discrete components with minimal changes. For each one of them, the dual version can be obtained by simply substituting the n-doped regions with p-type ones and viceversa. If desired, in the dual version the n+ control regions can be replaced with Schottky contacts and/or the p+ C2 regions can be replaced with metal ohmic contacts. Many other configurations can be obtained by combining the different embodiments and their variants.

Most of the structures described above can be realized with a standard SOI or bulk CMOS process. The distance between the doping implants and the capacitance electrode C1 can be omitted by auto-aligning the implantations with the MOS structure or can be obtained by adding two spacers to the structure during the fabrication process or by misaligning the n+ (or p+) implantation mask with respect to the MOS oxide edge. The latter being the preferred method since it allows the achievement of any desired distance between the highly doped regions and the oxide edge. In some of the embodiments, one or more extra process steps can also be required in order to form the pillars/trenches in the semiconductor substrate (by means of a semiconductor etching or a deposition process steps) and/or to obtain the buried doped regions at the beginning of the manufacturing process.

All the embodiments herein described can be realized in III-V technology with minimal modifications. If the utilized manufacturing process does not allow for low defect dielectric/semiconductor interfaces, as it can be the case in some III-V technologies, the performance of the transcap device could be affected. In order to overcome this limitation, the insulating layer of the variable capacitor can be replaced with a (doped or intrinsic) wide energy-gap semiconductor layer. In this case, the C1 terminal can be formed directly in contact with the wide energy-gap semiconductor layer (so as to form a Schottky or ohmic contact with it).

Although the present invention has been described above with particularity, this was merely to teach one of ordinary skill in the art how to make and use the invention. Many additional modifications will fall within the scope of the invention. Thus, the scope of the invention is defined by the claims which immediately follow.

What is claimed is:

1. A semiconductor variable capacitor comprising:
a first equivalent capacitance plate;
a second equivalent capacitance plate;
at least one control region;
wherein a capacitance value between said first and said second equivalent capacitance plate of said semiconductor variable capacitor is varied by varying a control voltage;
wherein said control region forms a rectifying junction with said first capacitance plate, and
wherein a variation of said control voltage causes a variation of depletion region of said rectifying junction.

2. The semiconductor variable capacitor of claim 1, wherein said semiconductor variable capacitor is implemented using a semiconductor process technology belonging to the group comprising CMOS, BiCMOS, BCD, JFET, Bipolar, Silicon-on-Sapphire, Silicon-on-Insulator, thin-film, trench MOS, discrete component, III-V compound semiconductor with and without hetero-structures, and II-VI compound semiconductor with and without hetero-structures process technologies.

3. The semiconductor variable capacitor of claim 1, further comprising:
a barrier layer formed at least partially between said first and said second equivalent capacitance plates,
a heavily doped semiconductor region directly coupled to said first equivalent capacitance plate;
a first and a second spacer region formed in physical contact with said barrier layer;
wherein said barrier layer is made of one of the materials belonging to the group comprising dielectric and semiconductor materials, and
wherein said heavily doped semiconductor region is physically separated from said barrier layer and said spacers regions.

4. The semiconductor variable capacitor of claim 1, further comprising:
a highly conductive region directly coupled to a semiconductor region;
a barrier layer covering at least a portion of a surface of said semiconductor region;
a conductive region covering at least a portion of a surface of said barrier layer;
wherein said barrier layer is made of one of the materials belonging to the group comprising dielectric and semiconductor materials, and
wherein said semiconductor region and said conductive region form, respectively, said first and second capacitance plates of said semiconductor variable capacitor;
wherein at least one between said highly conductive region and said control region is spaced apart from said barrier layer.

5. The semiconductor variable capacitor of claim 1, further comprising:
a barrier layer formed at least partially between said first and said second equivalent capacitance plates,
a highly conductive region directly coupled to said first equivalent capacitance plate;
wherein said barrier layer is made of one of the materials belonging to the group comprising dielectric and semiconductor materials, and
wherein said highly conductive semiconductor region is spaced apart from said barrier layer;
wherein a dielectric region extending below a main surface of said first equivalent capacitance plate is formed between said highly conductive region and said barrier layer.

6. The semiconductor variable capacitor of claim 1, wherein said control region is a metallic region and said rectifying junction is a schottky junction.

7. The semiconductor variable capacitor of claim 1,
wherein said control region comprises a highly conductive region and a low conductive semiconductor region;
wherein said low conductive semiconductor region is placed between said highly conductive region and said first equivalent capacitance plate, and
wherein said low conductive semiconductor region has a doping concentration lower than $9 \times 10^{17}$ cm$^{-3}$.

8. The semiconductor variable capacitor of claim 1,
wherein said first equivalent capacitance plate is a semiconductor region;

wherein said second capacitance plate has a work-function substantially equal or lower than the sum of the electron affinity and half energy-gap of a semiconductor material forming said first equivalent capacitance plate when said semiconductor region is doped with n-type impurities, and wherein said second capacitance plate has a work-function substantially equal or greater than the sum of the electron affinity and half energy-gap of a semiconductor material forming said first equivalent capacitance plate when said semiconductor region is doped with p-type impurities.

9. The semiconductor variable capacitor of claim 1, further comprising a semiconductor pillar, wherein at least a portion of said first equivalent capacitance plate is formed in said semiconductor pillar.

10. The semiconductor variable capacitor of claim 1, further comprising a barrier layer formed at least partially between said first and said second equivalent capacitance plates, wherein said barrier layer is made of one of the materials belonging to the group comprising dielectric and semiconductor materials, and wherein at least a portion of said barrier layer is formed in a semiconductor trench.

11. The semiconductor variable capacitor of claim 1, wherein a layout of said semiconductor variable capacitor is oriented so as to maximize a carrier mobility in at least a portion of said first equivalent capacitance plate along a direction perpendicular with respect to a substrate of said semiconductor variable capacitor.

12. The semiconductor variable capacitor of claim 1 further comprising a first region of a first conductivity type and a second region of a second conductivity type;

wherein said first region is coupled by means of a semiconductor diode to a first bias voltage, and wherein said second region is coupled by means of a high impedance component to a second bias voltage.

13. The semiconductor variable capacitor of claim 1 implemented in discrete process technology, wherein said semiconductor variable capacitor is formed in a semiconductor die and wherein at least one between said first equivalent capacitance plate, said second equivalent capacitance plate and said control region is coupled to a contact placed on a lower side of said semiconductor die.

14. The semiconductor variable capacitor of claim 1 implemented in silicon-on-insulator process technology, wherein said control region is formed in physical contact with a buried insulating layer.

15. The semiconductor variable capacitor of claim 1, further comprising:

a barrier layer formed at least partially between said first and said second equivalent capacitance plate, wherein said barrier layer is made of one of the materials belonging to the group comprising dielectric and semiconductor materials, and wherein said first equivalent capacitance plate comprises a semiconductor region formed of a semiconductor material belonging to the group comprising polar and non-polar III-V compound semiconductor materials, polar and non-polar II-VI compound semiconductor materials, and IV-IV compound semiconductor materials.

16. A semiconductor variable capacitor comprising at least a first semiconductor variable capacitor according to claim 1 and a second semiconductor variable capacitor according to claim 1, wherein said first capacitance plate of said first semiconductor variable capacitor is coupled to said first capacitance plate of said second semiconductor variable capacitor.

17. A semiconductor variable capacitor comprising a first semiconductor variable capacitor according to claim 1 and a second semiconductor variable capacitor according to claim 1, wherein said first capacitance plate of said first semiconductor variable capacitor is coupled to said first capacitance plate of said second semiconductor variable capacitor;

wherein said control region of said first semiconductor variable capacitor is coupled by means of a first high impedance component to a bias voltage, and wherein said control region of said second semiconductor variable capacitor is coupled by means of a second high impedance component to said bias voltage.

18. A differential semiconductor variable capacitor comprising:

at least a first, a second and a third control region formed in a semiconductor region;

at least a first and a second conductive region forming, respectively, a first equivalent capacitance plate and a second equivalent capacitance plate of said differential semiconductor variable capacitor;

wherein said first, said second and said third control regions are directly coupled, respectively, to a first, a second and a third control terminals of said differential semiconductor variable capacitor;

wherein said first and said second conductive regions are directly coupled, respectively, to a fourth and a fifth terminal of said differential semiconductor variable capacitor;

wherein said first control region is directly coupled to said semiconductor region;

wherein each one of said second and said third control regions forms a rectifying junction with said semiconductor region, and wherein the capacitance value between said fourth and fifth terminals of said differential semiconductor variable capacitor is varied by varying a control voltage applied between said first control terminal and at least two of the other terminals of said differential semiconductor variable capacitor.

19. The differential semiconductor variable capacitor of claim 18, wherein each one of said first, second and third control regions is coupled by means of a separate high impedance component to a bias voltage, and wherein an alternating signal is applied between said first and said second capacitance plates.

20. The differential semiconductor variable capacitor of claim 18, further comprising at least a first barrier region between said first capacitance plate and said semiconductor region and at least a second barrier region between said second capacitance plate and said semiconductor region, wherein said first and said second barrier regions are made of one of the materials belonging to the group comprising dielectric and wide band-gap semiconductor materials, and wherein at least one between said first, said second and said third control region is spaced apart from both said first barrier region and said second barrier region.

21. The differential semiconductor variable capacitor of claim 18, wherein at least one of said first and a second conductive regions has a work-function substantially equal or lower than the sum of the electron affinity and half energy-gap of a semiconductor material forming said semiconductor region when said semiconductor region is doped with n-type impurities, and wherein at least one of said first and a second conductive regions has a work-function substantially equal or greater than the sum of the electron affinity and half energy-gap of a semiconductor material forming said semiconductor region when said semiconductor region is doped with p-type impurities.

22. The differential semiconductor variable capacitor of claim 18, wherein at least one of said first and second control regions comprises a highly conductive region and a low conductive semiconductor region;

wherein said low conductive semiconductor region is placed between said highly conductive region and said semiconductor region, and wherein said low conductive semiconductor has a doping concentration lower than $9 \times 10^{17}$ cm$^{-3}$.

23. The differential semiconductor variable capacitor of claim 18, further comprising at least a first barrier region between said first capacitance plate and said semiconductor region and at least a second barrier region between said second capacitance plate and said semiconductor region, wherein said first and said second barrier regions are made of one of the materials belonging to the group comprising dielectric and semiconductor materials, and wherein at least a portion of at least one of said first and second barrier regions is formed in a semiconductor trench.

24. The differential semiconductor variable capacitor of claim 18, further comprising a first region of a first conductivity type and a second region of a second conductivity type;

wherein said first region is coupled by means of a semiconductor diode to a first bias voltage, and wherein said second region is coupled by means of a high impedance component to a second bias voltage.

25. The differential semiconductor variable capacitor of claim 18 implemented in discrete process technology, wherein said differential semiconductor variable capacitor is formed in a semiconductor die and wherein at least one between said first equivalent capacitance plate, said second equivalent capacitance plate and said first, second and third control region is coupled to a contact placed on a lower side of said die.

26. The differential semiconductor variable capacitor of claim 18 implemented in silicon-on-insulator process technology, wherein at least one of said first, second, and third control regions is formed in physical contact with a buried insulating layer.

27. The differential semiconductor variable capacitor of claim 18, further comprising at least a first barrier region between said first capacitance plate and said semiconductor region and at least a second barrier region between said second capacitance plate and said semiconductor region, wherein said first and said second barrier regions are made of one of the materials belonging to the group comprising dielectric and semiconductor materials, and wherein said first equivalent capacitance plate comprises a semiconductor region formed of a semiconductor material belonging to the group comprising polar and non-polar III-V compound semiconductor materials, polar and non-polar II-VI compound semiconductor materials, and IV-IV compound semiconductor materials.

28. A resonant system comprising an analog continuously variable capacitor wherein said variable capacitor comprises a first capacitor terminal, a second capacitor terminal and a control terminal;

wherein the capacitance value of said variable capacitor between said first capacitor terminal and said second capacitor terminal is varied by varying a voltage applied between said control terminal and at least one of said first and second capacitor terminals, and wherein said variable capacitor is used to tune at least an electrical parameter of a network of said resonant system in a continuous manner.

29. The resonant system of claim 28 wherein said resonant system is a wireless power transfer system, further comprising a wireless power receiver and a wireless power transmitter, wherein said variable capacitor is used to tune at least said electrical parameter in at least one between said wireless power receiver and said wireless power transmitter of said wireless power transfer system.

30. The resonant system of claim 28 wherein said resonant system is an antenna tuning system, wherein said variable capacitor is used to tune the impedance of said network of said resonant system.

31. The resonant system of claim 28 further comprising an adaptive circuit, wherein said electrical parameter of said network is tuned by means of said adaptive circuit.

* * * * *